(12) United States Patent
Hussell et al.

(10) Patent No.: US 9,395,074 B2
(45) Date of Patent: Jul. 19, 2016

(54) LED LAMP WITH LED ASSEMBLY ON A HEAT SINK TOWER

(71) Applicant: Cree, Inc., Durham, NC (US)

(72) Inventors: Christopher P. Hussell, Cary, NC (US); John Adam Edmond, Durham, NC (US); Gerald H. Negley, Chapel Hill, NC (US); Curt Progl, Raleigh, NC (US); Mark Edmond, Raleigh, NC (US); Praneet Athalye, Morrisville, NC (US); Charles M. Swoboda, Cary, NC (US); Antony Paul van de Ven, Hong Kong (CN); Paul Kenneth Pickard, Morrisville, NC (US); Bart P. Reier, Cary, NC (US); James Michael Lay, Apex, NC (US); Peter E. Lopez, Cary, NC (US); Ed Adams, Englewood, TN (US)

(73) Assignee: Cree, Inc., Durham, NC (US)

( * ) Notice: Subject to any disclaimer, the term of this patent is extended or adjusted under 35 U.S.C. 154(b) by 300 days.

(21) Appl. No.: 13/939,827

(22) Filed: Jul. 11, 2013

(65) Prior Publication Data

US 2013/0294092 A1     Nov. 7, 2013

Related U.S. Application Data

(63) Continuation-in-part of application No. 13/875,670, filed on May 2, 2013, which is a continuation-in-part of application No. 13/774,078, filed on Feb. 22, 2013, which is a continuation-in-part of application No.

(Continued)

(51) Int. Cl.
*F21V 29/00* (2015.01)
*F21K 99/00* (2016.01)
(Continued)

(52) U.S. Cl.
CPC ............... *F21V 29/22* (2013.01); *F21K 9/135* (2013.01); *F21V 19/003* (2013.01); *F21V 23/06* (2013.01);
(Continued)

(58) Field of Classification Search
CPC ........ F21V 29/22; F21V 23/06; F21V 29/004; H05K 1/0284; F21K 9/135
See application file for complete search history.

(56) References Cited

U.S. PATENT DOCUMENTS

| 3,581,162 A | 5/1971 | Wheatley |
|---|---|---|
| 5,463,280 A | 10/1995 | Johnson |

(Continued)

FOREIGN PATENT DOCUMENTS

| DE | 29923899 U1 | 4/1999 |
|---|---|---|
| DE | 102007034123 A1 | 1/2009 |

(Continued)

OTHER PUBLICATIONS

Cree, Inc., International Application No. PCT/US2013/035400, International Search Report and Written Opinion, Sep. 17, 2013.

(Continued)

*Primary Examiner* — Joseph L Williams
(74) *Attorney, Agent, or Firm* — Dennis J. Williamson; Moore & Van Allen PLLC

(57) ABSTRACT

A lamp has an optically transmissive enclosure and a base defining a longitudinal axis of the lamp extending from the base to the free end of the enclosure. A heat sink is at least partially located in the enclosure and includes a tower that extends along the longitudinal axis of the lamp. An LED assembly is positioned in the optically transmissive enclosure. The LED assembly comprises a lead frame circuit or a flex circuit where LEDs are attached to the circuits. The lead frame and flex circuit are formed into a three-dimensional shape and are thermally coupled to the tower.

18 Claims, 48 Drawing Sheets

Related U.S. Application Data

13/467,670, filed on May 9, 2012, which is a continuation-in-part of application No. 13/446,759, filed on Apr. 13, 2012.

(60) Provisional application No. 61/738,668, filed on Dec. 18, 2012, provisional application No. 61/712,585, filed on Oct. 11, 2012, provisional application No. 61/716,818, filed on Oct. 22, 2012, provisional application No. 61/670,686, filed on Jul. 12, 2012.

(51) Int. Cl.

| | | |
|---|---|---|
| *F21V 23/06* | (2006.01) | |
| *H05K 1/02* | (2006.01) | |
| *F21V 19/00* | (2006.01) | |
| *F21Y 101/02* | (2006.01) | |
| *F21Y 111/00* | (2016.01) | |
| *H05K 1/05* | (2006.01) | |
| *H05K 1/18* | (2006.01) | |
| *F21V 29/77* | (2015.01) | |

(52) U.S. Cl.
CPC ............ *F21V 29/004* (2013.01); *H05K 1/0284* (2013.01); *F21V 29/773* (2015.01); *F21Y 2101/02* (2013.01); *F21Y 2111/005* (2013.01); *F21Y 2111/007* (2013.01); *H05K 1/05* (2013.01); *H05K 1/181* (2013.01); *H05K 2201/10106* (2013.01)

(56) References Cited

U.S. PATENT DOCUMENTS

| | | | |
|---|---|---|---|
| 5,561,346 A | 10/1996 | Byrne | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,947,588 A | 9/1999 | Huang | |
| 5,949,347 A | 9/1999 | Wu | |
| 5,952,916 A | 9/1999 | Yamabe | |
| 6,161,910 A | 12/2000 | Reisenauer et al. | |
| 6,220,722 B1 | 4/2001 | Begemann | |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,276,822 B1 | 8/2001 | Bedrosian et al. | |
| 6,414,801 B1 | 7/2002 | Roller | |
| 6,452,217 B1 | 9/2002 | Wojnarowski et al. | |
| 6,465,961 B1 | 10/2002 | Cao | |
| 6,523,978 B1 | 2/2003 | Huang | |
| 6,550,953 B1 | 4/2003 | Ichikawa et al. | |
| 6,634,770 B2 | 10/2003 | Cao | |
| 6,635,987 B1 | 10/2003 | Wojnarowski et al. | |
| 6,659,632 B2 | 12/2003 | Chen | |
| 6,709,132 B2 | 3/2004 | Ishibashi | |
| 6,746,885 B2 | 6/2004 | Cao | |
| 6,803,607 B1 | 10/2004 | Chan et al. | |
| 6,848,819 B1 | 2/2005 | Arndt et al. | |
| 6,864,513 B2 | 3/2005 | Lin et al. | |
| 6,936,855 B1* | 8/2005 | Harrah ............ | 257/88 |
| 6,948,829 B2 | 9/2005 | Verdes et al. | |
| 6,982,518 B2 | 1/2006 | Chou et al. | |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,144,135 B2 | 12/2006 | Martin et al. | |
| 7,165,866 B2 | 1/2007 | Li | |
| 7,172,314 B2 | 2/2007 | Currie et al. | |
| 7,213,940 B1 | 5/2007 | Van De Ven et al. | |
| 7,354,174 B1 | 4/2008 | Yan | |
| 7,396,142 B2 | 7/2008 | Laizure, Jr. et al. | |
| 7,600,882 B1 | 10/2009 | Morejon et al. | |
| 7,726,836 B2 | 6/2010 | Chen | |
| 7,824,065 B2 | 11/2010 | Maxik | |
| 7,965,023 B1 | 6/2011 | Liang | |
| 8,021,025 B2 | 9/2011 | Lee | |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,249 B2 | 10/2012 | Liang et al. | |
| 8,282,250 B1 | 10/2012 | Dassanayake et al. | |
| 8,292,468 B2 | 10/2012 | Narendran et al. | |
| 8,322,896 B2 | 12/2012 | Falicoff et al. | |
| 8,371,722 B2 | 2/2013 | Carroll | |
| 8,400,051 B2 | 3/2013 | Hakata et al. | |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,427,037 B2 | 4/2013 | Liang et al. | |
| 8,449,154 B2 | 5/2013 | Uemoto et al. | |
| 8,502,468 B2 | 8/2013 | Li et al. | |
| 8,556,465 B2 | 10/2013 | Lee et al. | |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 2001/0026440 A1* | 10/2001 | Mellberg et al. ............ | 361/704 |
| 2003/0063476 A1 | 4/2003 | English et al. | |
| 2003/0214810 A1 | 11/2003 | Zhang | |
| 2004/0201990 A1 | 10/2004 | Meyer | |
| 2005/0254264 A1 | 11/2005 | Sidwell et al. | |
| 2008/0037255 A1 | 2/2008 | Wang | |
| 2009/0050907 A1 | 2/2009 | Yuan et al. | |
| 2009/0184618 A1 | 7/2009 | Hakata et al. | |
| 2010/0264800 A1 | 10/2010 | Liu et al. | |
| 2011/0204393 A1 | 8/2011 | Masumoto et al. | |
| 2011/0220920 A1 | 9/2011 | Collins et al. | |
| 2012/0040585 A1 | 2/2012 | Huang | |
| 2012/0224374 A1 | 9/2012 | Aliberti | |
| 2012/0268936 A1 | 10/2012 | Pickard et al. | |
| 2013/0062641 A1 | 3/2013 | Lin et al. | |
| 2013/0070461 A1 | 3/2013 | Pickard | |
| 2013/0088848 A1 | 4/2013 | Lee et al. | |
| 2013/0170221 A1 | 7/2013 | Isogai et al. | |
| 2014/0340870 A1 | 11/2014 | Premysler | |

FOREIGN PATENT DOCUMENTS

| | | |
|---|---|---|
| EP | 1058221 A2 | 12/2000 |
| EP | 0890059 B1 | 6/2004 |
| EP | 1471564 A2 | 10/2004 |
| EP | 1645794 A2 | 4/2006 |
| EP | 1853096 A2 | 11/2007 |
| EP | 2236907 A2 | 10/2010 |
| EP | 2413029 A2 | 2/2012 |
| EP | 2416056 A2 | 2/2012 |
| GB | 2345954 A | 7/2000 |
| GB | 2366610 A | 3/2002 |
| JP | H09265807 A | 10/1997 |
| JP | 11111819 A | 4/1999 |
| JP | 2000173304 A | 6/2000 |
| JP | 2000188001 | 7/2000 |
| JP | 2001118403 A | 4/2001 |
| JP | 2007059930 A | 3/2007 |
| JP | 2008288183 A | 11/2008 |
| JP | 2009117346 A | 5/2009 |
| JP | 3153766 U | 9/2009 |
| JP | 2009277586 A | 11/2009 |
| TW | M286462 U | 1/2006 |
| TW | M360982 U | 7/2009 |
| TW | M412319 U | 9/2011 |
| WO | 0124583 A1 | 4/2001 |
| WO | 0160119 A2 | 8/2001 |
| WO | 2011098358 A1 | 8/2011 |

(56) References Cited

FOREIGN PATENT DOCUMENTS

| | | |
|---|---|---|
| WO | 2012011279 A1 | 1/2012 |
| WO | 2012031533 A1 | 3/2012 |
| WO | 2013040506 A1 | 3/2013 |

OTHER PUBLICATIONS

Panasonic, Screw Type 4W LED Bulb Equivalent to 20W, http://www.panasonic.co.uk/html/en_GB/Products/Lighitng/LED+Lamps/LDAHV4L27CG/Overview/7848548/index.html.
U.S. Appl. No. 13/340,928, filed Dec. 30, 2011.
U.S. Appl. No. 13/462,388, filed May 2, 2012.
U.S. Appl. No. 13/662,618, filed Oct. 29, 2012.
U.S. Appl. No. 13/467,670, filed May 9, 2012.
U.S. Appl. No. 13/446,759, filed Apr. 13, 2012.
U.S. Appl. No. 61/738,668, filed Dec. 18, 2012.
U.S. Appl. No. 61/712,585, filed Oct. 11, 2012.
U.S. Appl. No. 61/716,818, filed Oct. 22, 2012.
U.S. Appl. No. 61/670,686, filed Jul. 12, 2012.
U.S. Appl. No. 13/758,565, filed Feb. 4, 2013.
U.S. Appl. No. 12/775,842, filed May 7, 2010.
U.S. Appl. No. 13/192,755, filed Jul. 28, 2011.
U.S. Appl. No. 13/339,974, filed Dec. 29, 2011.
U.S. Appl. No. 13/235,103, filed Sep. 16, 2011.
U.S. Appl. No. 13/360,145, filed Jan. 27, 2012.
U.S. Appl. No. 13/338,095, filed Dec. 27, 2011.
U.S. Appl. No. 13/338,076, filed Dec. 27, 2011.
U.S. Appl. No. 13/405,891, filed Feb. 27, 2012.
U.S. Appl. No. 13/781,844, filed Mar. 1, 2013.
U.S. Appl. No. 13/774,078, filed Feb. 22, 2013.
U.S. Appl. No. 13/774,193, filed Feb. 22, 2013.
U.S. Appl. No. 13/657,421, filed Oct. 22, 2012.
U.S. Appl. No. 13/341,337, filed Dec. 30, 2011.
Cree, Inc., International Application No. PCT/US2013/035400 Invitation to Pay Additional Fees, and, Where Applicable, Protest Fee, Jun. 5, 2013.
Cree, Inc., International Application No. PCT/US2013/035403 International Search Report and Written Opinion, May 29, 2013.
Cree, Inc., International Application No. PCT/US2014/036283, Invitation to Pay Additional Fees and, Where Applicable, Protest Fee, Sep. 1, 2014.
Cree, Inc. International Application No. PCT/US2014/045951, International Search Report and Written Opinion, Sep. 15, 2014.
Cree, Inc., International Application No. PCT/US2014/036283, International Search Report and Written Opinion, Feb. 19, 2015.
Cree, Inc., International Application No. PCT/US2014/052120, International Search Report and Written Opinion, Nov. 11, 2014.
Cree, Inc., European Application No. 13716151.9, Office Action, Nov. 28, 2014.
Cree, Inc., Taiwanese Application No. 102113095, Official Letter, Nov. 30, 2015.

\* cited by examiner

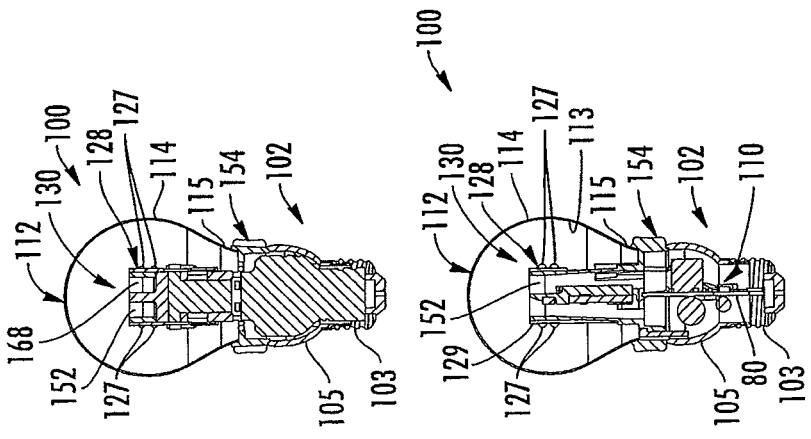
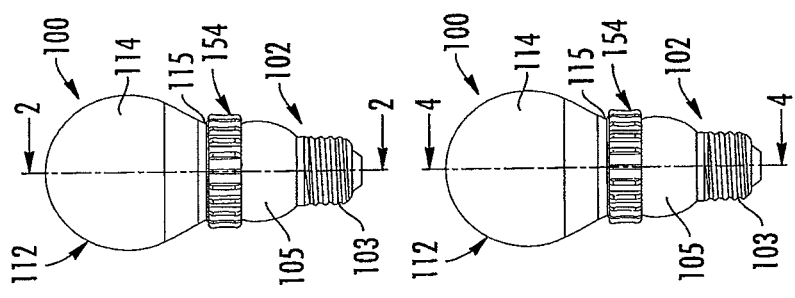

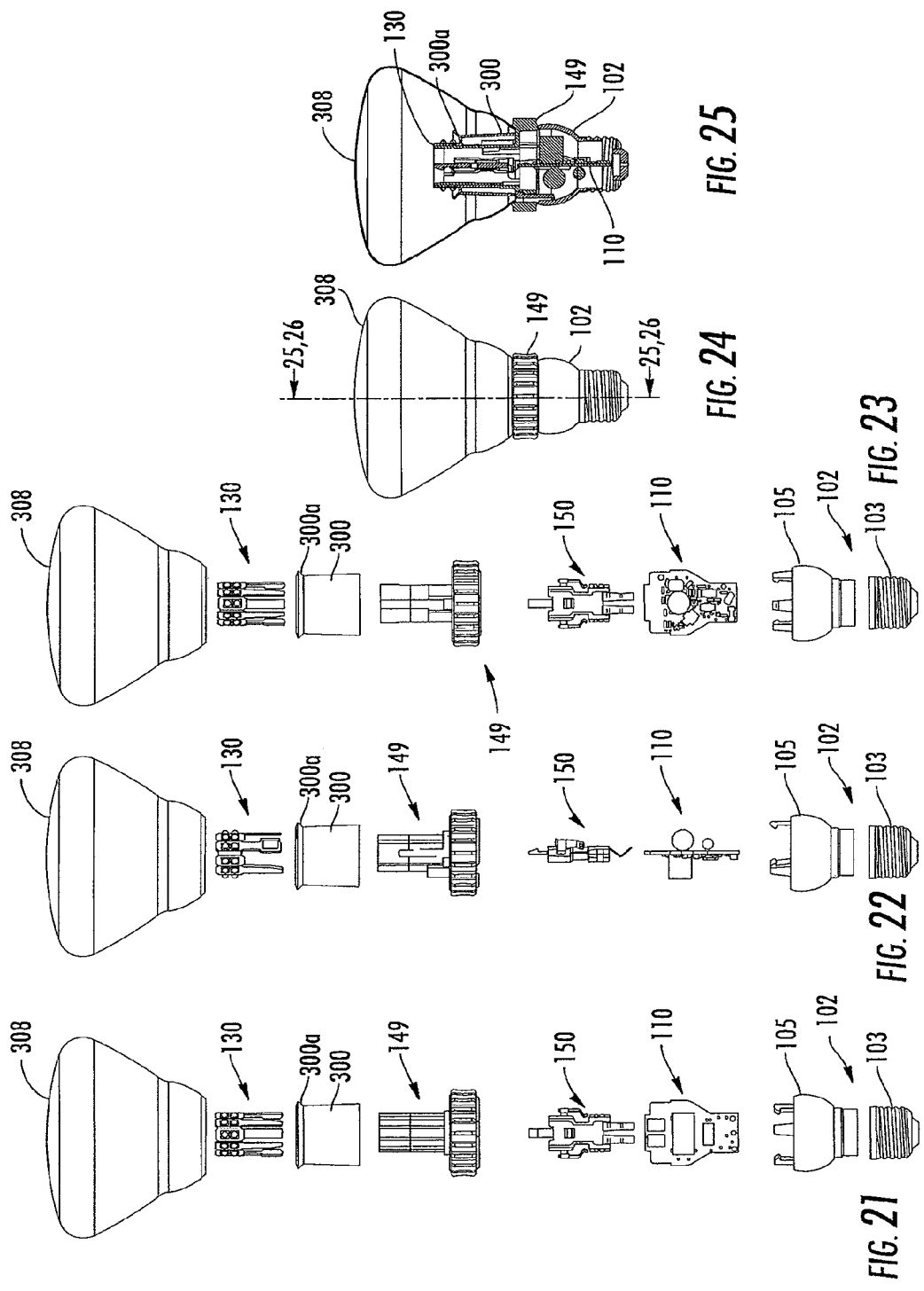

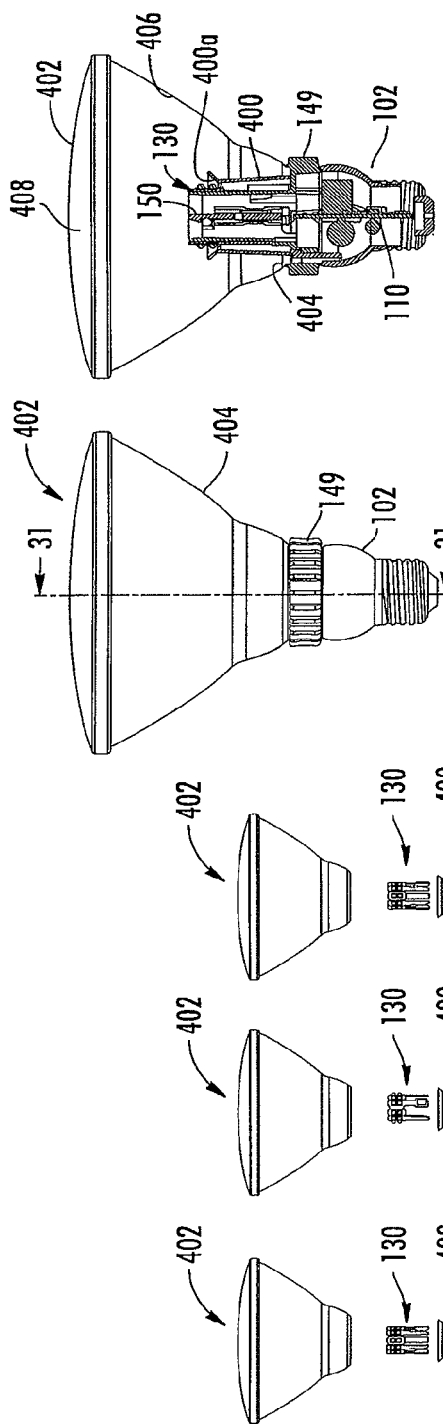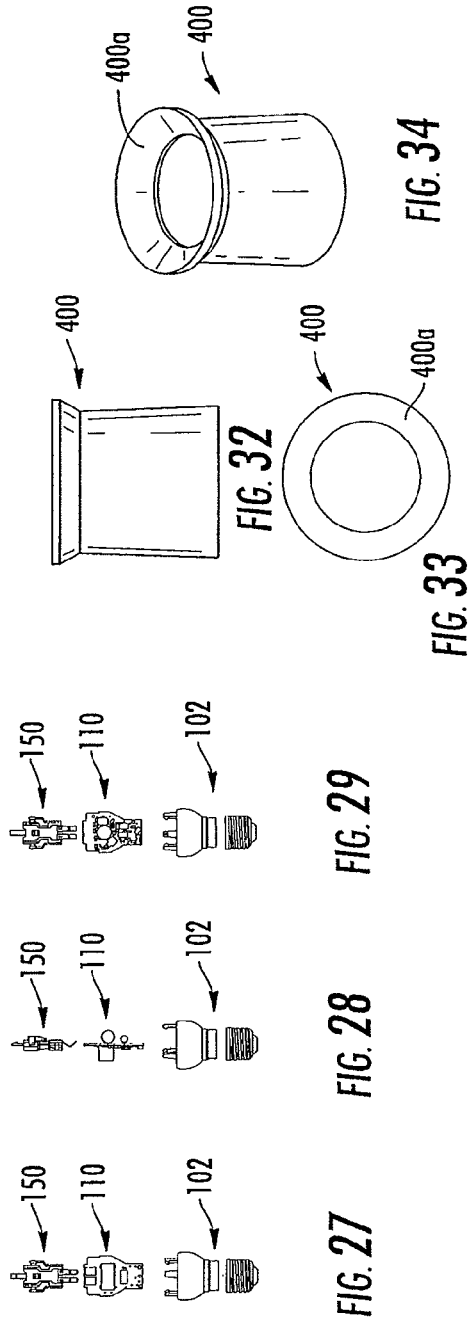

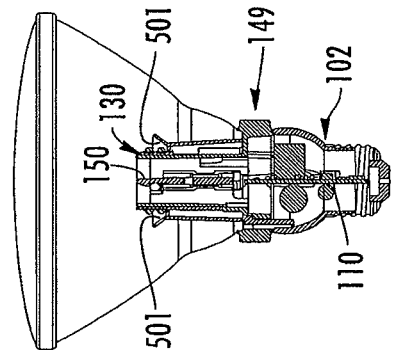
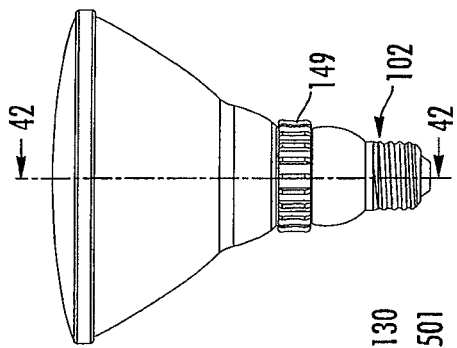
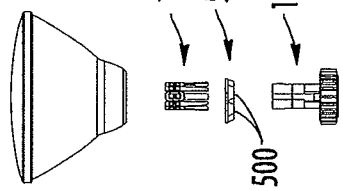
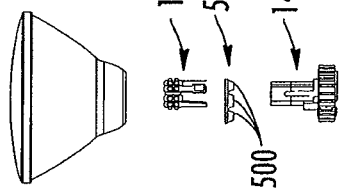
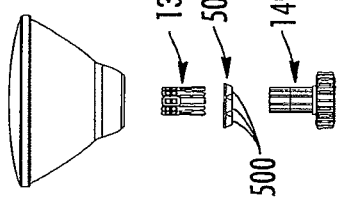
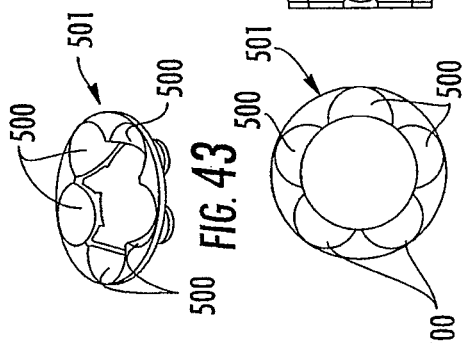
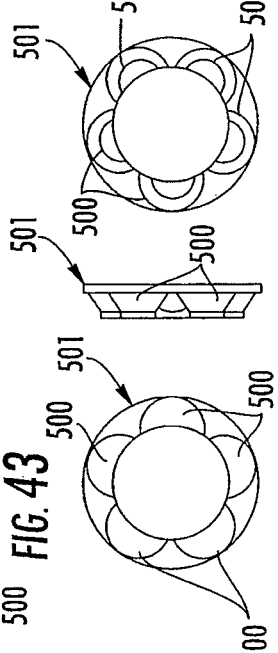
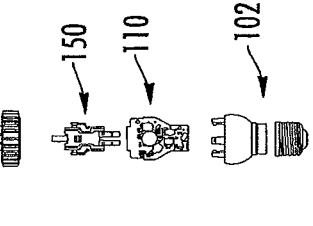
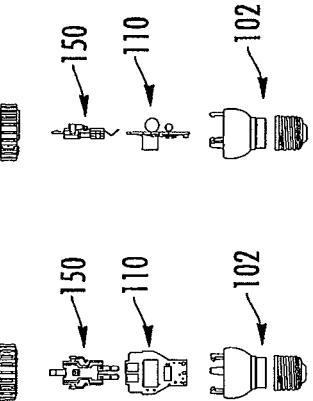

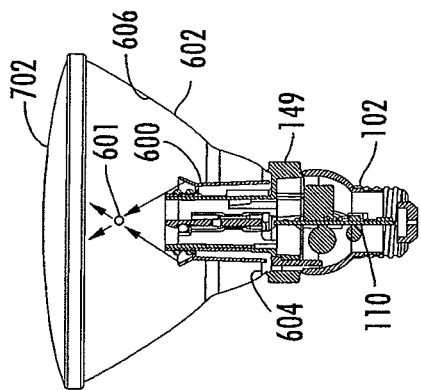
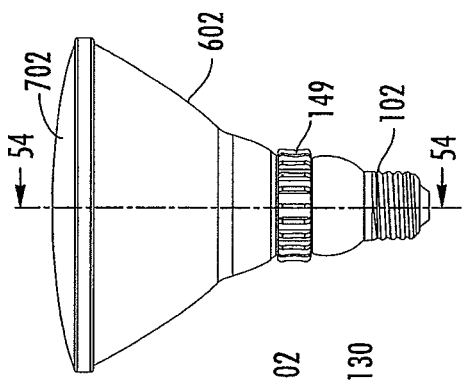
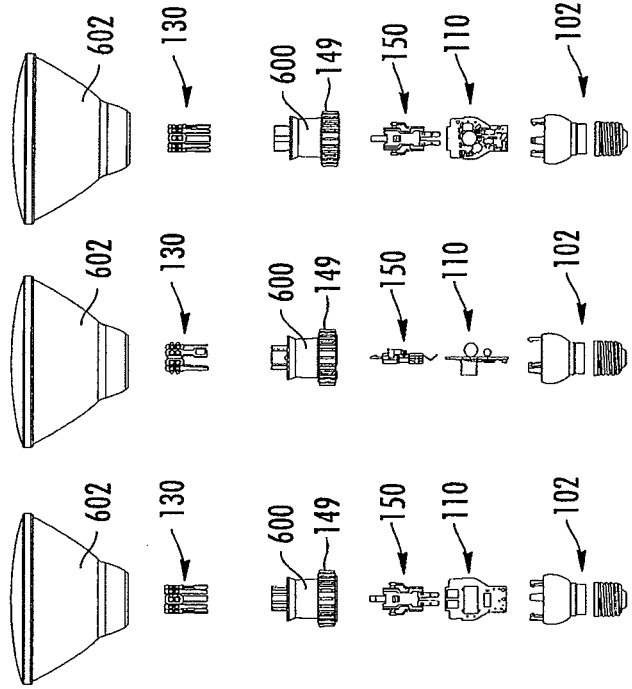
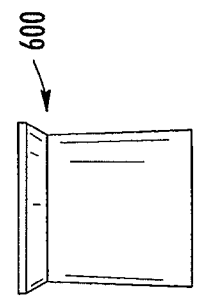
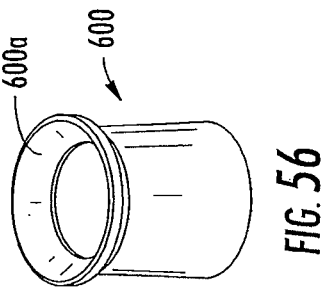
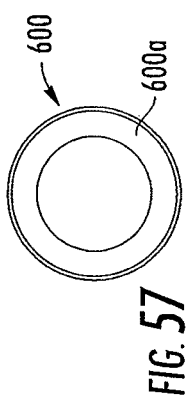

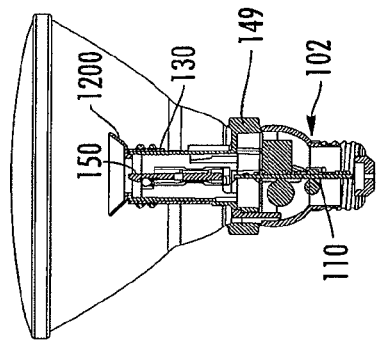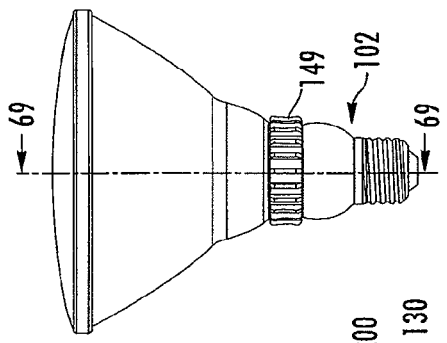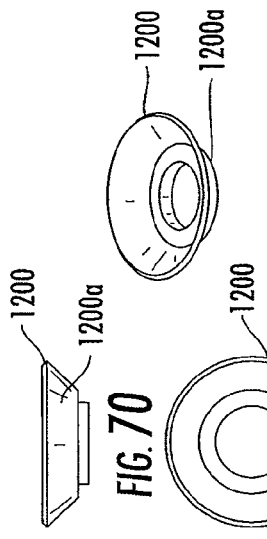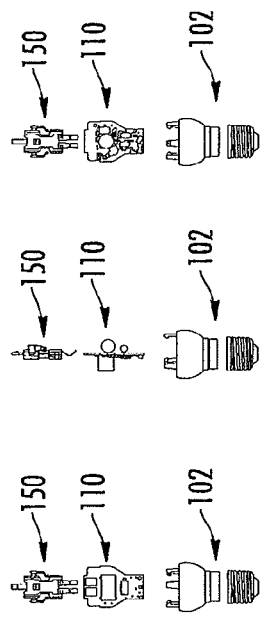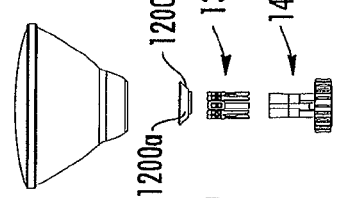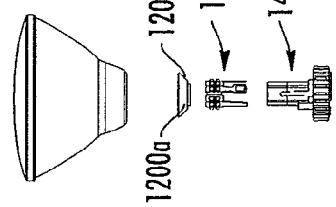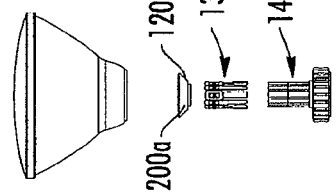

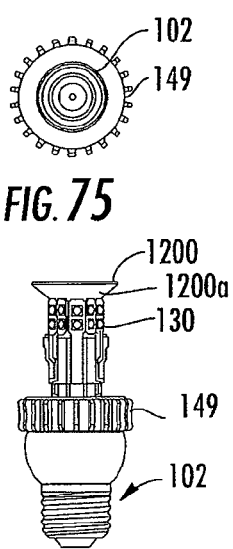
FIG. 75
FIG. 74
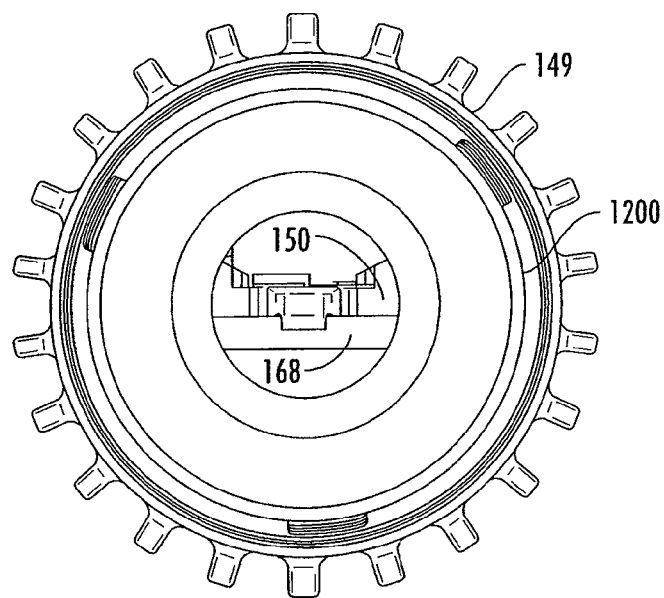
FIG. 73

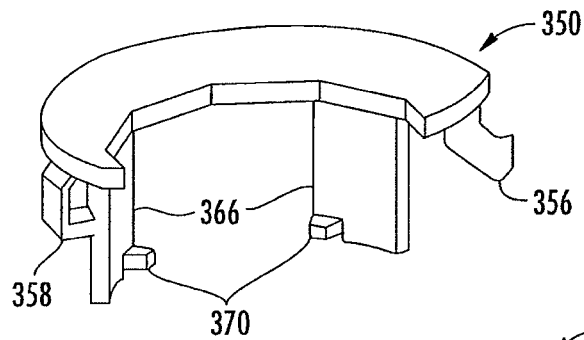
FIG. 79
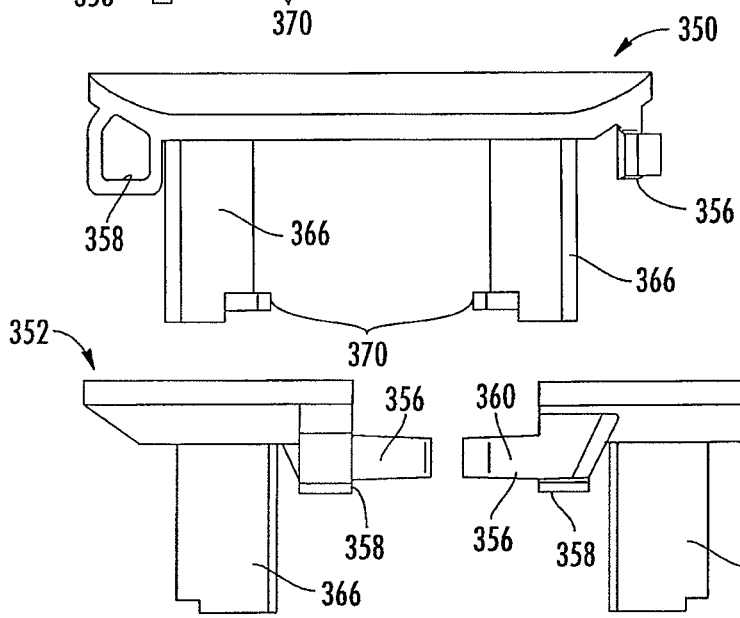
FIG. 80
FIG. 81
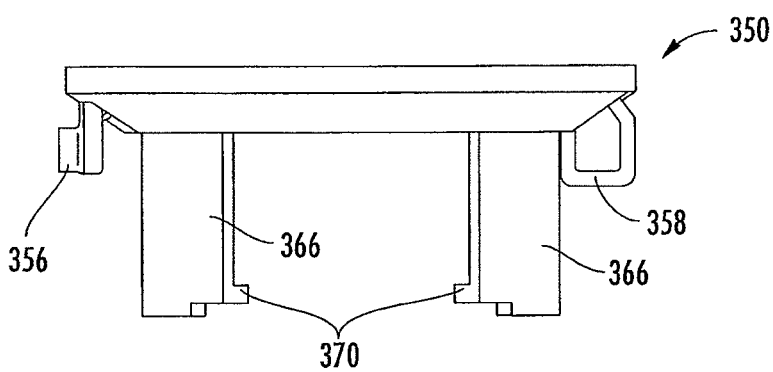
FIG. 82

LED LAMP WITH LED ASSEMBLY ON A HEAT SINK TOWER

This application is a continuation-in-part (CIP) of U.S. application Ser. No. 13/875,670, as filed on May 2, 2013, now U.S. Publication No. 2013/0279175, which is incorporated by reference herein in its entirety which is a continuation-in-part (CIP) of U.S. application Ser. No. 13/774,078, as filed on Feb. 22, 2013, now U.S. Publication No. 2013/0271981, which is incorporated by reference herein in its entirety, which is a continuation-in-part (CIP) of U.S. application Ser. No. 13/467,670, as filed on May 9, 2012, now U.S. Publication No. 2013/0271987, which is incorporated by reference herein in its entirety, and which is a continuation-in-part (CIP) of U.S. application Ser. No. 13/446,759, as filed on Apr. 13, 2012, now U.S. Publication No. 2013/0271972, which is incorporated by reference herein in its entirety; and U.S. application Ser. No. 13/774,078, as filed on Feb. 22, 2013, now U.S. Publication No. 2013/0271981, also claims benefit of priority under 35 U.S.C. §119(e) to the filing date of U.S. Provisional Application No. 61/738,668, as filed on Dec. 18, 2012, which is incorporated by reference herein in its entirety; and to the filing date of U.S. Provisional Application No. 61/712,585, as filed on Oct. 11, 2012, which is incorporated by reference herein in its entirety; and to the filing date of U.S. Provisional Application No. 61/716,818, as filed on Oct. 22, 2012, which is incorporated by reference herein in its entirety; and to the filing date of U.S. Provisional Application No. 61/670,686, as filed on Jul. 12, 2012, which is incorporated by reference herein in its entirety.

This application claims benefit of priority under 35 U.S.C. §119(e) to the filing date of U.S. Provisional Application No. 61/738,668, as filed on Dec. 18, 2012, which is incorporated by reference herein in its entirety; and to the filing date of U.S. Provisional Application No. 61/712,585, as filed on Oct. 11, 2012, which is incorporated by reference herein in its entirety; and to the filing date of U.S. Provisional Application No. 61/716,818, as filed on Oct. 22, 2012, which is incorporated by reference herein in its entirety; and to the filing date of U.S. Provisional Application No. 61/670,686, as filed on Jul. 12, 2012, which is incorporated by reference herein in its entirety

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature.

SUMMARY OF THE INVENTION

In one embodiment a lamp comprises an optically transmissive enclosure and a base defining a longitudinal axis of the lamp extending from the base to the free end of the enclosure. A heat sink is at least partially located in the enclosure and comprises a tower that extends along the longitudinal axis. An LED assembly is located in the optically transmissive enclosure. The LED assembly comprises a lead frame circuit and a plurality of LEDs attached to the lead frame circuit at solder joints such that the solder joints mechanically hold the lead frame circuit together as well as provide the electrical connections to anode and cathode sides of the lead frame. The lead frame is formed into a three-dimensional shape and secured to the tower.

A dielectric layer may be formed between the heat sink and the lead frame. The dielectric layer may comprise at least one of paint, dip coat and film. The dielectric layer may be thermally transmissive such that heat generated by the LED assembly is conducted to the tower. An exposed surface of the lead frame may be coated in white. The lead frame may be mounted directly to the tower. The lead frame may be formed into a cylindrical shape where the interior circumference of the lead frame is slightly smaller than the exterior circumference of the tower such that the lead frame is slightly deformed and expanded when positioned on the tower. A mechanical retainer may be formed on the lead frame that engages the tower. Adhesive may be used to secure the lead frame to the tower.

In one embodiment a lamp comprises an optically transmissive enclosure and a base defining a longitudinal axis of the lamp extending from the base to the free end of the enclosure. A heat sink is at least partially located in the enclosure and comprises a tower that extends along the longitudinal axis. An LED assembly is located in the optically transmissive enclosure. The LED assembly comprises a flex circuit and a plurality of LEDs attached to the flex circuit, the flex circuit formed into a three-dimensional shape and secured to the tower.

The flex circuit may comprise a flexible conductive layer supported on a dielectric film. The plurality of LEDs may be soldered to the conductive layer. A white cover layer covers an exposed surface of the flex circuit. The flex circuit may be wrapped around an outer periphery of the tower. The dielectric film may have a thickness selected such that heat is transferred from the plurality of LEDs to the heat sink through the film. The flex circuit may have a first free end and a second free end where the flex circuit is wrapped around the tower and the free ends are secured together. A mechanical connection may secure the first free end and the second free end. The first free end and the second free end may be heat staked to one another. The first free end may support a first LED and the second free end may define a hole where the hole receives the first LED.

BRIEF DESCRIPTION OF THE DRAWINGS

FIG. 1 is a front view of an embodiment of a lamp of the invention.
FIG. 2 is a section view taken along line A-A of FIG. 1.
FIG. 3 is a side view of the lamp of FIG. 1.
FIG. 4 is a section view taken along line B-B of FIG. 3.
FIG. 5 is an exploded perspective view of the lamp of FIG. 1.
FIGS. 21 through 23 are exploded plan views of an alternate embodiment of the lamp of the invention at different orientations of the lamp.
FIG. 24 is a front view of the embodiment of the lamp of FIG. 21.
FIG. 25 is a section view taken along line B-B of FIG. 24.
FIGS. 27 through 29 are exploded plan views of an alternate embodiment of the lamp of the invention at different orientations of the lamp.
FIG. 30 is a front view of an embodiment of a lamp of FIG. 27.
FIG. 31 is a section view taken along line B-B of FIG. 30.
FIG. 32 is a side view of an embodiment of a reflector.
FIG. 33 is a top view of the reflector of FIG. 32.
FIG. 34 is a perspective view of the reflector of FIG. 32.
FIGS. 38 through 40 are exploded plan views of an alternate embodiment of the lamp of the invention at different orientations of the lamp.
FIG. 41 is a front view of the embodiment of the lamp of FIG. 38.
FIG. 42 is a section view taken along line B-B of FIG. 41.
FIG. 43 is a perspective view of an embodiment of a reflector.
FIG. 44 is a top view of the reflector of FIG. 43.

FIG. 45 is a side view of the reflector of FIG. 43.
FIG. 46 is a bottom view of the reflector of FIG. 43.
FIGS. 50 through 52 are exploded plan views of an alternate embodiment of the lamp of the invention at different orientations of the lamp.
FIG. 53 is a front view of the embodiment of the lamp of FIG. 50.
FIG. 54 is a section view taken along line B-B of FIG. 53.
FIG. 55 is a side view of an embodiment of a reflector.
FIG. 56 is a perspective view of the reflector of FIG. 55.
FIG. 57 is a top view of the reflector of FIG. 55.
FIGS. 65 through 67 are exploded plan views of an alternate embodiment of the lamp of the invention at different orientations of the lamp.
FIG. 68 is a front view of the embodiment of the lamp of FIG. 65.
FIG. 69 is a section view taken along line B-B of FIG. 68.
FIG. 70 is a side view of an embodiment of a reflector.
FIG. 71 is a top view of the reflector of FIG. 70.
FIG. 72 is a perspective view of the reflector of FIG. 70.
FIG. 73 is a top view showing the reflector and LED assembly and heat sink of the embodiment of FIG. 65-69.
FIG. 74 is a side view of the assembly of FIG. 73.
FIG. 75 is a bottom view of the assembly of FIG. 73.
FIG. 79 is a perspective view of one portion of the reflector of FIG. 76.
FIG. 80 is a side view of one portion of the reflector of FIG. 76.
FIG. 81 is a front view of the reflector of FIG. 76 in a disassembled condition.
FIG. 82 is an alternate side view of one portion of the reflector of FIG. 76.

DETAILED DESCRIPTION

Figure 6:
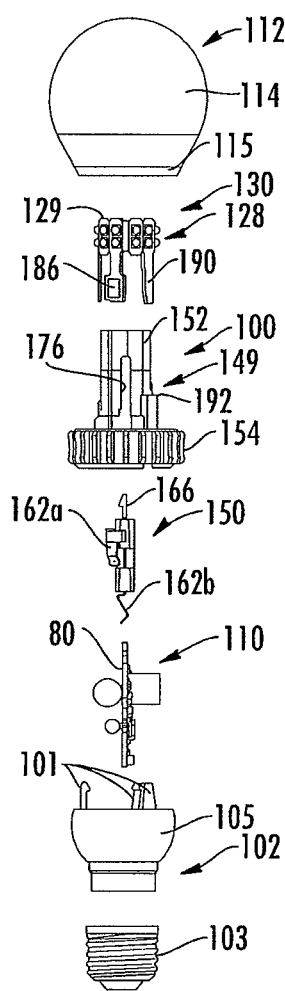
FIGS. 6 through 9 are exploded plan views of the lamp of FIG. 1 at different orientations of the lamp.
Figure 7:
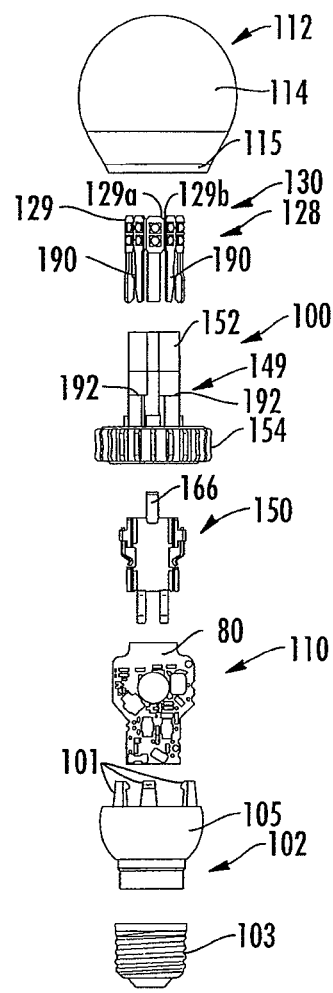
Figure 8:
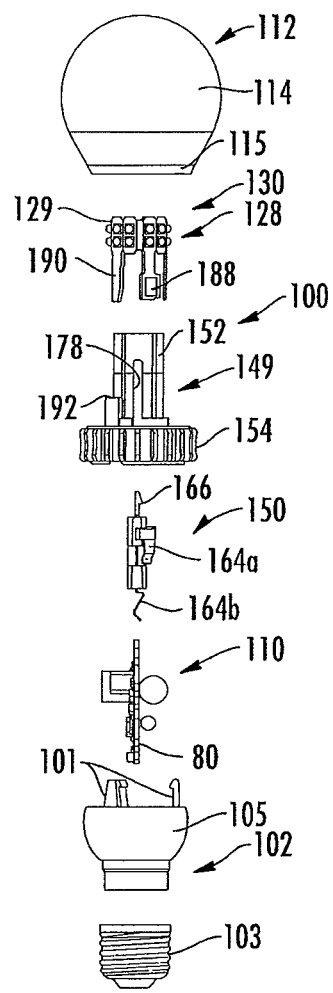
Figure 9:
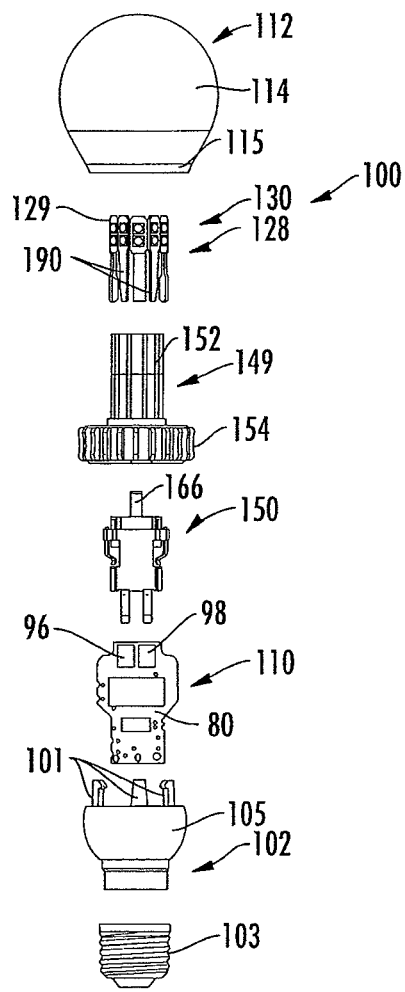
Figure 10:
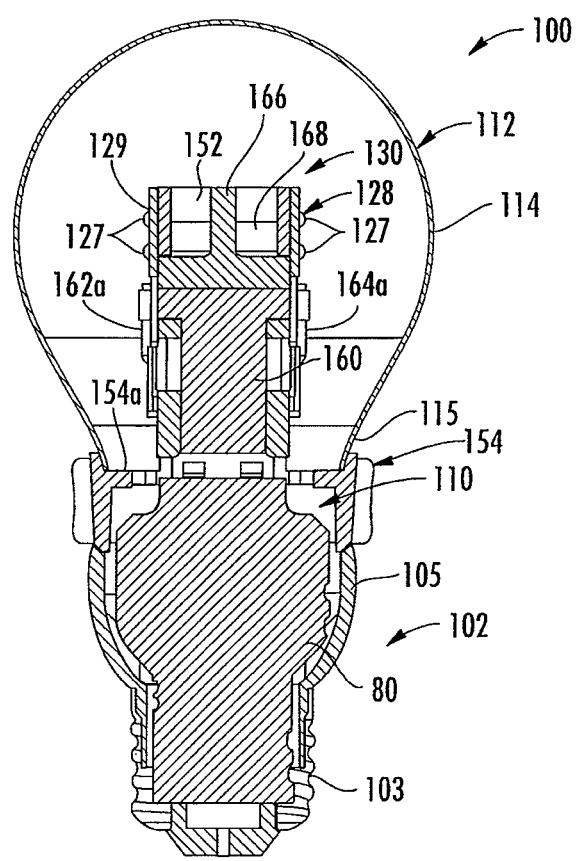
FIG. 10 is a section view similar to FIG. 2.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Embodiments of the present invention provide a solid-state lamp with centralized light emitters, more specifically, LEDs. Multiple LEDs can be used together, forming an LED array. The LEDs can be mounted on or fixed within the lamp in various ways. In at least some example embodiments, a submount is used. The LEDs are disposed at or near the central portion of the structural envelope of the lamp. Since the LED array may be configured in some embodiments to reside centrally within the structural envelope of the lamp, a lamp can be constructed so that the light pattern is not adversely affected by the presence of a heat sink and/or mounting hardware, or by having to locate the LEDs close to the base of the lamp. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

FIGS. 1 through 11 show a lamp, 100, according to some embodiments of the present invention. Lamp 100 may be used as an A-series lamp with an Edison base 102, more particularly; lamp 100 is designed to serve as a solid-state replacement for an A19 incandescent bulb. The Edison base 102 as shown and described herein may be implemented through the use of an Edison connector 103 and a plastic form. The LEDs 127 in the LED array 128 may comprise an LED die disposed in an encapsulant such as silicone, and LEDs which are encapsulated with a phosphor to provide local wavelength conversion, as will be described later when various options for creating white light are discussed. The LEDs 127 of LED array 128 are mounted on a submount 129 and are operable to emit light when energized through an electrical connection. In the present invention the term "submount" is used to refer to the support structure that supports the individual LEDs or LED packages and in one embodiment comprises a printed circuit board or "PCB" although it may comprise other structures such as a lead frame extrusion or the like or combinations of such structures. In some embodiments, a driver or power supply may be included with the LED array on the submount. In some cases the driver may be formed by components on PCB 80. While a lamp having the size and form factor of a standard-sized household incandescent bulb is shown, the lamp may have other the sizes and form factors. For example, the lamp may be a PAR-style lamp such as a replacement for a PAR-38 incandescent bulb or a BR-style incandescent bulb.

Enclosure 112 is, in some embodiments, made of glass, quartz, borosilicate, silicate, polycarbonate, other plastic or other suitable material. The enclosure may be of similar shape to that commonly used in household incandescent bulbs. In some embodiments, the glass enclosure is coated on the inside with silica 113, providing a diffuse scattering layer that produces a more uniform far field pattern. The enclosure may also be etched, frosted or coated. Alternatively, the surface treatment may be omitted and a clear enclosure may be provided. The enclosure may also be provided with a shatter proof or shatter resistant coating. It should also be noted that in this or any of the embodiments shown here, the optically transmissive enclosure or a portion of the optically transmissive enclosure could be coated or impregnated with phosphor or a diffuser. The glass enclosure 112 may have a traditional bulb shape having a globe shaped main body 114 that tapers to a narrower neck 115.

A lamp base 102 such as an Edison base functions as the electrical connector to connect the lamp 100 to an electrical socket or other connector. Depending on the embodiment, other base configurations are possible to make the electrical connection such as other standard bases or non-traditional bases. Base 102 may include the electronics 110 for powering lamp 100 and may include a power supply and/or driver and form all or a portion of the electrical path between the mains and the LEDs. Base 102 may also include only part of the power supply circuitry while some smaller components reside on the submount. With the embodiment of FIG. 1, as with many other embodiments of the invention, the term "electrical path" can be used to refer to the entire electrical path to the LED array 128, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Electrical conductors run between the LED assembly 130 and the lamp base 102 to carry both sides of the supply to provide critical current to the LEDs 127 as will be described.

The LED assembly 130 may be implemented using a printed circuit board ("PCB") and may be referred by in some cases as an LED PCB. In some embodiments the LED PCB comprises the submount 129. The lamp 100 comprises a solid-state lamp comprising a LED assembly 130 with light emitting LEDs 127. Multiple LEDs 127 can be used together, forming an LED array 128. The LEDs 127 can be mounted on or fixed within the lamp in various ways. In at least some example embodiments, a submount 129 is used. The LEDs 127 in the LED array 128 include LEDs which may comprise an LED die disposed in an encapsulant such as silicone, and LEDs which may be encapsulated with a phosphor to provide local wavelength conversion, as will be described later when various options for creating white light are discussed. A wide variety of LEDs and combinations of LEDs may be used in the LED assembly 130 as described herein. The LEDs 127 of the LED array 128 are operable to emit light when energized through an electrical connection. An electrical path runs between the submount 129 and the lamp base 102 to carry both sides of the supply to provide critical current to the LEDs 127.

In some embodiments, a driver and/or power supply are included with the LED array 128 on the submount 129. In other embodiments the driver and/or power supply are included in the base 102 as shown. The power supply and drivers may also be mounted separately where components of the power supply are mounted in the base 102 and the driver is mounted with the submount 129 in the enclosure 112. Base 102 may include a power supply or driver and form all or a portion of the electrical path between the mains and the LEDs 127. The base 102 may also include only part of the power supply circuitry while some smaller components reside on the submount 129. In some embodiments any component that goes directly across the AC input line may be in the base 102 and other components that assist in converting the AC to useful DC may be in the glass enclosure 112. In one example embodiment, the inductors and capacitor that form part of the EMI filter are in the Edison base. Suitable power supplies and drivers are described in U.S. patent application Ser. No. 13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

The AC to DC conversion may be provided by a boost topology to minimize losses and therefore maximize conversion efficiency. The boost supply is connected to high voltage LEDs operating at greater than 200V. Other embodiments are possible using different driver configurations, or a boost supply at lower voltages.

In some embodiments a gas movement device may be provided within the enclosure 112 to increase the heat transfer between the LEDs 127 and LED assembly 130 and heat sink 149. The movement of the gas over the LED assembly 130 moves the gas boundary layer on the components of the LED assembly 130. In some embodiments the gas movement device comprises a small fan. The fan may be connected to the power source that powers the LEDs 127. While the gas movement device may comprise an electric fan, the gas movement device may comprise a wide variety of apparatuses and techniques to move air inside the enclosure such as a rotary fan, a piezoelectric fan, corona or ion wind generator, synjet diaphragm pumps or the like.

The LED assembly 130 comprises a submount 129 arranged such that the LED array 128 is substantially in the center of the enclosure 112 such that the LED's 127 are positioned at the approximate center of enclosure 112. As used herein the terms "center of the enclosure" and "optical center of the enclosure" refers to the vertical position of the LEDs in the enclosure as being aligned with the approximate largest diameter area of the globe shaped main body 114. "Vertical" as used herein means along the longitudinal axis of the bulb where the longitudinal axis extends from the base to the free end of the bulb as represented for example by line A-A in FIG. 1. In one embodiment, the LED array 128 is arranged in the approximate location that the visible glowing filament is disposed in a standard incandescent bulb. The terms "center of the enclosure" and "optical center of the enclosure" do not necessarily mean the exact center of the enclosure and are used to signify that the LEDs are located along the longitudinal axis of the lamp at a position between the ends of the enclosure near a central portion of the enclosure.

Figure 19:
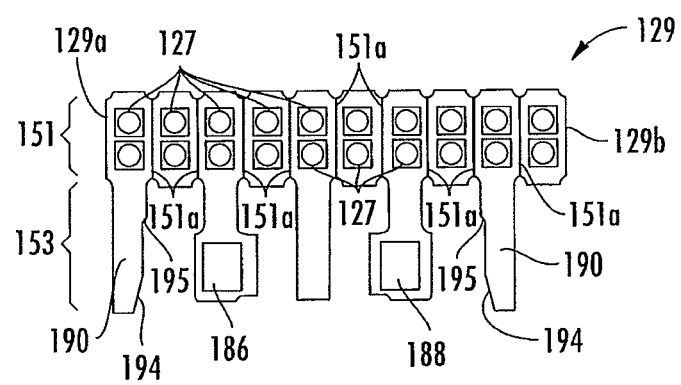
FIG. 19 is a side view of an embodiment of a MCPCB submount usable in embodiments of the lamp of the invention.
Figure 20:
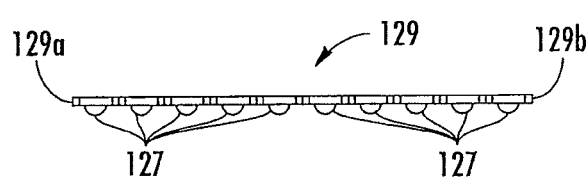
FIG. 20 is an end view of the embodiment of a MCPCB submount of FIG. 19.
Figure 26:
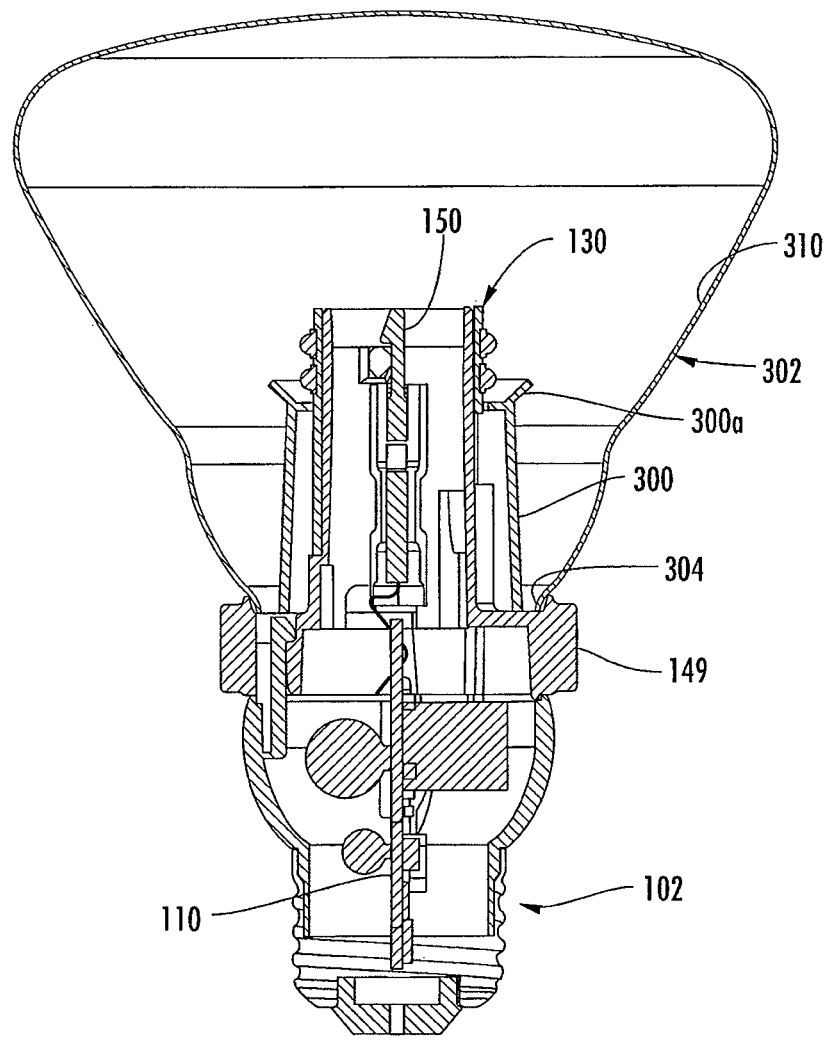
FIG. 26 is a more detailed section view taken along line B-B of FIG. 24.
Figure 37:
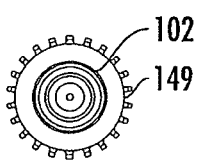
FIG. 37 is a bottom view of the assembly of FIG. 35.
Figure 36:
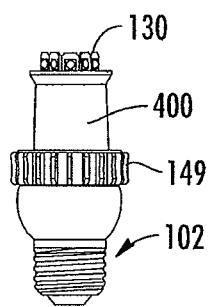
FIG. 36 is a side view of the assembly of FIG. 35.
Figure 35:
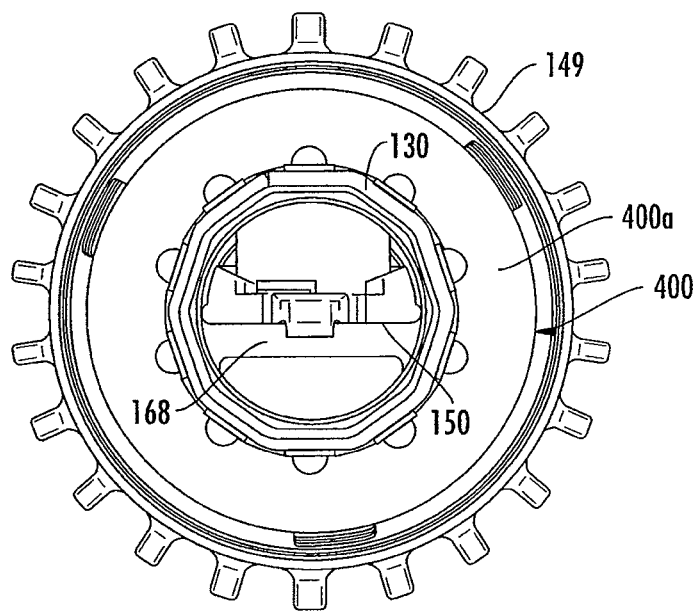
FIG. 35 is a top view showing the reflector and LED assembly and heat sink of the embodiment of FIG. 27-32.
Figure 49:
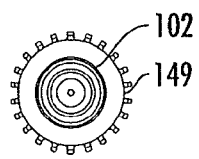
FIG. 49 is a bottom view of the assembly of FIG. 47.
Figure 48:
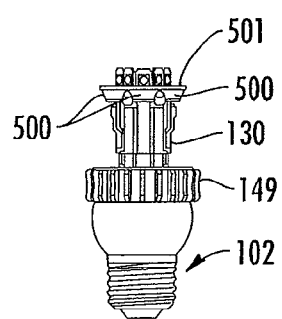
FIG. 48 is a side view of the assembly of FIG. 47.
Figure 47:
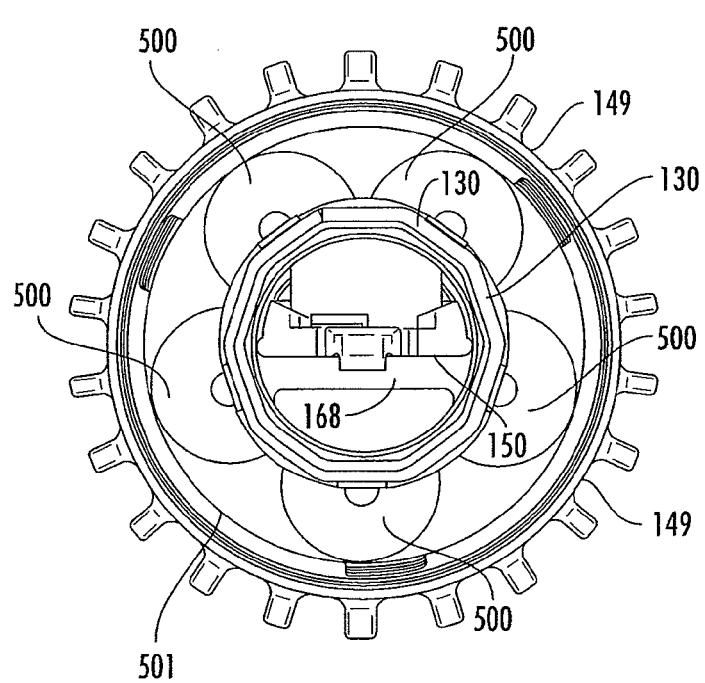
FIG. 47 is a top view showing the reflector and LED assembly and heat sink of the embodiment of FIG. 38-42.
Figure 60:
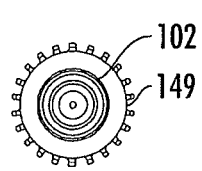
FIG. 60 is a bottom view of the assembly of FIG. 58.
Figure 59:
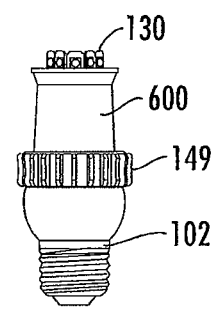
FIG. 59 is a side view of the assembly of FIG. 58.
Figure 58:
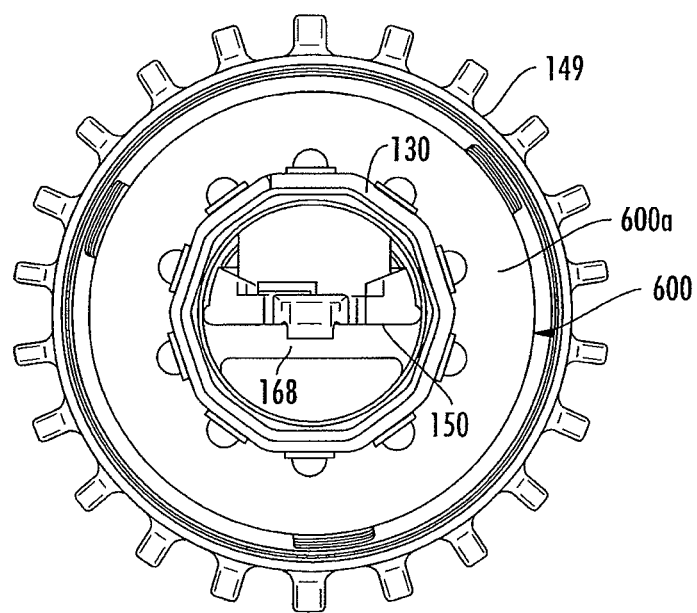
FIG. 58 is a top view showing the reflector and LED assembly and heat sink of the embodiment of FIG. 50-54.

Referring to FIGS. 19 and 20, in some embodiments, the submount 129 may comprise a PCB, metal core board, metal core printed circuit board or other similar structure. The submount may be made of a thermally conductive material. In some embodiments the thickness of the submount may be about 1 mm-2.0 mm thick. For example the thickness may be about 1.6 mm. In other embodiments a copper or copper based lead frame may be used. Such a lead frame may have a thickness of about 0.25-1.0 mm, for example, 0.25 mm or 0.5 mm. In other embodiments, other dimensions including thicknesses are possible. The entire area of the submount 129 may be thermally conductive such that the entire LED assembly 130 transfers heat to the heat sink 149. The submount 129 comprises a first LED mounting portion 151 that functions to mechanically and electrically support the LEDs 127 and a second connector portion 153 that functions to provide thermal, electrical and mechanical connections to the LED assembly 130. The submount 129 may be bent into the configuration of the LED assembly 130 as shown in the figures. In one embodiment, the enclosure and base are dimensioned to be a replacement for an ANSI standard A19 bulb such that the dimensions of the lamp 100 fall within the ANSI standards for an A19 bulb. The dimensions may be different for other ANSI standards including, but not limited to, A21 and A23 standards. While specific reference has been made with respect to an A-series lamp with an Edison base 102 the structure and assembly method may be used on other lamps such as a PAR-style lamp such as a replacement for a PAR-38 incandescent bulb or a BR-style lamp. In other embodiments, the LED lamp can have any shape, including standard and non-standard shapes.

In some embodiments, the LED lamp 100 is equivalent to a 60 Watt incandescent light bulb. In one embodiment of a 60 Watt equivalent LED bulb, the LED assembly 130 comprises an LED array 128 of 20 XLamp® XT-E High Voltage white LEDs manufactured by Cree, Inc., where each XLamp® XT-E LED has a 46 V forward voltage and includes 16 DA LED chips manufactured by Cree, Inc. and configured in series. The XLamp® XT-E LEDs may be configured in four parallel strings with each string having five LEDs arranged in series, for a total of greater than 200 volts, e.g. about 230 volts, across the LED array 128. In another embodiment of a 60 Watt equivalent LED bulb, 20 XLamp® XT-E LEDs are used where each XT-E has a 12 V forward voltage and includes 16 DA LED chips arranged in four parallel strings of four DA chips arranged in series, for a total of about 240 volts across the LED array 128 in this embodiment. In some embodiments, the LED lamp 100 is equivalent to a 40 Watt incandescent light bulb. In such embodiments, the LED array 128 may comprise 10 XLamp® XT-E LEDs where each XT-E includes 16 DA LED chips configured in series. The 10 46V XLamp® XT-E® LEDs may be configured in two parallel strings where each string has five LEDs arranged in series, for a total of about 230 volts across the LED array 128. In other embodiments, different types of LEDs are possible, such as XLamp® XB-D LEDs manufactured by Cree, Inc. or others. Other arrangements of chip on board LEDs and LED packages may be used to provide LED based light equivalent to 40, 60 and/or greater other watt incandescent light bulbs, at about the same or different voltages across the LED array 128.

The XT and XB LEDs described above are spherical domed LEDs having a generally Lambertian light distribution where a relatively high fraction of the light emitted by the LEDs comes out of the top of the LEDs. The "top" of the LED being the side opposite to the substrate on which the LED chips are mounted. These LEDs and other similar LEDs tend to have a relatively narrow viewing angle and may have a viewing angle on the order of about 110 degrees. As a result, when the LEDs are mounted on a vertical surface such as substrate 129 as described herein, more light is directed toward the lateral sides of the enclosure 112 and relatively less light is directed toward the top and bottom of the lamp. As a result, a lamp having spherical domed LEDs, or other LEDs with similar light distributions, may not produce sufficient light toward the free end of the lamp. Because the lamp may not emit enough light toward the free end of the lamp the lamp may not be Energy Star compliant.

Figure 86:
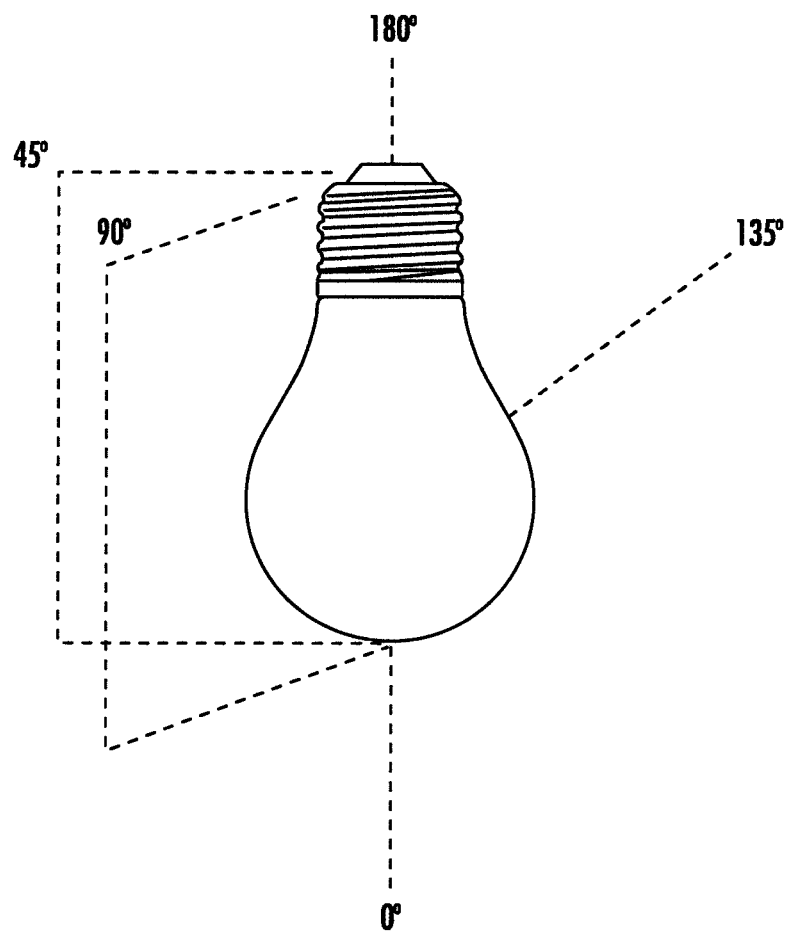
FIG. 86 is a diagram taken from Appendix B of the "ENERGY STAR® Program Requirements for Integral LED Lamps.

While the desired light intensity distribution may comprise any light intensity distribution, in one embodiment the desired light intensity distribution conforms to the ENERGY STAR® Partnership Agreement Requirements for Luminous Intensity Distribution, which is incorporated herein by reference. For an omnidirectional lamp the Luminous Intensity Distribution is defined as "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135°-180° zone. Distribution shall be vertically symmetrical as measures in three vertical planes at 0°, 45°, and 90°." FIG. 86 is a diagram useful in explaining the luminous intensity distribution described above and is taken from the "ENERGY STAR® Program Requirements for Integral LED Lamps" which is incorporated herein by reference. As shown in FIG. 86, the free end of the enclosure 112, opposite to the base, is considered 0° and the base of the lamp is considered 180°. As defined in the standard, luminous intensity is measured from 0° to 135° where the measurements are repeated in vertical planes at 0°, 45° and 90°. The structure and operation of lamp 100 of the invention will be described with specific reference to the ENERGY STAR® standard set forth above; however, the lamp may be used to create other light intensity distribution patterns.

Figure 87:
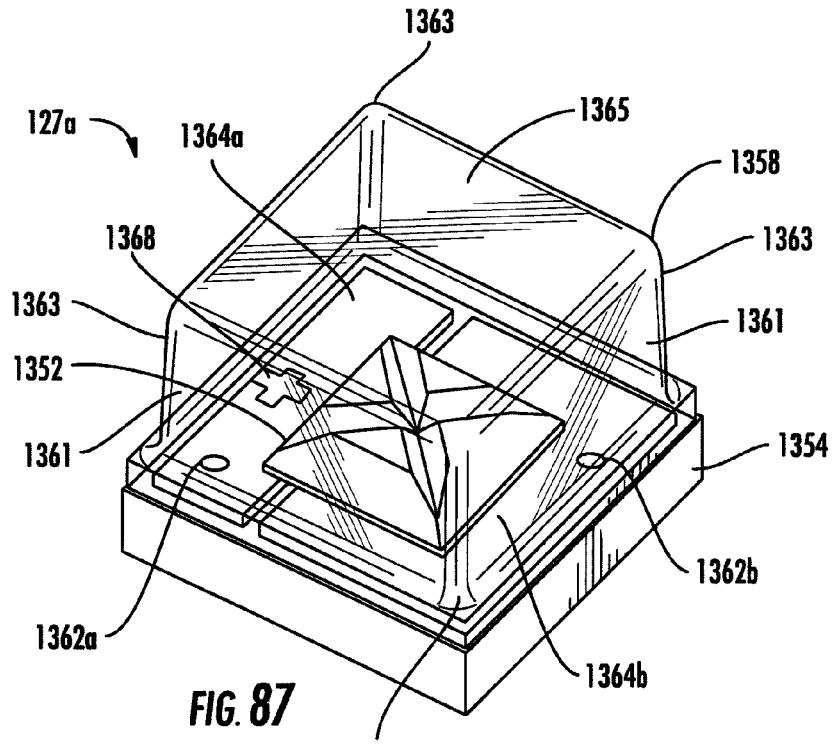
"
FIGS. 87 and 88 are perspective views illustrating an LED assembly usable in the lamp of the invention.
Figure 88:
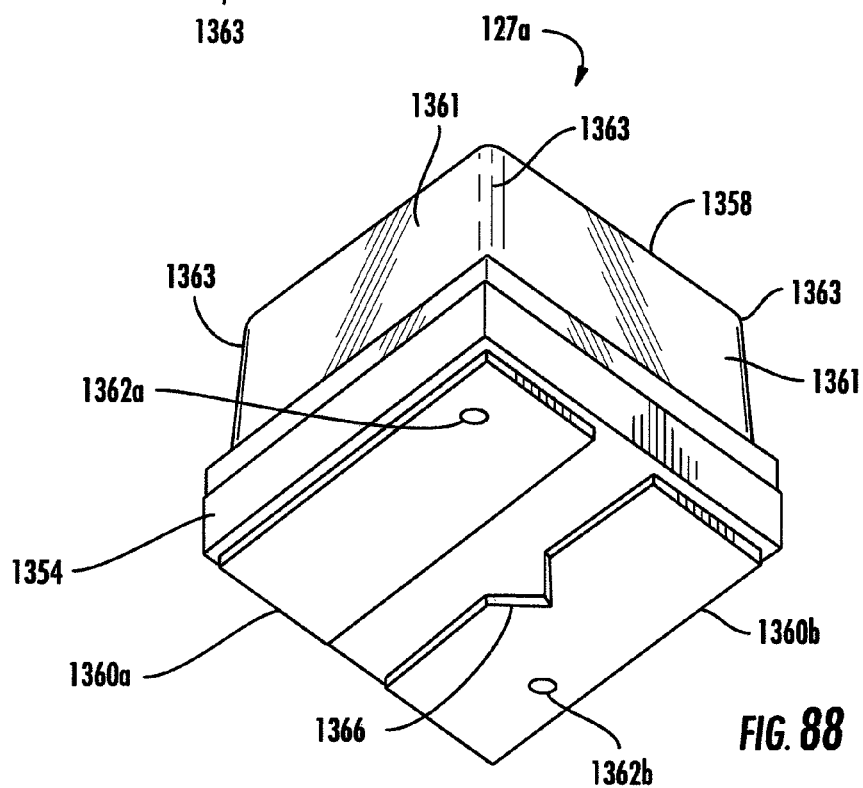
Figure 90:
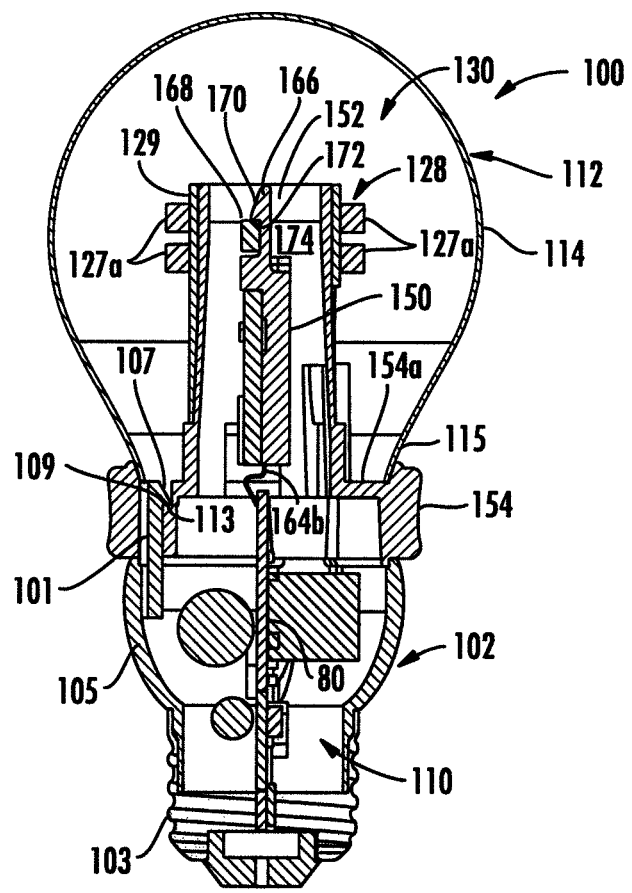
FIG. 90 is a section view of an alternate embodiment of the lamp of the invention.

In some embodiments, LEDs 127*a* that emit more light parallel to the substrate, as opposed to normal to the substrate, may be used as shown in FIG. 90. In some embodiments all of the LEDs may have the wider view angle as described herein while in other embodiments some of the LEDs may have the wider view angle with other ones of the LEDs comprising LEDs having a narrower view angle. The LEDs 127*a* may have one or more planar emission surfaces. For example, cube-shaped LEDs may be used that emit more light from the sides of the LED, parallel to the substrate. One suitable LED is disclosed in U.S. patent application Ser. No. 13/649,052 to Lowes et al., entitled "LED Package with Encapsulant having Planar Surfaces" filed on Oct. 10, 2012, the contents of which is incorporated by reference herein in its entirety. FIGS. 87 and 88 show one embodiment of an LED package 127*a* comprising an LED chip 1352 mounted on a submount 1354. The LED 127*a* also comprises and first and second bottom contact/solder pads 1360*a* and 1360*b* on the bottom of the submount 1354, first and second conductive vias 1362*a*, 1362*b* passing through the submount 1354, and first and second die attach pads 1364*a*, 1364*b* on the top surface of the submount 1354. The LED package further comprises a conversion material layer covering the LED chip 1352, the exposed surfaces of the die attach pads 1364*a*, 1364*b*, and exposed portions of the top surface of the submount 1354. An encapsulant 1358 is included over the LED 1352, the attach pads 1364*a*, 1364*b*, and the submount 1354.

Figure 92:
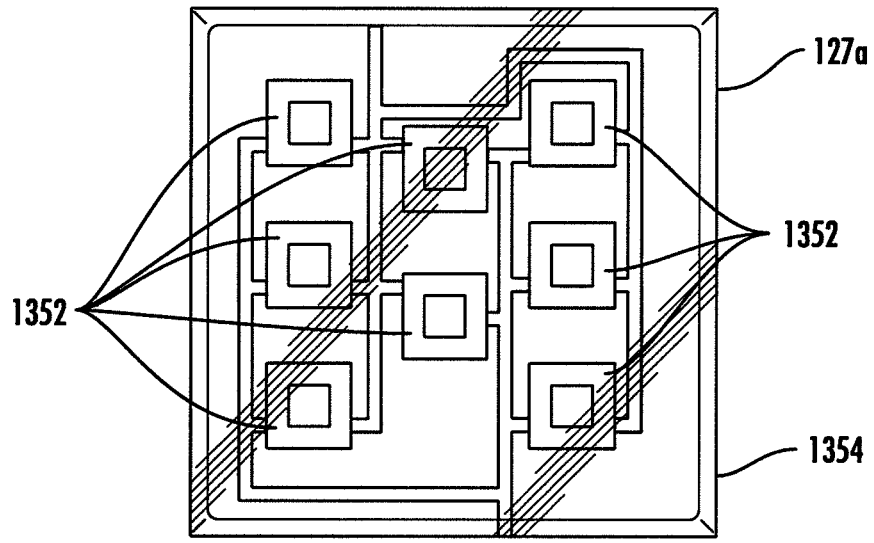
FIGS. 92 and 93 are top views of embodiments of LED components with the phosphor and lens removed to show the chip layout.
Figure 93:
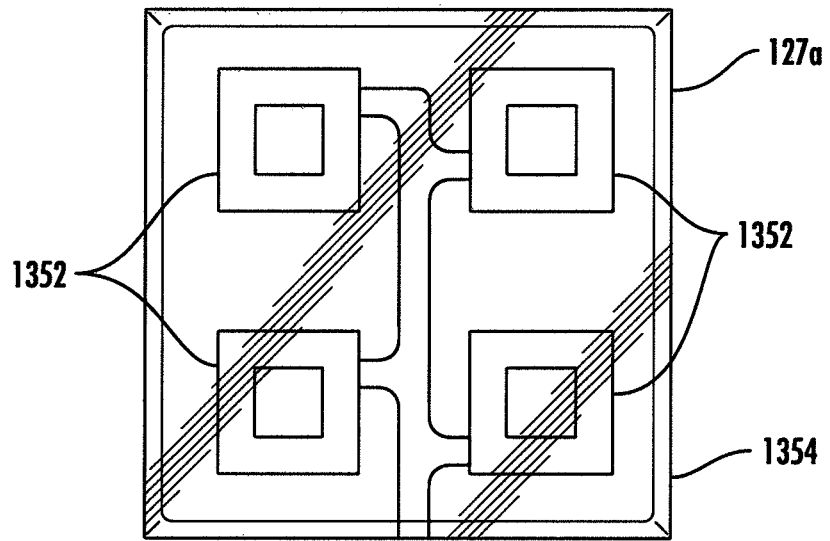

The LED 1352 is shown as a single LED, but it is understood that in other embodiments the light source can comprise more than one LED. Many different LEDs can be used such as those commercially available from Cree Inc., under its DA, EZ, GaN, MB, RT, TR, UT and XT families of LED chips. The LED package 127*a* is particularly arranged for use with the DA family of chips such as the DA850 chip that can be flip chip mounted and allows for wire-free bonding. These types of chips are generally described in U.S. patent application Ser. No. 12/463,709 to Donofrio et al., entitled "Semiconductor Light Emitting Diodes Having Reflective Structures and Methods of Fabricating Same," which is incorporated herein by reference. The LED chip 1352 can emit many different colors of light, with a preferred LED chip emitting light in the blue wavelength spectrum. Referring to FIGS. 92 and 93 show other embodiments of the LEDs. FIG. 92 shows a 2.5× 2.5 mm package without the phosphor and cube lens having 8 CREE DA500 LED chips in series where each chip is a 3 volt part for a 24 volt component and FIG. 93 shows a 1.6×1.6 mm package without the phosphor and cube lens having 4 CREE DA500 LED chips in series where each chip is a 3 volt part for a 12 volt component. The packages of FIGS. 92 and 93 may be covered with a cube lens and/or phosphor to create the LED 127*a* as described herein.

The submount 1354 can be formed of many different materials with a preferred material being electrically insulating, such as dielectric material. The submount 1354 can comprise a ceramic such as alumina, aluminum nitride, silicon carbide, or a polymeric material such as polymide and polyester. In the preferred embodiment, the submount 1354 can comprise a dielectric material having a relatively high thermal conductivity, such as aluminum nitride and alumina. In other embodiments the submount 1354 can comprise a printed circuit board (PCB), sapphire or silicon or any other suitable material, such as T-Clad thermal clad insulated substrate material. For PCB embodiments different PCB types can be used such as standard FR-4 PCB, metal core PCB, or any other type of printed circuit board.

The top surface of the submount 1354 is shown having a planar surface with patterned conductive features that can comprise first and second die attach pads 1364*a*, 1364*b*. A space is provided between the attached pads 1364*a*, 1364*b*, with the LED chip 1352 mounted to the pads 1364*a*, 1364*b* such that respective portions of the 1352 are mounted to a respective one of the pads 1364*a* and 1364*b* and the LED 1352 spans the space between the attach pads 1364*a*, 1364*b*. Many different mounting methods can be used, such as methods utilizing conventional solder materials. Other types of LED chips can be electrically connected to the attach pads 1364*a*, 1364*b* or other conductive traces using known surface mount or wire bonding methods depending on the geometry of the LED chip 1352.

The pads 1364*a*, 1364*b* can comprise many different materials, such as metals or other conductive materials, and in one embodiment they can comprise copper deposited using known techniques such as plating. In other embodiments, pads 1364*a*, 1364*b* can be sputtered using a mask to form the desired pattern, and in other embodiments they can be formed using known photolithography processes. The pads 1364*a*, 1364*b* can extend beyond the edge of the LED 1352 to cover most of the top surface of the submount 1354. This helps in thermal management for the LED package 1350 by spreading heat from the LED chips 1352 into the pads 1364*a*, 1364*b* so that heat spreads beyond the edge of the LED chips 1352 into more area of the submount 1354. This allows the heat to be less localized and allows it to more efficiently dissipate through the submount 1354.

The conversion material layer is included over the LED chip 1352, exposed portions of the pads 1364*a* and 1364*b*, and exposed portions of the submount's top surface. Many different conversion materials can be used to generate the desired LED package light emission, with the present invention being particularly adapted to LED packages emitting white light. In some white emitting embodiments, the LED chip 1352 can emit light in the blue wavelength spectrum. In other embodiments the LED can emit light in the violet to UV part of the spectrum for example in the wavelength range between 360 nm and 440 nm. The conversion material can be of the type that absorbs blue light and re-emits yellow light such that the package emits a white light combination of blue and yellow light.

Reconversion material and encapsulants are arranged and shaped to capitalize on the total internal reflection (TIR) of light within the package. That is, light incident on the package encapsulant at angles greater than the critical angle for TIR can be reflected back towards a conversion material within the package such that the light is converted or "recycled". This recycled light is scattered or converted and re-emitted from the conversion material omnidirectionally, such that some of the converted light will be redirected and will reach the surface of the encapsulant at an angle less than the critical angle and emit from the package.

Figure 99:
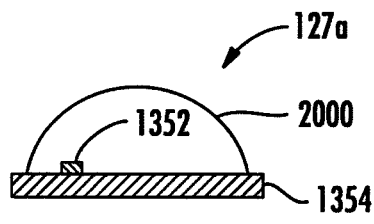
FIGS. 99-104 are section views of alternative embodiments of non-Lambertian LEDs.
Figure 100:
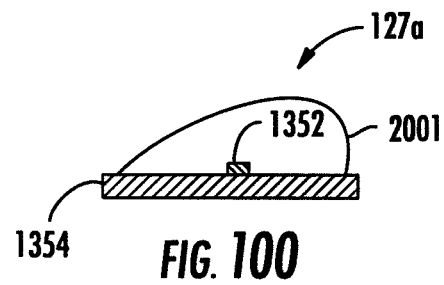
Figure 101:
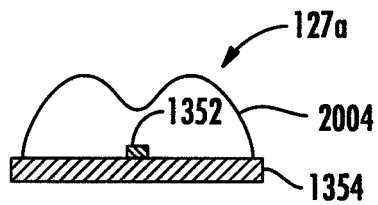
Figure 102:
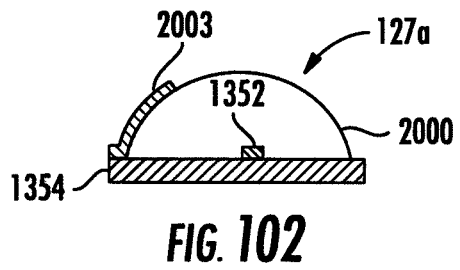
Figure 103:
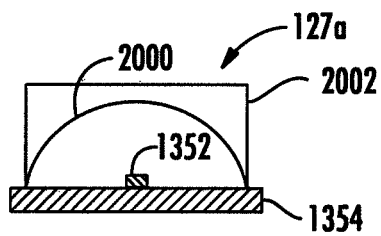
Figure 104:
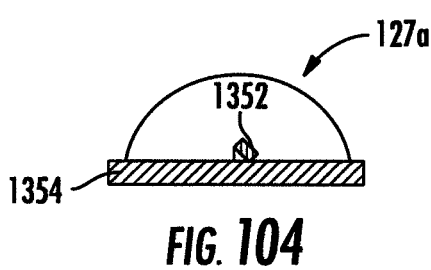
Figure 105:
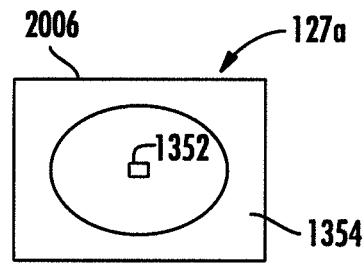
FIGS. 105 and 106 are top views of other alternative embodiments of non-Lambertian LEDs.
Figure 106:
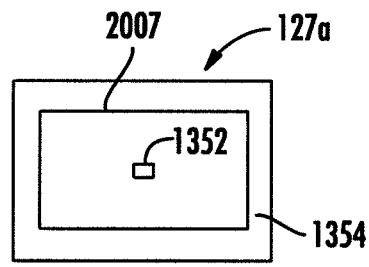

The scattering during recycling of the light can provide a broader emission profile. In most conventional LED packages the emission profile is generally Lambertian with most having a emission profile of approximately 120° FWHM (full width at half maximum) or less. In the present invention the LEDs emit light with a non-Lambertian profile. The cube lens described above provides an LED with a non-Lambertian profile; however, LEDs with a non-Lambertian profile may be provided in other ways. For example, the LED 127*a* may be provided where the LED chip or chips 1352 are positioned off-center or asymmetrically relative to the LED lens 2000 as shown in FIG. 99. In this and in other embodiments described herein the chip 1352 may be a single chip or a plurality of chips arranged in an array. The lens 2000 in such an LED may be cubed or domed. In other embodiments, the LED may comprise an asymmetric lens formed as a shaped lens 2004 (FIG. 101) or an asymmetric lens or optic 2001 (FIG. 100). The shaped or asymmetric lens may be a primary lens as shown in FIG. 100 or a secondary lens 2002 may be provided in addition to primary lens 2000 as shown in FIG. 103. In still other embodiments, a reflector 2003 may be positioned or shaped within or around the LED lens 2000 to create the non-Lambertian profile as shown in FIG. 102. One example of such a LED is disclosed in U.S. Pat. No. 7,891,835 issued on Feb. 22, 2011 to Wilcox and titled "Light Directing Apparatus with Protected Reflector-Shield and Lighting Fixture Utilizing Same" which is incorporated by reference herein in its entirety. In still other embodiments, the LED lens may comprise a diffuser or partial reflector positioned on top of the lens to create the non-Lambertian profile. In yet other embodiments, the LED chip 1352 may be mounted at an angle relative to the substrate 1354 and lens 2000 as shown in FIG. 104. In still other embodiments the lens may comprise an oval dome lens 2006 rather than a spherical dome lens as shown in FIG. 105. In other embodiments, the lens may comprise a rectilinear lens such as a rectangular lens 2007 as shown in FIG. 106. The non-Lambertian profile may be used to create a directional LED where the light intensity emitted by the LED is greater in one or more directions than it is in other directions. These light peaks may be used to direct light in a direction that is most beneficial for the desired light pattern of the lamp. The non-Lambertian profile may also be used to create LEDs with a wide emission or view profile. Embodiments of LEDs that emit light where the peak emission is asymmetric are disclosed in U.S. Patent Application Pub. No. 2012/0199852 to Lowes et al., titled "Light-emitting Diode Component" with a Pub. Date of Aug. 9, 2012 which is incorporated by reference herein in its entirety.

The scattering of light provided in the embodiments of the present invention provide more light emitting from the encapsulant at greater angles than would be experienced in a conventional Lambertian emission profile. In some embodiments, the emission profile can exceed 120 degrees FWHM, while in other embodiments it can exceed it can exceed 130 degrees FWHM. In still other embodiments the emission profile can be in the range of 130° to 170° FWHM, or 130° to 160° FWHM, or 130° to 150° FWHM. In other embodiments the emission profile can be greater than 135° FWHM, with less than 10% color variation of viewing angles at −90° to +90°.

Scattering materials may be added to the encapsulant to further increase the width of the emission profile and improve color uniformity with minimal impact on package efficiency. This wider emission profiles allows for the LED packages according to the present invention to be particularly applicable to lighting applications needing wider angles of emission.

The increase in light emission from the sides of the LEDs increases the amount of light directed toward and emitted from the free end of the lamp such that the light distribution of the lamp meets Energy Star requirements. In some embodiments, 20 CREE XQ 12 volt LEDs using DA500 or DA550 LED chips may be used (FIG. 96). In other embodiments, 10 CREE XBQ 24 volt LEDs using DA550 LED chips may be used. In other embodiments, 10 CREE XBQ 24 volt LEDs using DA500 LED chips may be used (FIGS. 94, 95, 97 and 98). Other LEDs may also be used in other numbers and combinations provided that the LEDs emit sufficient light laterally, parallel to the substrate.

Figure 89:
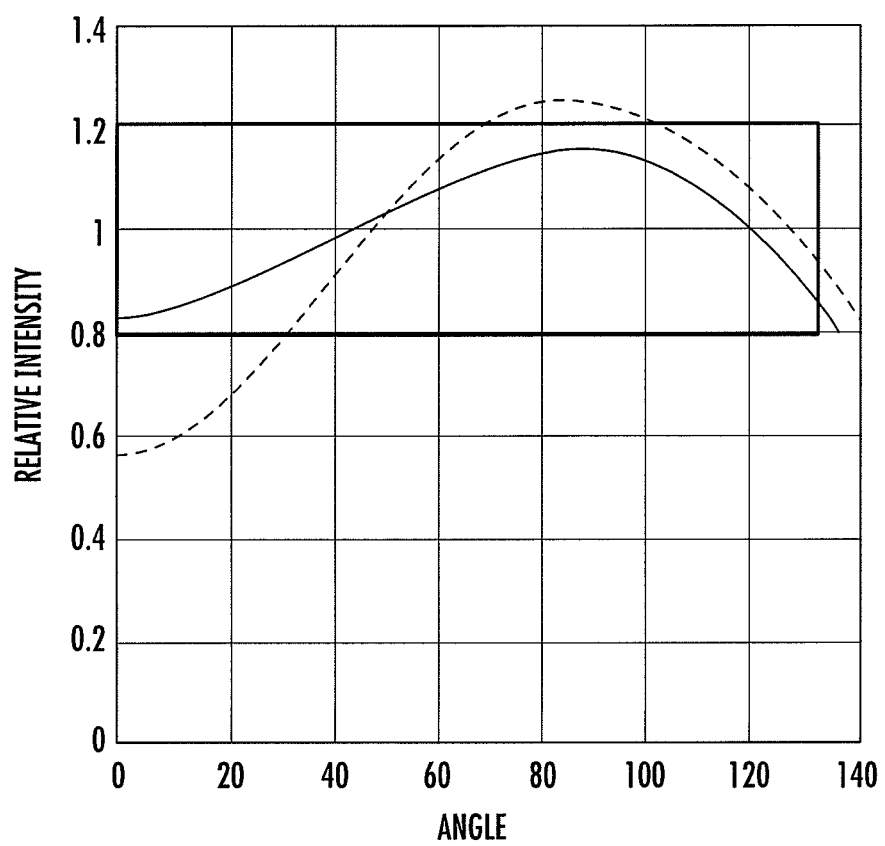
FIG. 89 is a graph illustrating the light distribution of an embodiment of the lamp of the invention.

Referring to FIG. 89, a graph useful in explaining the light distribution of the lamp of the invention is shown. The graph plots the viewing angle of the bulb on the x-axis against light intensity on the y-axis. The area bounded by the dark lined box represents the Energy Star specification such that a lamp having its light intensity distribution in the box is Energy Star compliant. The curve shown in dashed line represents the light intensity distribution of a lamp using laterally oriented LEDs that have a narrower viewing angle where relatively more light is generated perpendicularly to the substrate. In particular the distribution represents a lamp made with CREE XT LEDs. As shown, as the viewing angle approaches 0 (near the free end of the lamp) the light intensity falls below the lower limit of the Energy Star standard such that the lamp is too dark near the top end of the lamp to be Energy Star compliant. The curve shown in solid line represents the light intensity distribution of a lamp using laterally oriented LEDs with a wider viewing angle that generate more light parallel to the substrate. In the embodiment illustrated in FIG. 89 the distribution shows the light intensity distribution of a lamp using LEDs having an emission profile in the range of approximately 145-150 degrees FWHM or of approximately 150 degrees FWHM and, more specifically 147.8 degrees FWHM. In particular, the distribution represents a lamp made with CREE XQD LEDs. As shown, as the viewing angle approaches 0 (near the free end of the lamp) the light intensity remains above the lower limit of the Energy Star standard such that the lamp is Energy Star compliant. The use of LEDs that generate more lateral light also lowers the peak intensity near the 90 degree angle of the lamp.

LED packages suitable for use in the lamp of the invention may also be defined by the uniformity of the color emission at different viewing angles. In some embodiments, the LEDs emit light with variations in color temperature of less than −400 to +400 kelvin and viewing angles of approximately −100 to +100 degrees. In still other embodiments, the variations in color temperature can be less than −300 to +300 kelvin and viewing angles of approximately −100 to +100 degrees. In other embodiments, the variations over viewing angles are from −100 to +100 degrees and are generally in the range of −100 to +200 kelvin.

Figure 91:
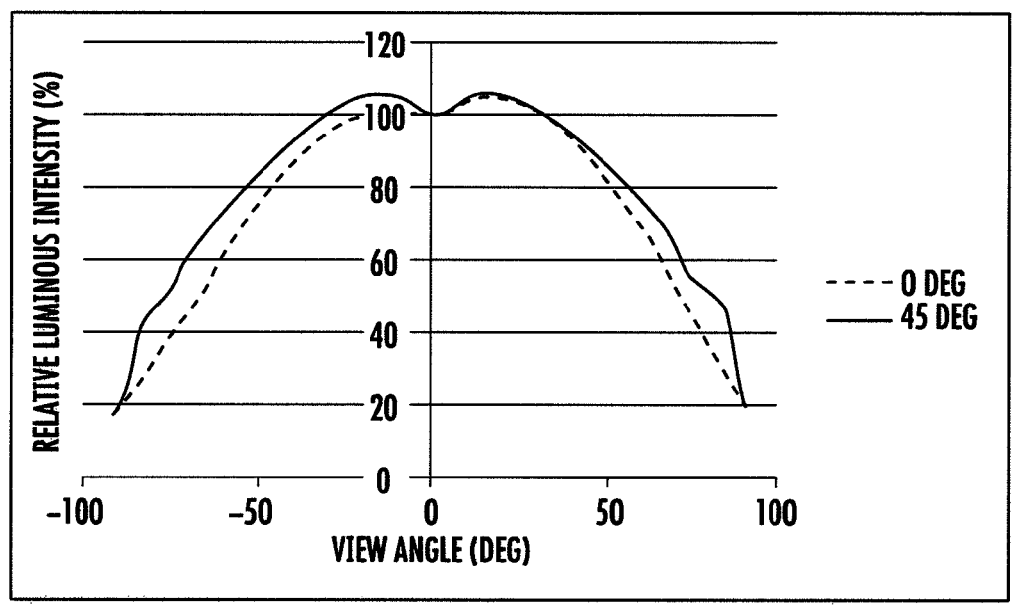
FIG. 91 is a graph showing the luminous intensity for a LED component usable in embodiments of the invention.

As shown in FIGS. 87 and 88 the LEDs 127*a* comprise side surfaces 1361 that extend substantially perpendicularly from the submount 1354 and meet at corners 1363. A top surface 1365 that is disposed substantially parallel to the submount 1354 connects the side surfaces. The arrangement of the side surfaces 1361 and top surface 1365 form a substantially cube shape. In some embodiments the light distribution of such a LED component has light peaks at the corners 1363 where the intensity of the light emitted from the chip is greatest at the corners 1363. Referring to FIG. 91 a Relative Luminous intensity graph is shown plotting the light intensity of LED component 127*a* at 0 degrees and 45 degrees. The graph shows the difference in special intensity distribution for a cube component along the middle of the component parallel to the flat side versus along the diagonal for the same cube component. The dashed line represents the intensity at 0 degrees and represents light exiting the chip substantially in a plane that is located at the approximate center of the sides 1361 across the component. The solid line represents the intensity at 45 degrees and represents light exiting the chip substantially in a plane that is along the diagonal of the chip from corner to corner. The light distribution along the 45 degree diagonal of the cube (solid line) is wider than along its 0 degree oriented line (dashed line). Additionally, the FWHM intensity difference is approximately 137 degrees at 0 degrees and is approximately 155 degrees at 45 degrees. Thus, more light is emitted along the diagonal of the chip and the light at the diagonal has a wider view angle.

Because the LEDs may be asymmetric where the light intensity may vary about the periphery of the LEDs as shown in FIG. 91, the LEDs 127*a* may be oriented in the lamp to take advantage of the light peaks. In the one embodiment of the lamp the LEDs 127*a* are oriented such that at least one light peak of the chip is oriented toward the free end of the lamp such that light emitted from the free end of the chip is increased. In other embodiments the chip may assume other orientations to achieve other light distributions. Because in the cube LEDs used in some embodiments of the lamp of the invention the light peaks occur at the corners of the LEDs 127*a*, the LEDs 127*a* are oriented on the substrate 129 such that at least one of the corners of the chips is oriented toward the free end of the lamp. In some embodiments all of the LEDs may be oriented in the same direction while in other embodiments some of the LEDs may be oriented in one direction and other ones of the chips may be oriented in a different direction depending upon the desired light distribution of the lamp.

Figure 94:
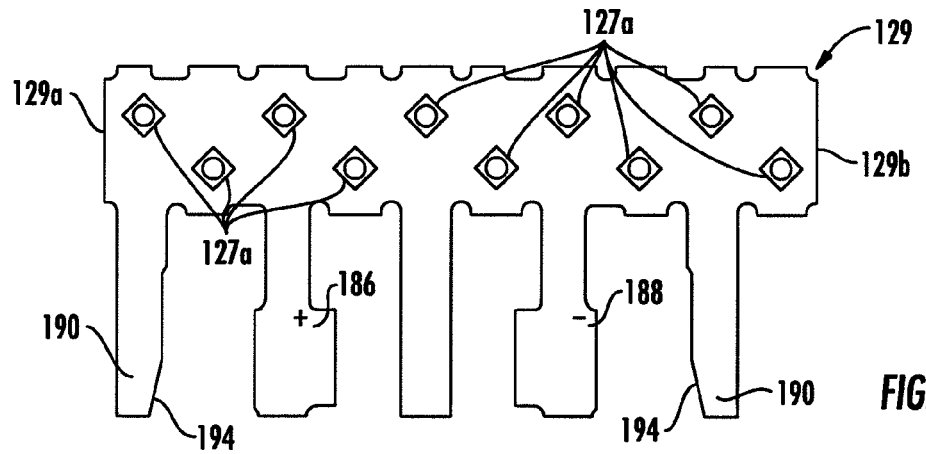
FIGS. 94-98 are side views of embodiments of a submount and LED assemblies usable in embodiments of the lamp of the invention.
Figure 95:
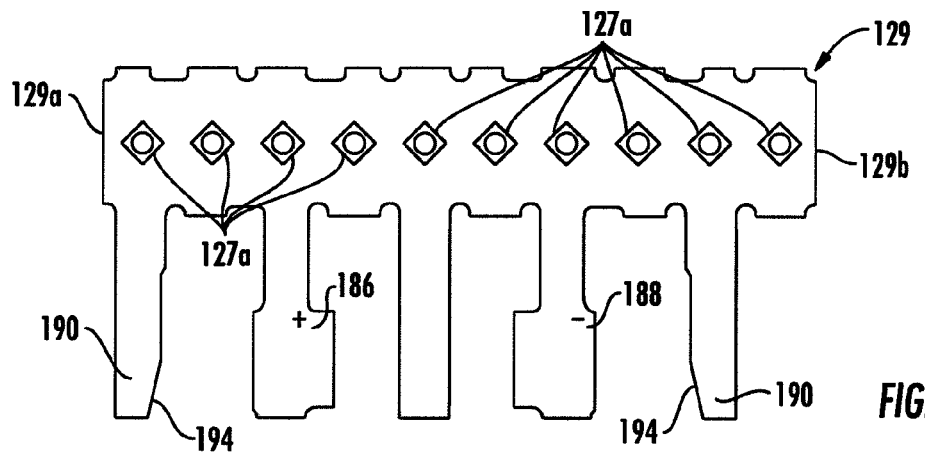
Figure 96:
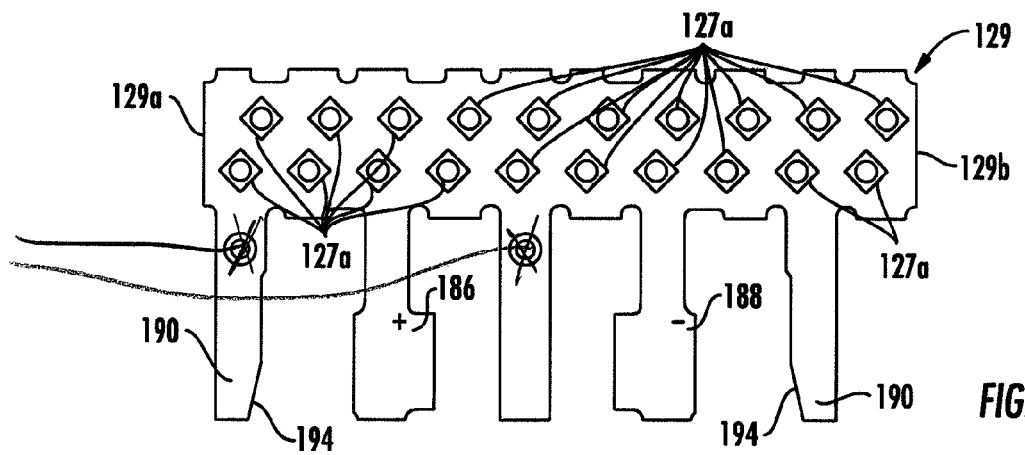
Figure 97:
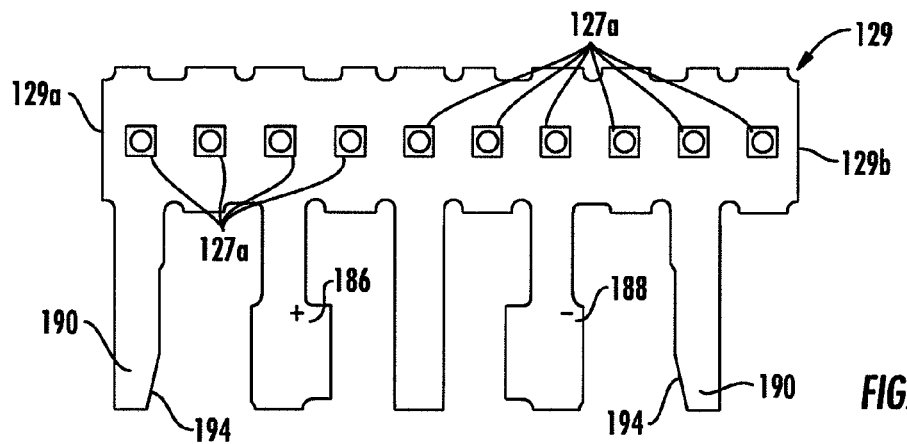
Figure 98:
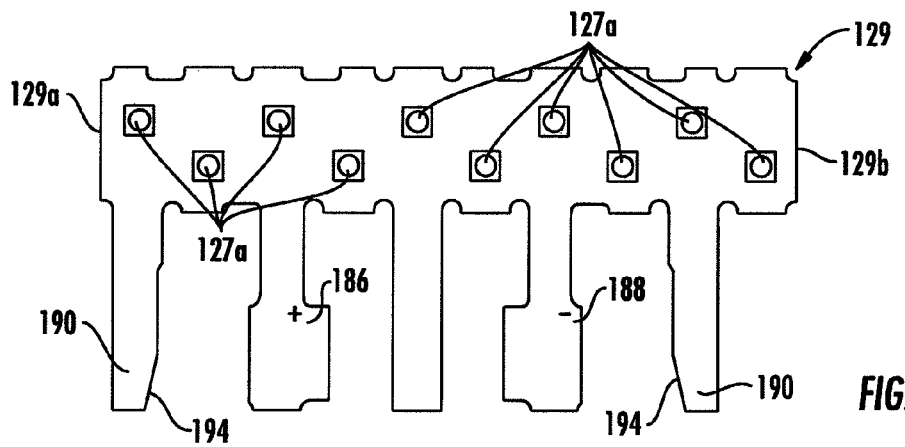

The LEDs 127*a* may be oriented as shown in FIGS. 94, 95 and 96 such that the LEDs 127*a* are oriented with a corner of each component facing toward the free end of the lamp. In some embodiments, the LEDs 127*a* are rotated 45 degrees relative to the longitudinal axis of the lamp such that a corner of the LEDs is facing the free end of the lamp. The LEDs may be oriented relative to the lamp at other than a 45 degree or 90 degree angle. In the embodiment of FIG. 94 two rows of LEDs 127*a* are provided on substrate 129 where each row comprises five LEDs 127*a*. In the embodiment of FIG. 95 a single row of LEDs 127*a* is provided on the substrate 129 where the row comprises ten LEDs 127*a*. In the embodiment of FIG. 96 two rows of LEDs 127*a* are provided on the substrate 129 where each row comprises ten LEDs 127*a*. The substrate 129 may be bent into a desired three-dimensional shape such as a cylinder as previously described. In both embodiments the corners of the LED chips are oriented to increase light emitted from the free end of the lamp such that the lamp complies with the Energy Star requirements. Other orientations may be used for other lamps and to obtain other light distribution patterns. FIG. 97 shows 10 LEDs in a single row oriented at 90 degrees and FIG. 98 shows 10 LEDs in two rows oriented at 90 degrees.

In the illustrated embodiment the peak light intensity of the LED chips is emitted at the corners 1363 such that the orientation of the LEDs is based on the direction the corners face in the lamp. In other asymmetric LEDs the peak light intensity may be emitted at a position on the chip other than at the corners. With such an LED the LEDs may be oriented in the lamp such that the peak intensity of the LED is directed toward the portion of the lamp where increased light output is desired. This arrangement allows the variations in light intensity at the LED level to be taken advantage of when engineering the light distribution of the lamp.

While the LEDs are shown in particular embodiments of a lamp, the LEDs may be used in any lamp where a greater amount of laterally emitted light may be beneficial. Moreover, while it has been explained that the lamp using laterally disposed, narrow view angle, LEDs may not meet Energy Star requirements, such LEDs may be disposed in a manner where the lamp meets Energy Star requirements. For example, as explained herein some or all of the LEDs may be angled relative to the longitudinal axis of the lamp to increase the amount of light emitted toward the free end of the lamp. Other mechanisms such as internal reflectors as described herein may also be used to generate a desired light emission pattern.

In one embodiment, the LED assembly 130 has a maximum outer dimension that fits into the open neck 115 of the enclosure 112 during the manufacturing process and an internal dimension that is at least as wide as the width or diameter of the heat conducting portion 152 of heat sink 149. In some embodiments the LED assembly 130 and heat sink 149 have a cylindrical shape such that the relative dimensions of the heat sink, LED assembly and the neck may be described as diameters. In one embodiment, the diameter of the LED assembly may be approximately 20 mm. In other embodiments some or all of these components may be other than cylindrical or round in cross-section. In such arrangements the major dimensions of these elements may have the dimensional relationships set forth above. In other embodiments, the LED assembly 130 can have different cross-sectional shapes, such as triangular, square and/or other polygonal shapes with or without curved surfaces.

The base 102 comprises an electrically conductive Edison screw 103 for connecting to an Edison socket and a housing portion 105 connected to the Edison screw. The Edison screw 103 may be connected to the housing portion 105 by adhesive, mechanical connector, welding, separate fasteners or the like. The housing portion 105 may comprise an electrically insulating material such as plastic. Further, the material of the housing portion 105 may comprise a thermally conductive material such that the housing portion 105 may form part of the heat sink structure for dissipating heat from the lamp 100. The housing portion 105 and the Edison screw 103 define an internal cavity for receiving the electronics 110 of the lamp including the power supply and/or drivers or a portion of the electronics for the lamp. The lamp electronics 110 are electrically coupled to the Edison screw 103 such that the electrical connection may be made from the Edison screw 103 to the lamp electronics 110. The base 102 may be potted to physically and electrically isolate and protect the lamp electronics 110. The lamp electronics 110 include a first contact pad 96 and a second contact pad 98 that allow the lamp electronics 110 to be electrically coupled to the LED assembly 130 in the lamp as will hereinafter be described. Contact pads 96 and 98 may be formed on printed circuit board 107 which includes the power supply, including large capacitor and EMI components that are across the input AC line along with the driver circuitry as described herein.

Any aspect or features of any of the embodiments described herein can be used with any feature or aspect of any other embodiments described herein or integrated together or implemented separately in single or multiple components. The steps described herein may be performed in an automated assembly line having rotary tables or other conveyances for moving the components between assembly stations.

In some embodiments, the submount 129 of the LED assembly 130 may comprise a lead frame made of an electrically conductive material such as copper, copper alloy, aluminum, steel, gold, silver, alloys of such metals, thermally conductive plastic or the like. In other embodiments, the submount comprises a PCB such as a metal core PCB as shown in FIGS. 19 and 20. In one embodiment, the exposed surfaces of the submount 129 may be coated with silver or other reflective material to reflect light inside of enclosure 112 during operation of the lamp. The submount may comprise a series of anodes and cathodes arranged in pairs for connection to the LEDs 127. In the illustrated embodiment 20 pairs of anodes and cathodes are shown for an LED assembly having 20 LEDs 127; however, a greater or fewer number of anode/cathode pairs and LEDs may be used. Moreover, more than one submount may be used to make a single LED assembly 130. For example, two submounts 129 may be used to make an LED assembly 130 having twice the number of LEDs as a single lead frame.

Connectors or conductors such as traces connect the anode from one pair to the cathode of the adjacent pair to provide the electrical path between the anode/cathode pairs during operation of the LED assembly 130. In a lead frame structure tie bars are also typically provided to hold the first portion of the lead frame to the second portion of the lead frame and to maintain the structural integrity of the lead frame during manufacture of the LED assembly 129. The tie bars are cut from the finished LED assembly and perform no function during operation of the LED assembly 130.

The submount 129 also comprises connector portion 153 that functions to couple the LED assembly 130 to the heat sink 149 such that heat may be dissipated from the LED assembly; to mechanically couple the LED assembly 130 to the heat sink 149; and to electrically couple the LED assembly 130 to the electrical path. The submount 129 may have a variety of shapes, sizes and configurations.

The lead frame may be formed by a stamping process and a plurality of lead frames may be formed in a single strip or sheet or the lead frames may be formed independently. In one method, the lead frame is formed as a flat member and is bent into a suitable three-dimensional shape such as a cylinder, sphere, polyhedra or the like to form LED assembly 130. Because the lead frame is made of thin bendable material, and the anodes and cathodes may be positioned on the lead frame in a wide variety of locations, and the number of LEDs may vary, the lead frame may be configured such that it may be bent into a wide variety of shapes and configurations.

An LED or LED package containing at least one LED 127 is secured to each anode and cathode pair where the LED/LED package spans the anode and cathode. The LEDs/LED packages may be attached to the submount by soldering. In a lead frame arrangement once the LEDs/LED packages are attached, the tie bars may be removed because the LED packages hold the first portion of the lead frame to the second portion of the lead frame.

In some embodiments of a lead frame submount, separate stiffeners or supports (not shown) may be provided to hold the lead frame together. The supports may comprise non-conductive material attached between the anode and cathode pairs to secure the lead frame together. The supports may comprise insert molded or injection molded plastic members that tie the anodes and cathodes together. The lead frame may be provided with pierced areas that receive the supports to provide holds that may be engaged by the supports. For example, the areas may comprise through holes that receive the plastic flow during a molding operation. The supports may also be molded or otherwise formed separately from the lead frame and attached to the lead frame in a separate assembly operation such as by using a snap-fit connection, adhesive, fasteners, a friction fit, a mechanical connection or the like. The plastic material extends through the pierced areas to both sides of the lead frame such that the plastic material bridges the components of the lead from to hold the components of the lead frame together after the tie bars are cut. The supports on the outer side of the lead frame (the term "outer" as used herein is the side of the lead frame to which the LEDs are attached) comprises a minimum amount of plastic material such that the outer surface of the lead frame is largely unobstructed by the plastic material. The plastic material should avoid the mounting areas for the LEDs such that the LEDs have an unobstructed area at which the LEDs may be attached to the lead frame. On the inner side of the lead frame (the term "inner" as used herein is the side of the lead frame opposite the side to which the LEDs are attached) the application of the plastic material may mirror the size and shape of the supports on the outer side; however, the supports on the inner side does need to be as limited such that the supports may comprise larger plastic areas and a greater area of the lead frame may be covered. The plastic material extends over larger areas of the inner side of the lead frame such that the plastic provides structural support for the lead frame.

Further, a first plastic overhang is provided on a first lateral end of the lead frame and a second plastic overhang is provided on a second lateral end of the lead frame. Because, in one embodiment the flat lead frame is bent to form a three-dimensional LED assembly, it may be necessary to electrically isolate the two ends of the lead frame from one another in the assembled LED assembly where the two ends have different potentials. The lead frame may be bent to form a cylindrical LED assembly where the lateral edges and of the lead frame are brought in close proximity relative to one another. The plastic overhangs are arranged such that the two edges of the lead frame are physically separated and electrically insulated from one another by the overhangs. The overhangs are provided along a portion of the two edges of the lead frame; however, the plastic insulating overhangs may extend over the entire free ends of the lead frame and the length and thickness of the overhangs depends upon the amount of insulation required for the particular application.

In addition to electrically insulating the edges of the lead frame, the plastic overhangs may be used to join the edges of the lead frame together in the three dimensional LED assembly. One of the overhangs may be provided with a first connector or connectors that mates with a second connector or connectors provided on the second overhang. The first connectors may comprise a male or female member and the second connectors may comprise a mating female or male member. Because the overhangs are made of plastic the connectors may comprise deformable members that create a snap-fit connection. The flat lead frame may be bent to have the generally cylindrical configuration as shown where the side edges are brought into close proximity to one another. The mating connectors formed on the first overhang and second overhang may be engaged with one another to hold the lead frame in the final configuration.

Figure 16:
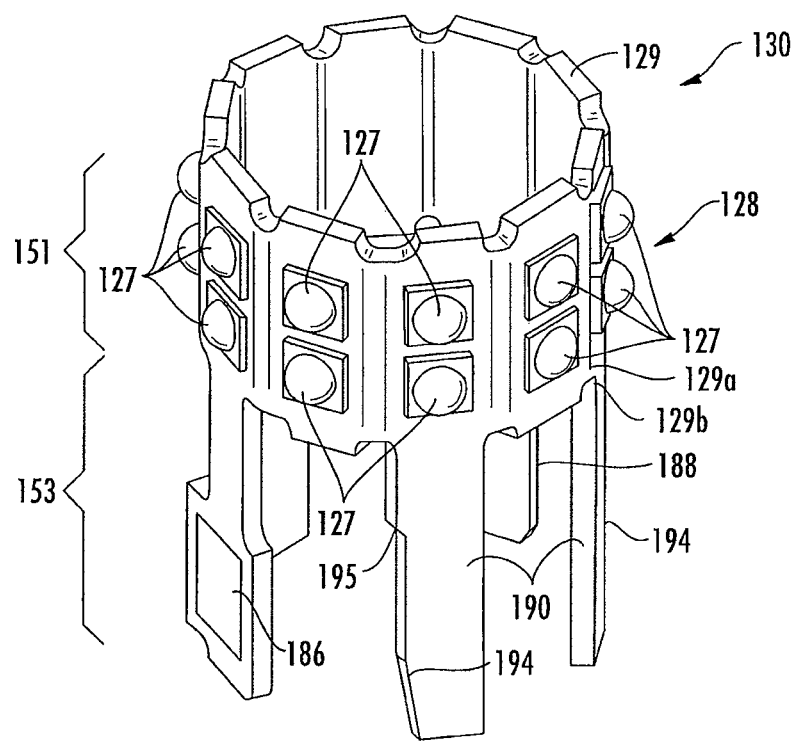
FIG. 16 is a perspective view of the LED assembly of FIG. 1.

In another embodiment of LED assembly 130 the submount 129 may comprise a metal core board such as a metal core printed circuit board (MCPCB) as shown, for example, in FIGS. 16, 19 and 20. The metal core board comprises a thermally and electrically conductive core made of aluminum or other similar pliable metal material. The core is covered by a dielectric material such as polyimide. Metal core boards allow traces to be formed therein. In one method, the core board is formed as a flat member and is bent into a suitable shape such as a cylinder, sphere, polyhedra or the like. Because the core board is made of thin bendable material and the anodes and cathodes may be positioned in a wide variety of locations, and the number of LED packages may vary, the metal core board may be configured such that it may be bent into a wide variety of shapes and configurations.

In one embodiment the core board is formed as a flat member having a first LED mounting portion 151 on which the LEDs/LED packages containing LEDs 127 are mounted. The first portion 151 may be divided into sections by thinned areas or score lines 151a. The LEDs/LED packages are located on the sections such that the core board may be bent along the score lines to form the planar core board into a variety of three-dimensional shapes where the shape is selected to project a desired light pattern from the lamp 100.

In another embodiment of the LED assembly 130 the submount 129 comprises a hybrid of a metal core board and lead frame. The metal core board forms the LED mounting portion 151 on which the LED packages containing LEDs 127 are mounted where the back side of the metal core board may be mechanically coupled to a lead frame structure. The lead frame structure forms the connector portion 153. Both the lead frame and the metal core board may be bent into the various configurations as discussed herein. The metal core board may be provided with score lines or reduced thickness areas to facilitate the bending of the core board. The LED assembly may also comprise a PCB made with FR4 and thermal vias rather than the metal core board where the thermal vias are then connected to the lead frame structure.

In another embodiment of LED assembly 130 the submount 129 may comprise an extruded submount which may be formed of aluminum or copper or other similar material. A flex circuit or board may be mounted on the extruded submount that supports LEDs 127. The extruded submount may comprise a variety of shapes such as previously described.

The submount 129 may be bent or folded such that the LEDs 127 provide the desired light pattern in lamp 100. In one embodiment the submount 129 is bent into a cylindrical shape as shown in the figures. The LEDs 127 are disposed about the axis of the cylinder such that light is projected outward. In a lead frame configuration, the lead frame may be bent at the connectors and in a metal core board configuration the core board may be bent at thinned score to form the three-dimensional LED assembly 130. The LEDs 127 may be arranged around the perimeter of the LED assembly to project light radially.

Because the submount 129 is pliable and the LED placement on the substrate may be varied, the submount may be formed and bent into a variety of configurations. For example one of the LEDs 127 may be angled toward the bottom of the LED assembly 130 and another of the LEDs 127 may be angled toward the top of the LED assembly 130 with the remaining LEDs projecting light radially from a cylindrical LED assembly 130. LEDs typically project light over less than 180 degrees such that tilting selected ones of the LEDs ensures that a portion of the light is projected toward the bottom and top of the lamp. Some LEDs project light through an angle of 120 degrees. By angling selected ones of the LEDs approximately 30 degrees relative to the axis of the LED assembly 130 the light projected from the cylindrical array will project light over 360 degrees. The angles of the LEDs and the number of LEDs may be varied to create a desired light pattern. For example, the figures show an embodiment of a two tiered LED assembly 130 where each tier comprises a series of a plurality of LEDs 127 arranged around the perimeter of the cylinder. While a two tiered LED assembly is shown the LED assembly may comprise one tier, three tiers or additional tiers of LEDs where each tier comprises a series of a plurality of LEDs 127 arranged around the perimeter of the cylinder. Selected ones of the LEDs may be angled with respect to the LED array to project a portion of the light along the axis of the cylindrical LED assembly toward the top and bottom of the LED assembly. The LED assembly may be shaped other than as a cylinder such as a polyhedron, a helix or double helix with two series of LED packages each arranged in series to form a helix shape. In the illustrated embodiments the submount is formed to have a generally cylindrical shape; however, the substrate may have a generally triangular cross-sectional shape, a hexagonal cross-sectional shape, or any polygonal shape or even more complex shapes.

The LED assembly 130, whether made of a lead frame submount, metal core board submount, a hybrid combination of metal core board/lead frame submount, a PCB made with FR4/lead frame submount or an extruded submount, may be formed to have any of the configurations shown and described herein or other suitable three-dimensional geometric shape. The LED assembly 130 may be advantageously bent or formed into any suitable three-dimensional shape. A "three-dimensional" LED assembly as used herein and as shown in the drawings means an LED assembly where the substrate comprises mounting surfaces for different ones of the LEDs that are in different planes such that the LEDs mounted on those mounting surfaces are also oriented in different planes. In some embodiments the planes are arranged such that the LEDs are disposed over a 360 degree range. The substrate may be bent from a flat configuration, where all of the LEDs are mounted in a single plane on a generally planar member, into a three-dimensional shape where different ones of the LEDs and LED mounting surfaces are in different planes.

Figure 107:
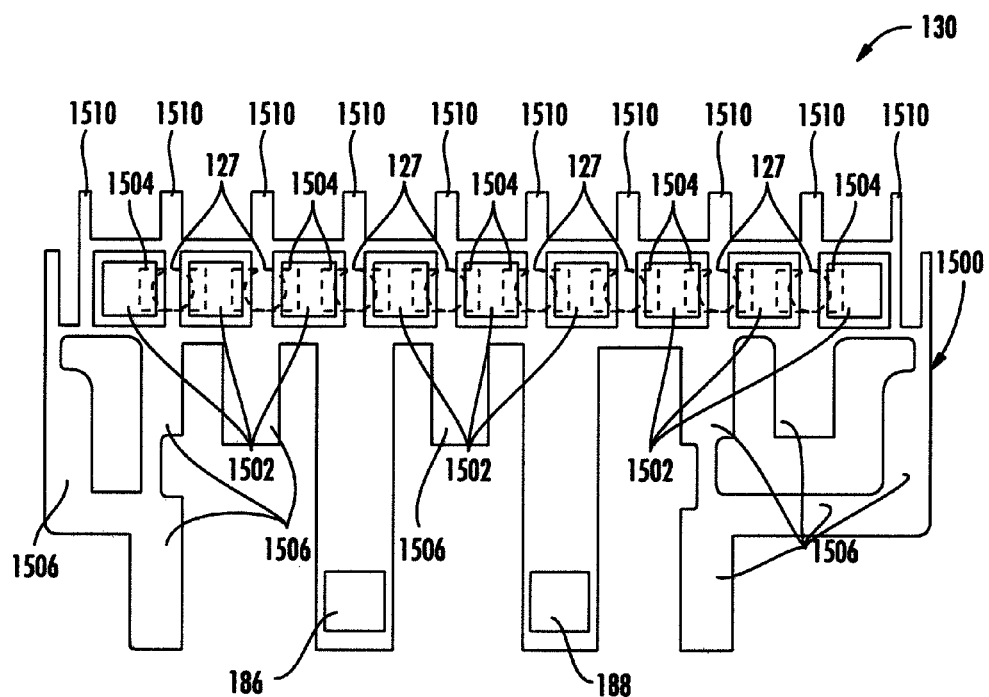
FIG. 107 is a plan view of an embodiment of a lead frame submount usable in the lamp of the invention.
Figure 108:
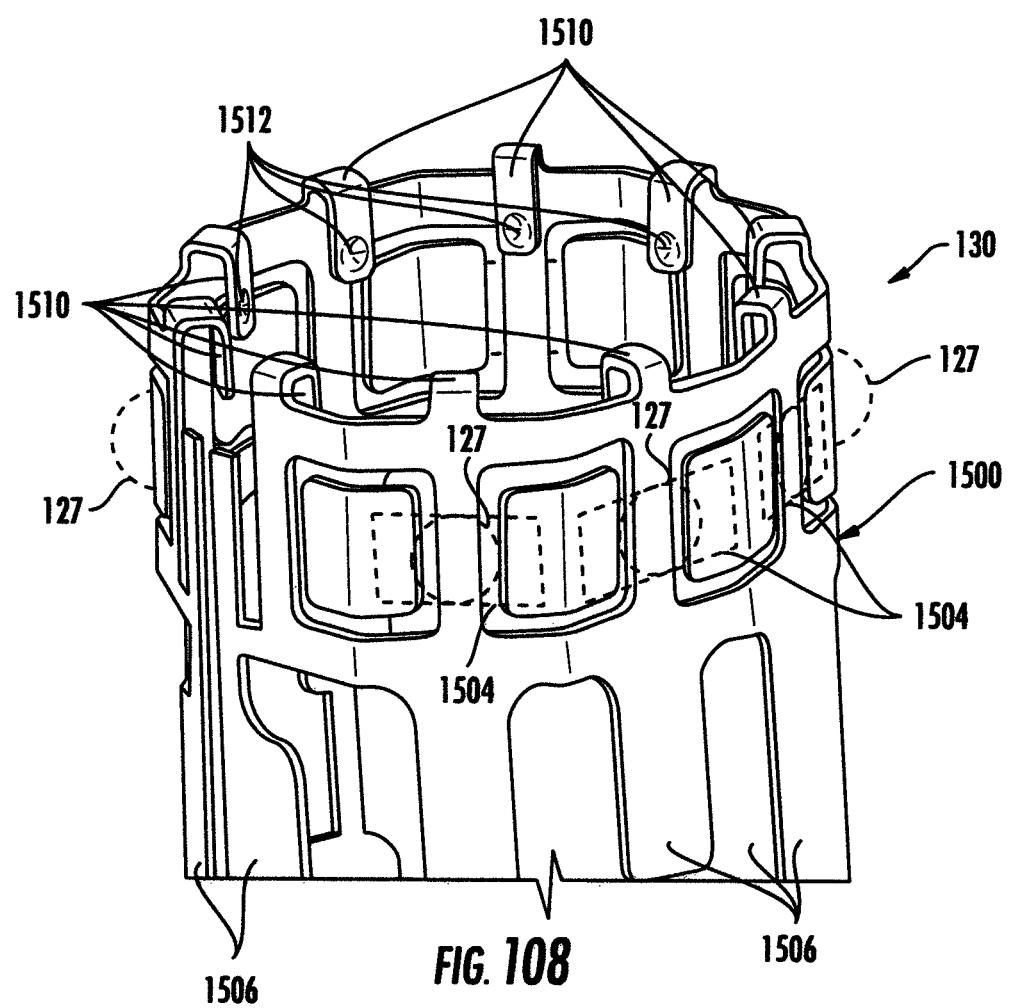
FIGS. 108, 109 and 110 are a detailed perspective views of the lead frame submount of FIG. 107 formed into a three-dimensional shape.
Figure 109:
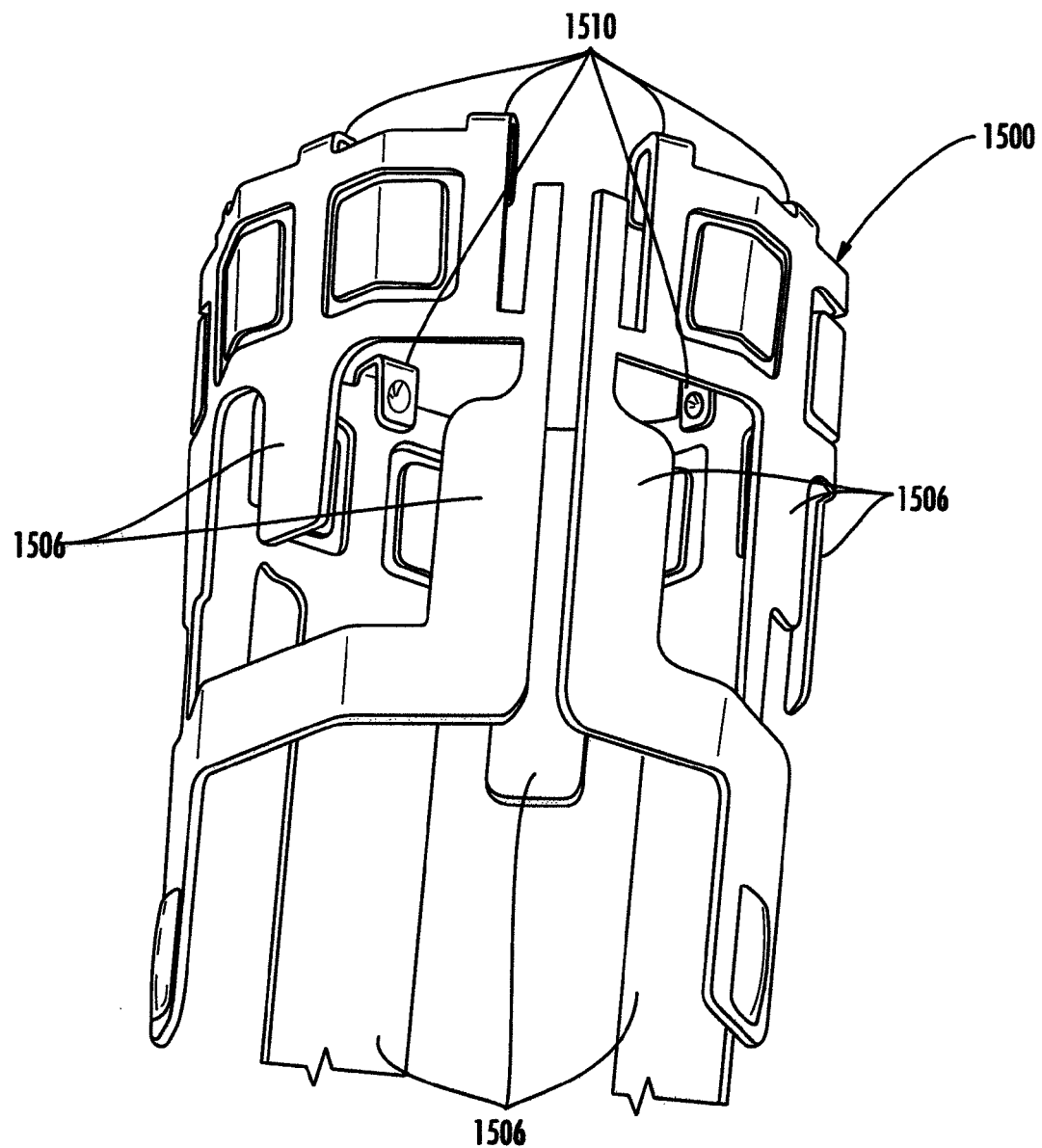
Figure 110:
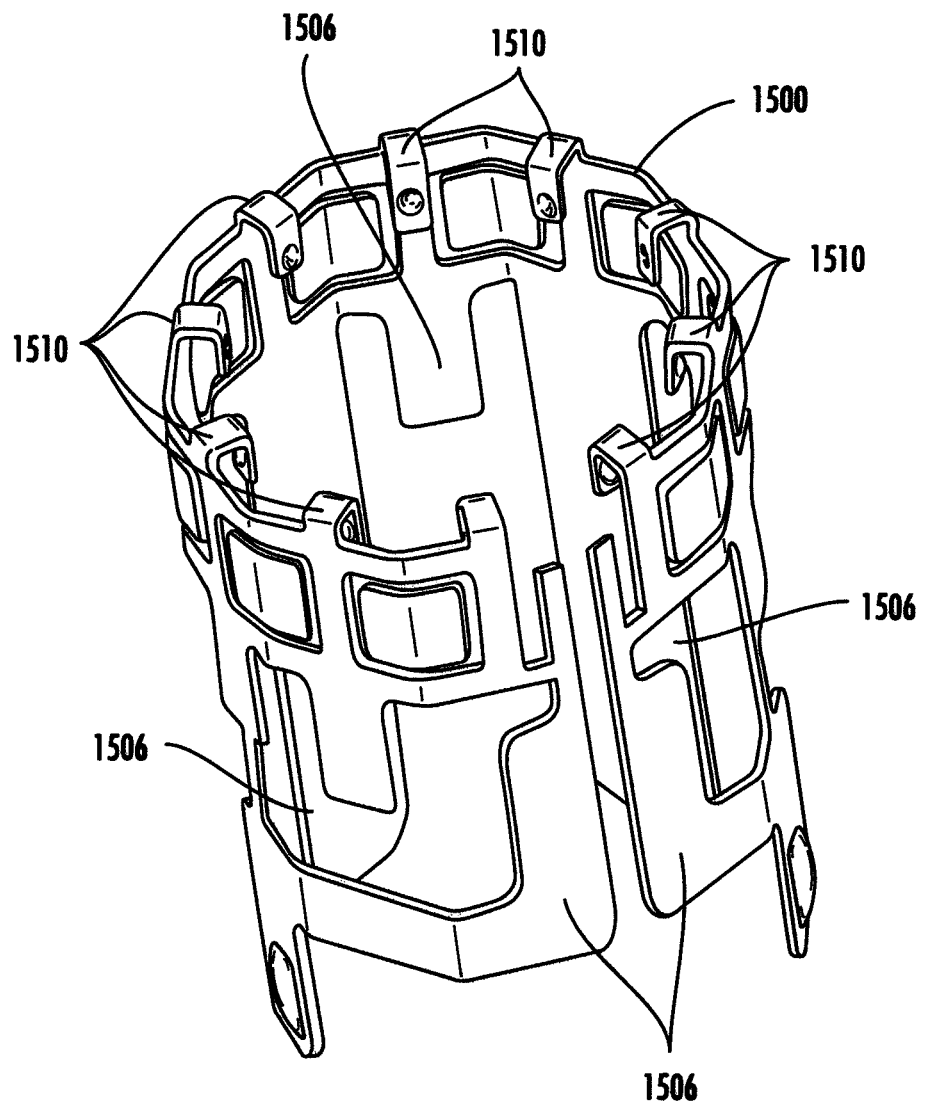

Referring to FIGS. 107-111, in some embodiments, the LED assembly 130 may comprise a lead frame 1500 as the submount where the lead frame 1500 is made of a conductive material that is formed into a circuit. The circuit may be formed by stamping a flat conductive material such as copper, tin plated cold rolled steel, aluminum, nickel silver or other electrically conductive material. The lead frame 1500 may be stamped from, for example, a copper foil or a thin gauge copper sheet. The LEDs 127 are populated on the lead frame 1500 and reflow soldered at solder joints 1504 to the electrical pads 1502 on the lead frame 1500. In FIGS. 107 and 108 the LEDs 127 and solder joints 1504 are shown in dashed lines to reveal the underlying LED structure. The circuit may be stamped with interconnecting tie bars to hold the lead frame together during assembly of the LED assembly 130. The tie bars may then be stamped out or otherwise removed from the lead frame 1502 leaving the LED solder joints 1504 to mechanically hold the lead frame circuit together as well as provide the electrical connections to the anode and cathode sides of the lead frame assembly. The LED assembly 130 may then be formed into the desired three-dimensional shape. In one embodiment, the lead frame 1500 is bent or otherwise formed into the cylindrical shape to tightly fit over the heat conducting tower 152 of the heat sink 149. The lead frame 1500 may be provided with electrical contacts 186, 188 to electrically couple the lead frame 1500 to the contacts 162, 164 as previously described. The lead frame 1500 may also comprise heat sink portions 1506 that are provided to increase heat transfer between the lead frame 1500 and the heat sink 149 but that may not be necessary to form the electrical circuit. The heat sink portions 1506 extend over the surface of the tower 152 to increase the surface area of the contact between the lead frame and the heat sink 149.

Figure 111:
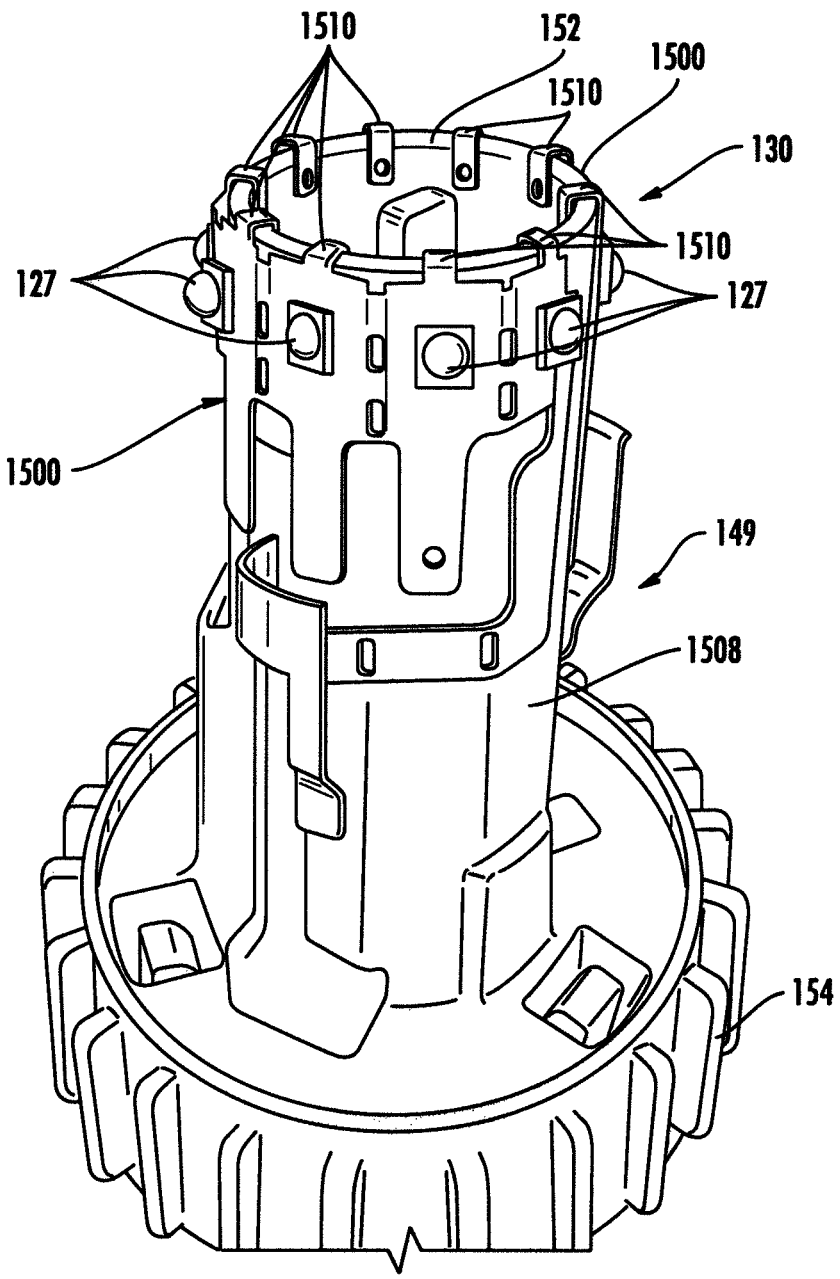
FIG. 111 is a perspective view of the lead frame of FIGS. 108-110 mounted on a heat sink usable in the lamp of the invention.

Referring to FIG. 111, to assemble the lead frame LED assembly 130 to the tower portion 152 of the heat sink 149 a layer of dielectric material 1508 is applied to the heat sink to electrically isolate the heat sink from the lead frame. The dielectric layer 1508 is thermally transmissive such that heat generated by the LED assembly 130 is conducted to the tower 152 such that it may be thermally dissipated from the lamp via the heat sink 149. The dielectric layer 1508 may comprise paint, dip coat, Kapton® film or other material capable of electrically insulating the tower from the lead frame. The exposed surfaces of the lead frame 1500 and heat sink 149 may be coated in white to increase the reflectivity of the components. The material of dielectric layer 1508 and the white coating may comprise the same layer of material or different layers of material.

The lead frame 130 may be mounted directly to the tower 152. The lead frame 1500 is dimensioned such that it engages the tower 152 in a tight fit such that the lead frame 1500 is retained on the tower 152 by the friction and mechanical engagement of the lead frame 1500 with the tower 152. In some embodiments, the lead frame 1500 is formed into a generally cylindrical shape where the interior circumference of the lead frame is slightly smaller than the exterior circumference of the tower 152 such that the lead frame 1500 is slightly deformed and expanded when positioned on the tower 152. The resiliency of the lead frame 1500 material creates a tight fit between the lead frame 1500 and tower 152 securing the lead frame to the tower. In some embodiments, the lead frame 1500 may be provided with camming fingers 190 that engage mating apertures on the tower to create a gripping force on the tower as previously described.

In some embodiments mechanical retainers may be formed on the lead frame 1500 and/or tower to increase the mechanical connection between these components. For example, the lead frame 1500 may be formed with flanges 1510 that are formed to extend over the top edge of the tower 152 and down the interior surface of the tower such that the wall of the tower is clamped between the retainer flanges 1510 and the lead frame circuit. Each retainer flange 1510 may be formed with a protrusion 1512 that enhances the mechanical engagement with the tower. In the illustrated embodiment the retainer flanges 1510 and protrusions 1512 may be formed during the stamping operation that forms the lead frame 1500. The retainers may also engage mating members formed on or as part of the tower 152. For example, the tower 152 may be formed with detents that receive the protrusions 1512. In some embodiments, adhesive may be used to secure the lead frame to the tower in addition to or in place of the friction fit/mechanical connection described above.

Figure 112:
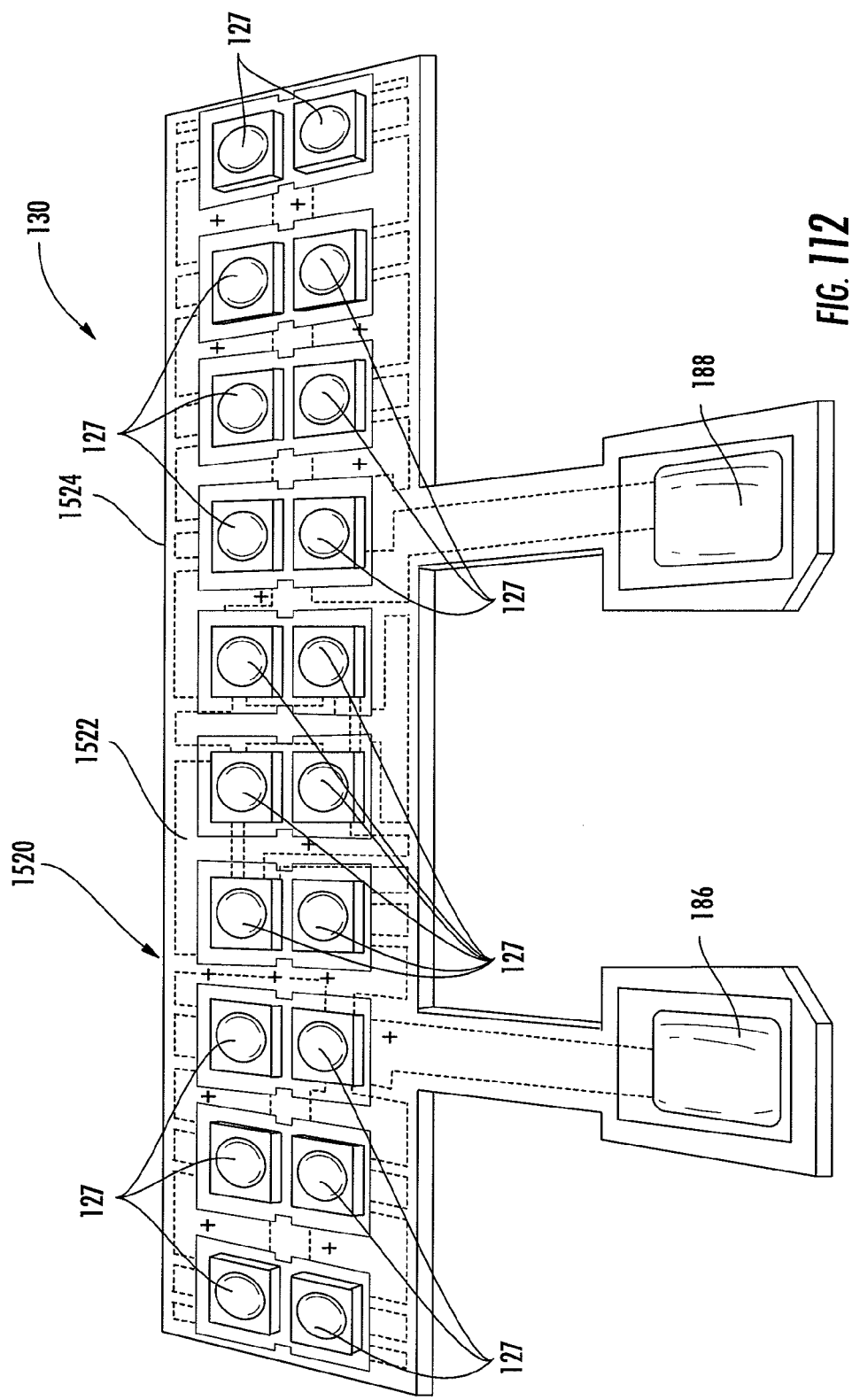
FIG. 112 is a plan view of an embodiment of a flex circuit submount usable in the lamp of the invention.

Referring to FIG. 112, in other embodiments, the LED assembly 130 comprises a flex circuit 1520 as the submount comprising a flexible conductive layer 1522 supported on a dielectric film 1524 such as a polyimide film. The flex circuit 1520 is populated with LEDs 127 and the LEDs may be reflow soldered to the conductive layer 1522. The LED solder joints 1524 provide the electrical connections to the anode and cathode sides of the flex circuit. A white cover layer may be added to increase the light reflectivity of the LED assembly.

Figure 113:
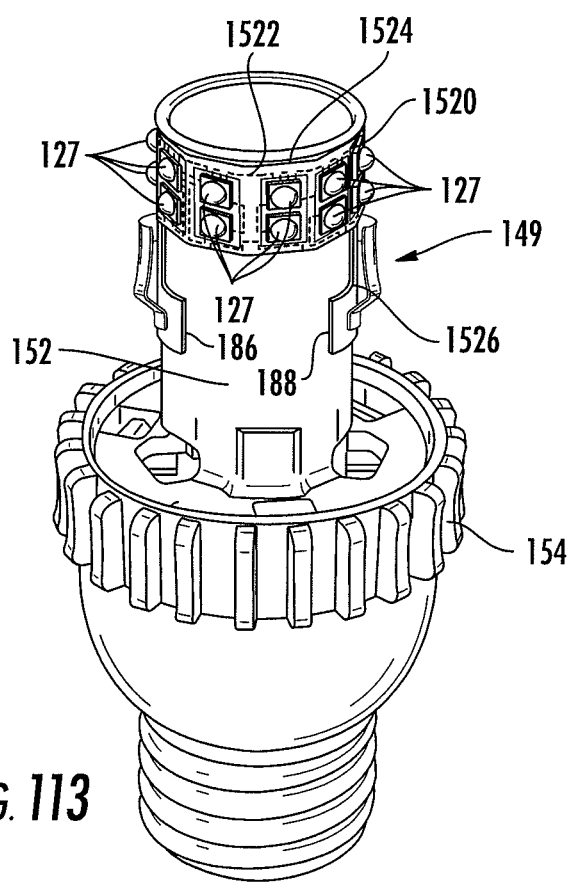
FIG. 113 is a perspective view of the flex circuit of FIG. 112 mounted on a heat sink usable in the lamp of the invention.
Figure 114:
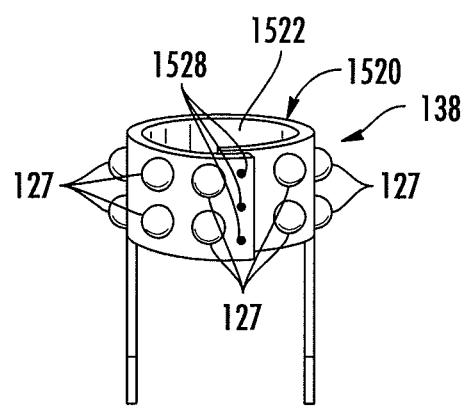
FIGS. 114 and 115 are perspective views showing alternate embodiments of a flex circuit submount usable in the lamp of the invention.
Figure 115:
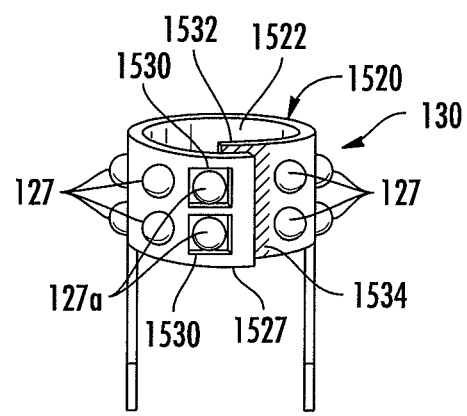

Referring to FIG. 113, the flex circuit 1520 is applied to the tower 152 of heat sink 148 by wrapping the flex circuit 1520 around the outer periphery of the tower 152. While a dielectric film 1522 of the flex circuit 1520 may be disposed between the conductive layer 1522 of the flex circuit 1520 and the tower, the thickness of the film 1522 is selected such that the film does not act as a thermal insulator between the LEDs 127 and the heat sink 149 such that heat may be transferred from the LEDs 127 to the heat sink through the film 1522 of the flex circuit 1520. An adhesive 1526 may be applied to secure the flex circuit 1520 to the tower. Additionally a mechanical connection may be provided to secure the flex circuit to the heat sink. For example, the polyimide of the flex circuit may overlap and be heat staked to one another as shown at 1528 in FIG. 114. The polyimide film may also overlap such that the LEDs at a first end of the flex circuit 1520 mechanically engage the overlapping opposite end of the flex circuit as shown in FIG. 115. For example, the first free end 1527 of the film 1522 may include an aperture or apertures 1530 that receives the LEDs 127*a* on the opposite second end 1532 of the flex circuit 1520. The first free end 1527 may be attached to the second end 1528 by adhesive 1534 or heat stakes 1528 n addition to the mechanical connection.

As previously mentioned, the submount in a lamp according to embodiments of the invention can optionally include the power supply or driver or some components for the power supply or driver for the LED array. In some embodiments, the LEDs can actually be powered by AC. Various methods and techniques can be used to increase the capacity and decrease the size of a power supply in order to allow the power supply for an LED lamp to be manufactured more cost-effectively, and/or to take up less space in order to be able to be built on a submount. For example, multiple LED chips used together can be configured to be powered with a relatively high voltage. Additionally, energy storage methods can be used in the driver design. For example, current from a current source can be coupled in series with the LEDs, a current control circuit and a capacitor to provide energy storage. A voltage control circuit can also be used. A current source circuit can be used together with a current limiter circuit configured to limit a current through the LEDs to less than the current produced by the current source circuit. In the latter case, the power supply can also include a rectifier circuit having an input coupled to an input of the current source circuit.

Some embodiments of the invention can include a multiple LED sets coupled in series. The power supply in such an embodiment can include a plurality of current diversion circuits, respective ones of which are coupled to respective nodes of the LED sets and configured to operate responsive to bias state transitions of respective ones of the LED sets. In some embodiments, a first one of the current diversion circuits is configured to conduct current via a first one of the LED sets and is configured to be turned off responsive to current through a second one of the LED sets. The first one of the current diversion circuits may be configured to conduct current responsive to a forward biasing of the first one of the LED sets and the second one of the current diversion circuit may be configured to conduct current responsive to a forward biasing of the second one of the LED sets.

In some of the embodiments described immediately above, the first one of the current diversion circuits is configured to turn off in response to a voltage at a node. For example a resistor may be coupled in series with the sets and the first one of the current diversion circuits may be configured to turn off in response to a voltage at a terminal of the resistor. In some embodiments, for example, the first one of the current diversion circuits may include a bipolar transistor providing a controllable current path between a node and a terminal of a power supply, and current through the resistor may vary an emitter bias of the bipolar transistor. In some such embodiments, each of the current diversion circuits may include a transistor providing a controllable current path between a node of the sets and a terminal of a power supply and a turn-off circuit coupled to a node and to a control terminal of the transistor and configured to control the current path responsive to a control input. A current through one of the LED sets may provide the control input. The transistor may include a bipolar transistor and the turn-off circuit may be configured to vary a base current of the bipolar transistor responsive to the control input.

With respect to the features described above with various example embodiments of a lamp, the features can be combined in various ways. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

LEDs and/or LED packages used with an embodiment of the invention and can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light. Such embodiments can produce light with a CRI of at least 70, at least 80, at least 90, or at least 95. By use of the term substantially white light, one could be referring to a chromaticity diagram including a blackbody 160 locus of points, where the point for the source falls within four, six or ten MacAdam ellipses of any point in the blackbody 160 locus of points.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Figure 12:
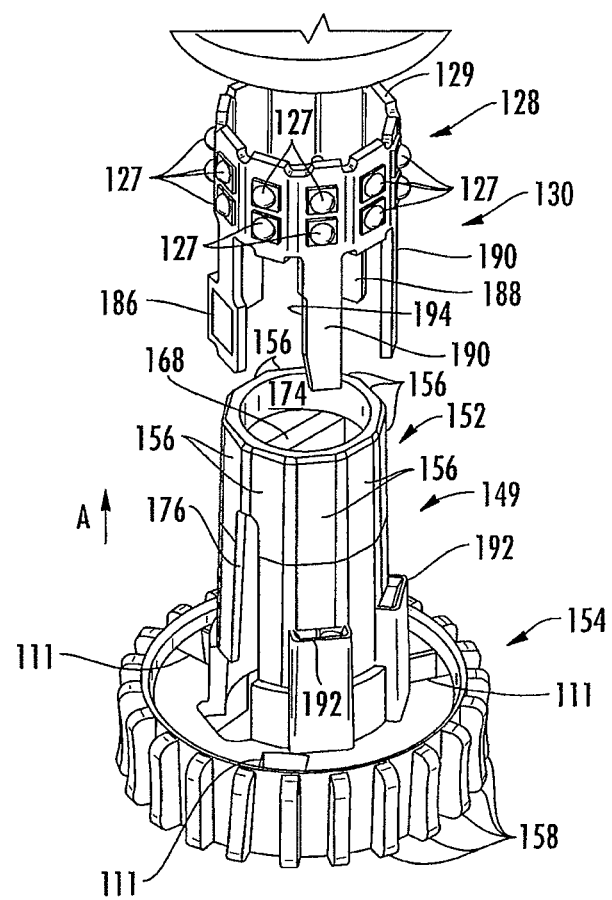
FIG. 12 is an exploded view showing an embodiment of the heat sink and LED assembly of FIG. 1.
Figure 13:
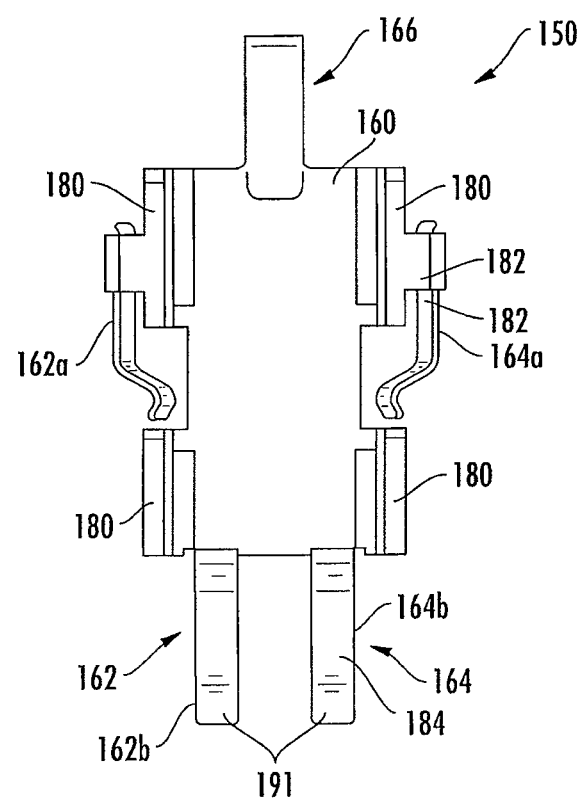
FIG. 13 is a plan view showing an embodiment of the electrical interconnect of FIG. 1.
Figure 14:
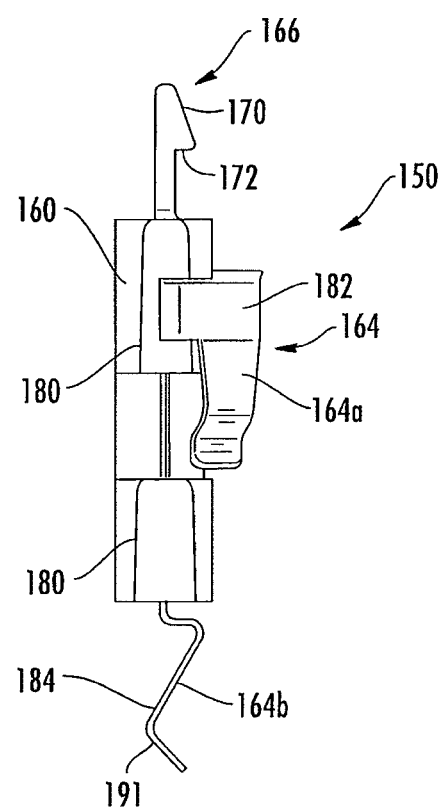
FIG. 14 is a side view showing an embodiment of the electrical interconnect of FIG. 1.
Figure 15:
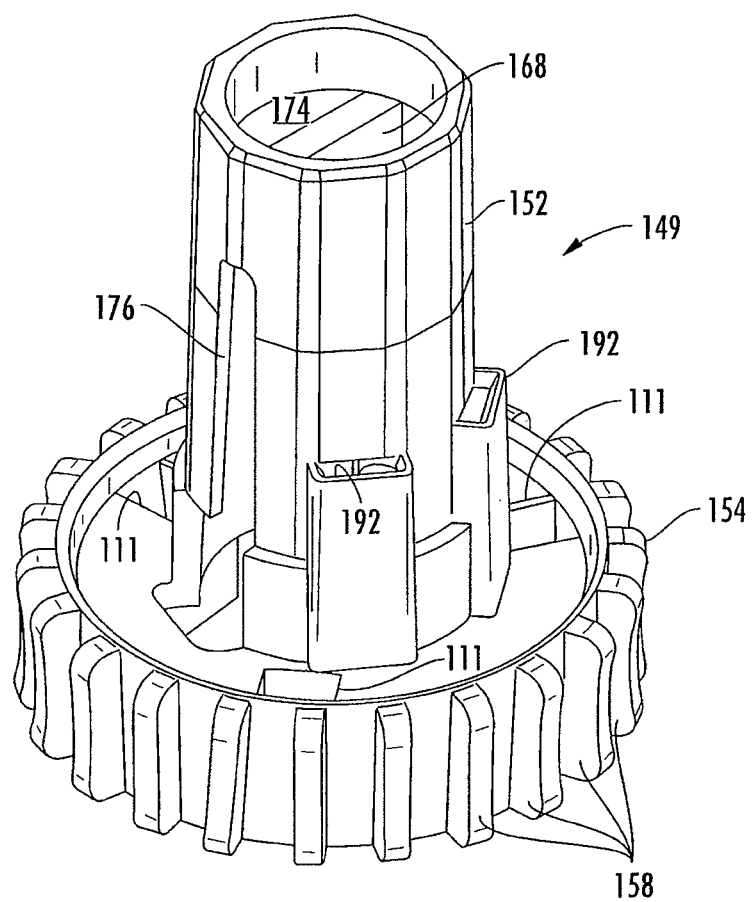
FIG. 15 is a perspective view of the heat sink of FIG. 1.

Referring again to the figures, the LED assembly 130 may be mounted to the heat sink structure 149 by an electrical interconnect 150 where the electrical interconnect 150 provides the electrical connection between the LED assembly 130 and the lamp electronics 110. The heat sink structure 149 comprises a heat conducting portion or tower 152 and a heat dissipating portion 154 as shown for example in FIGS. 12 and 15. In one embodiment the heat sink 149 is made as a one-piece member of a thermally conductive material such as aluminum. The heat sink structure 149 may also be made of multiple components secured together to form the heat structure. Moreover, the heat sink 149 may be made of any thermally conductive material or combinations of thermally conductive materials. In some embodiments the heat conducting portion 152 may be made of non-thermally conducting material such as plastic or portion 152 may be eliminated completely. In these embodiments, the LED assembly 130 may be directly coupled to the heat dissipating portion 154 without the use of a separate heat conducting portion. Extensions 190, as shown for example in FIG. 16, may be formed on the LED assembly that connect the LED assembly 130 to the heat dissipating portion 154 and that position and support the LEDs 127 in the proper position in the enclosure.

The heat conducting portion 152 is formed as a tower that is dimensioned and configured to make good thermal contact with the LED assembly 130 such that heat generated by the LED assembly 130 may be efficiently transferred to the heat sink 149. In one embodiment, the heat conducting portion 152 comprises a tower that extends along the longitudinal axis of the lamp and extends into the center of the enclosure. The heat conducting portion 152 may comprise generally cylindrical outer surface that matches the generally cylindrical internal surface of the LED assembly 130. In the illustrated embodiment the portions of the substrate 129 on which the LEDs 127 are mounted are generally planar. As a result, while the LED assembly 130 is generally cylindrical, the cylinder is comprised of a plurality of planar segments. In one embodiment the heat conducting portion 152 is formed with a plurality of planar facets 156 that abut the planar portions of the submount 129 to provide good surface to surface contact. While the LED assembly 130 and the heat conducting portion 152 are shown as being cylindrical these components may have any configuration provided good thermal conductivity is created between the LED assembly 130 and the heat conducting portion 152. As previously explained, the LED assembly 130 may be formed in a wide variety of shapes such that the heat conducting portion 152 may be formed in a corresponding mating shape. Further, while heat transfer may be most efficiently made by forming the heat conducting portion 152 and the LED assembly 130 with mating complimentary shapes, the shapes of these components may be different provided that sufficient heat is conducted away from the LED assembly 130 that the operation and/or life expectancy of the LEDs are not adversely affected.

The heat dissipating portion 154 is in good thermal contact with the heat conducting portion 152 such that heat conducted away from the LED assembly 130 by the heat conducting portion 152 may be efficiently dissipated from the lamp 100 by the heat dissipating portion 154. In one embodiment the heat conducting portion 152 and heat dissipating portion 154 are formed as one-piece. The heat dissipating portion 154 extends from the interior of the enclosure 112 to the exterior of the lamp 100 such that heat may be dissipated from the lamp to the ambient environment. In one embodiment the heat dissipating portion 154 is formed generally as a disk where the distal edge of the heat dissipating portion 154 extends outside of the lamp and forms an annular ring that sits on top of the open end of the base 102. A plurality of heat dissipating members 158 may be formed on the exposed portion to facilitate the heat transfer to the ambient environment. In one embodiment, the heat dissipating members 158 comprise a plurality fins that extend outwardly to increase the surface area of the heat dissipating portion 154. The heat dissipating portion 154 and fins 158 may have any suitable shape and configuration.

Different embodiments of the LED assembly and heat sink tower are possible. In various embodiments, the LED assembly may be relatively shorter, longer, wider or thinner than that shown in the illustrated embodiment. Moreover the LED assembly may engage the heat sink and electronics in a variety of manners. For example, the heat sink may only comprise the heat dissipating portion 154 and the heat conducting portion or tower 152 may be integrated with the LED assembly 130 such that the integrated heat sink portion and LED assembly engage the heat dissipating portion 154 at its base. In other embodiments, the LED assembly 130 may engage the heat conducting portion 152 of the heat sink 149 where the LED assembly does not include the connector portion 153. In some embodiments, the LED assembly and heat sink may be integrated into a single piece or be multiple pieces other than as specifically defined.

The electrical interconnect 150 provides the electrical conductors to connect the LED assembly 130 to the lamp electronics 110 and is shown in FIGS. 13, 14, 17 and 18. An inventive aspect of the LED lamp involves the interconnect 150 which provides improved manufacturability by providing an electrical connection between the LED assembly 130 and the drive electronics that does not require bonding of the contacts from the drive electronics to the LED assembly. In other embodiments, an electrical interconnect according to aspects of the present invention can be used to connect the AC line to the drive electronics or from portions of the power supply to other portions of the drive electronics depending on the embodiment and the positioning of the drive electronics on the LED assembly.

In some embodiments, the electrical interconnect includes a support and/or alignment arrangement or element which can be integral with or separate from the contacts. The support and/or alignment arrangement is configured to position the first and/or second set of contacts relative to the corresponding electrical contacts of the LED assembly with power supply, AC line or drive electronics depending on the embodiment. The electrical interconnect enables this connection to be made in an easy fashion to improve manufacturability by reducing the need for soldering of the electrical contacts. The electrical contacts of the interconnect can be configured to engage the corresponding electrical contacts in various ways to maintain a robust electrical connection in easier fashion. Such engagement can take various forms as would be understood by one of ordinary skill in the art with the benefit of this disclosure. As shown in the figures, the electrical interconnect 150 comprises a body 160 that includes a first conductor 162 for connecting to one of the anode or cathode side of the LED assembly 130 and a second conductor 164 for connecting to the other one of the anode or cathode side of the LED assembly 130. The first conductor 162 extends through the body 160 to form an LED-side contact 162a and a lamp electronics-side contact 162b. The second conductor 164 extends through the body 160 to form an LED-side contact 164a and a lamp electronics-side contact 164b. The body 160 may be formed by insert molding the conductors 162, 164 in a plastic insulator body 160. While the electrical interconnect 150 may be made by insert molding the body 160, the electrical interconnect 150 may be constructed in a variety of manners. For example, the body 160 may be made of two sections that are joined together to trap the conductors 162, 164 between the two body sections. Further, each conductor may be made of more than one component provided an electrical pathway is provided in the body 160.

A support and/or alignment mechanism is configured to position the first and/or second set of contacts relative to the corresponding electrical contacts of the LED assembly and power supply. The support and/or alignment mechanism may comprise a first engagement member 166 on body 160 that engages a mating second engagement member 168 on the heat sink 149. In one embodiment the first engagement member 166 comprises a deformable resilient finger that comprises a camming surface 170 and a lock member 172. The second engagement member 168 comprises a fixed member located in the internal cavity 174 of the heat sink 149. The electrical interconnect 150 may be inserted into the cavity 174 from the bottom of the heat sink 149 and moved toward the opposite end of the heat sink such that the camming surface 170 contacts the fixed member 168. The engagement of the camming surface 170 with the fixed member 168 deforms the finger 166 to allow the lock member 172 to move past the fixed member 168. As the lock member 172 passes the fixed member 168 the finger 166 returns toward its undeformed state such that the lock member 172 is disposed behind the fixed member 168. The engagement of the lock member 172 with the fixed member 168 fixes the electrical interconnect 150 in position in the heat sink 149. The snap-fit connection allows the electrical interconnect 150 to be inserted into and fixed in the heat sink 149 in a simple insertion operation without the need for any additional connection mechanisms, tools or assembly steps. While one embodiment of the snap-fit connection is shown, numerous changes may be made. For example, the deformable resilient member may be formed on the heat sink 149 and the fixed member 168 may be formed on the electrical interconnect 150. Moreover, both the first and the second engagement members may be deformable and more than one of each engagement member may be used. Further, rather than using a snap-fit connection, the electrical interconnect 150 may be fixed to the heat sink using other connection mechanisms such as a bayonet connection, screwthreads, friction fit or the like that also do not require additional connection mechanisms, tools or assembly steps.

The support and/or alignment arrangement may properly orient the electrical interconnect 150 in the heat sink 149 and provide a passage for the LED-side contacts 162a, 164a, and may comprise a first slot 176 and a second slot 178 formed in the heat conducting portion 152. The first slot 176 and the second slot 178 may be arranged opposite to one another and receive ears or tabs 180 that extend from the body 160. The tabs 180 are positioned in the slots 176, 178 such that as the electrical interconnect 150 is inserted into the heat sink 149, the tabs 180 engage the slots 176, 178 to guide the electrical interconnect 150 into the heat sink 149. The tabs 180 and slots 176, 178 may be formed with mating trapezoidal shapes such that as the tabs 180 are inserted into the slots 176, 178 the mating narrowing sides properly align the electrical interconnect 150 in the heat sink 149.

The first LED-side contact 162a and the second LED-side contact 164a are arranged such that the contacts extend through the first and second slots 176, 178, respectively, as the electrical interconnect 150 is inserted into the heat sink 149. The contacts 162a, 164a are exposed on the outside of the heat conducting portion 152. The contacts 162a, 164a are arranged such that they create an electrical connection to the anode side and the cathode side of the LED assembly 130 when the LED assembly 130 is mounted on the heat sink 149. In the illustrated embodiment the contacts are identical such that specific reference will be made to contact 164a. The contact 164a comprises a laterally extending portion 182 that extends from the body 160 and that extends through the slot 178. The laterally extending portion 182 connects to a spring portion 182 that is arranged such that it extends over the heat conducting portion 152 and abuts or is in close proximity to the outer surface of the heat conducting portion 152. The contact 164a is resilient such that it can be deformed to ensure a good electrical contact with the LED assembly 130 as will be described.

The first electronic-side contact 162b and the second electronic-side contact 164b are arranged such that the contacts 162b, 164b extend beyond the bottom of the heat sink 149 when the electrical interconnect 150 is inserted into the heat sink 149. The contacts 162b, 164b are arranged such that they create an electrical connection to the anode side and the cathode side of the lamp electronics 110. In the illustrated embodiment the contacts 162b, 164b are identical such that specific reference will be made to contact 164b. The contact 164b comprises a spring portion 184 that is arranged such that it extends generally away from the electrical interconnect 150. The contact 164b is resilient such that it can be deformed to ensure a good electrical contact with the lamp electronics 110 as will be described.

To mount the LED assembly 130 on the heat sink 149 the heat conducting portion 152 of heat sink 149 is inserted into the LED assembly 130 such that the LED assembly 130 surrounds and contacts the heat conducting portion 152. The LED assembly 130 comprises an anode side contact 186 and a cathode side contact 188. The contacts 186, 188 may be formed as part of the conductive submount 129 on which the LEDs are mounted. For example, the contacts 186, 188 may be formed as part of the PCB, lead frame or metal circuit board or other submount 129. The contacts 186, 188 are electrically coupled to the LEDs 127 such that they form part of the electrical path between the lamp electronics 110 and the LED assembly 130. The contacts 186, 188 extend from the LED mounting portion 151 such that when the LED assembly 130 is mounted on the heat sink 149 the contacts 186, 188 are disposed between the LED-side contacts 162a, 164a, respectively, and the heat sink 149. The LED-side contacts 162a, 164a are arranged such that as the contacts 186, 188 are inserted behind the LED-side contacts 162a, 164a, the LED-side contacts 162a, 164a are slightly deformed. Because the LED-side contacts 162a, 164a are resilient, a bias force is created that biases the LED-side contacts 162a, 164a into engagement with the LED assembly 130 contacts 186, 188 to ensure a good electrical coupling between the LED-side contacts 162a, 164a and the LED assembly 130. The engagement between the LED-side contacts of the electrical interconnect 150 and the and the anode side contact and the cathode side contact of the LED assembly 130 is referred to herein as a contact coupling where the electrical coupling is created by the contact under pressure between the contacts as distinguished from a soldered coupling.

To position the LED assembly 130 relative to the heat sink and to fix the LED assembly 130 to the heat sink, a pair of extensions 190 are provided on the LED assembly 130 that engage mating receptacles 192 formed on the heat sink. In one embodiment the extensions 190 comprise portions of the submount 129 that extend away from the LED mounting area 151 of the LED assembly 130. The extensions 190 extend toward the bottom of the heat sink 149 along the direction of insertion of the LED assembly 130 onto the heat sink. The heat sink 149 is formed with mating receptacles 192 that are dimensioned and arranged such that one of the extensions 190 is inserted into each of the receptacles 192 when the heat sink 149 is inserted into the LED assembly 130. The engagement of the extensions 190 and the receptacles 192 properly positions the LED assembly 130 relative to the heat sink during assembly of the lamp.

Moreover, to fix the LED assembly 130 on the heat sink 149 and to seat the LED assembly 130 against the heat conducting portion 152 to ensure good thermal conductivity between these elements, the extensions 190 are formed with camming surfaces 194 that engage the receptacles 192 and clamp the LED assembly 130 on the heat sink 149. As explained previously, in some embodiments the LED assembly 130 is formed of a submount 129 that is formed as a planar member (see FIGS. 19 and 20) and is then bent or formed into the final shape of the LED assembly 130. It will be appreciated that as the submount is formed into the three-dimensional shape, free ends of the submount 129 may be brought into close proximity to one another. For example, referring to FIG. 19, when the planar submount is bent into the three-dimensional cylindrical shape of FIG. 16, the free ends 129a, 129b of the submount 129 are brought closely adjacent to one another. In the mounting system of the invention, the engagement of the extensions 190 with the receptacles 192 is used to hold the LED assembly 130 in the desired shape and to clamp the LED assembly 130 on the heat sink. As shown in FIGS. 16 and 19, a surface of each of the extensions 190 is formed as a camming surface 194 where the camming surface 194 is created by arranging the surface 194 an angle relative to the insertion direction of the LED assembly 130 on the heat sink 149, or as a stepped surface, or as a curved surface or as a combination of such surfaces. As a result, as each extension 190 is inserted into the corresponding receptacle 192 the wall of the receptacle 192 engages the camming surface 194 and, due to the angle or shape of the camming surface 194, exerts a force on the LED assembly 130 tending to move one free end 129a of the LED assembly 130 toward the opposite free end 129b of the LED assembly 130. The extensions 190 are formed at or near the free ends of the LED assembly 130 and the camming surfaces 194 are arranged such that the free ends 129a, 129b of the LED assembly 130 are moved in opposite directions toward one another. As the free ends of the LED assembly 130 are moved toward one another, the inner circumference of the LED assembly 130 is gradually reduced such that the LED assembly 130 exerts an increasing clamping force on the heat conducting portion 152 as the LED assembly 130 is inserted on the heat sink 149. The camming surfaces 194 are arranged such that when the LED assembly 130 is completely seated on the heat sink 149 the LED assembly 130 exerts a tight clamping force on the heat conducting portion 152. The clamping force holds the LED assembly 130 on the heat sink 149 and ensures a tight surface-to-surface engagement between the LED assembly 130 and the heat sink 149 such that heat generated by the LED assembly 130 is efficiently transferred to the heat sink 149. The extensions 190 may be provided with a stop such as shoulder 195 that abuts the edge of the receptacles 192 to limit the insertion of the extensions 190 into the receptacles 192. The LED assembly 130 is held on the heat sink by the wedging action of the extensions 190 in the receptacles 192 as well as the clamping force exerted by the LED assembly 130 on the heat conducting portion 152. While a specific arrangement of the camming surfaces 194 and receptacles 192 is shown, the camming surfaces 194 may be formed on either or both of the heat sink 149 and LED assembly 130. The camming surfaces and the surfaces that are engaged by the camming surfaces may have a variety of structures and forms. Moreover, one free end of the substrate may be held stationary while the opposite end is moved toward the stationary end. While a generally cylindrical heat conducting portion 152 and LED assembly 130 are shown, these components may have a variety of shapes and sizes. The camming surfaces 194 may be arranged such that the LED assembly 130 is moved in a wide variety of planes and directions such that various surfaces of the LED assembly 130 may be brought into engagement with various surfaces of the heat sink 149.

When the electrical interconnect 150 is mounted to the heat sink 149 and the LED assembly 130 is mounted on the heat sink 149, an electrical path is created between the electronics-side contacts 162a, 164a of the electrical interconnect 150 and the LED assembly 130. These components are physically and electrically connected to one another and the electrical path is created without using any additional fasteners, connection devices, tools or additional assembly steps. The electrical interconnect 150 is simply inserted into the heat sink 149 and the heat sink 149 is simply inserted into the LED assembly 130.

Once the heat sink/LED assembly subcomponent is completed, the subcomponent may be attached to the base 102 as a unit. First engagement members on the base 102 may engage mating second engagement members on the heat sink structure 149. In one embodiment, the first engagement members comprise deformable resilient fingers 101 that comprise a camming surface 107 and a lock member 109. The second engagement member comprises apertures 111 formed in the heat sink 149 that are dimensioned to receive the fingers 101. In one embodiment, the housing 105 of the base 102 is provided with fingers 101 that extend from the base 102 toward the subcomponent. In the illustrated embodiment three fingers 101 are provided although a greater or fewer number of fingers may be provided. The fingers 101 may be made as one-piece with the housing 105. For example, the housing 105 and fingers 101 may be molded of plastic. The apertures 111 define fixed members 113 that may be engaged by the lock members 109 to lock the fingers 101 to the heat sink 149. The base 102 may be moved toward the bottom of the heat sink 149 such that fingers 101 are inserted into apertures 111 and the camming surfaces 107 of the fingers 101 contact the fixed members 113. The engagement of the fixed members 113 with the camming surfaces 107 deforms the fingers 101 to allow the locking members 109 to move past the fixed members 113. As the lock members 109 pass the fixed members 113 the fingers 101 return toward their undeformed state such that the lock members 109 are disposed behind the fixed members 113. The engagement of the lock members 109 with the fixed members 113 fixes the base 102 to the heat sink 149.

Figure 11:
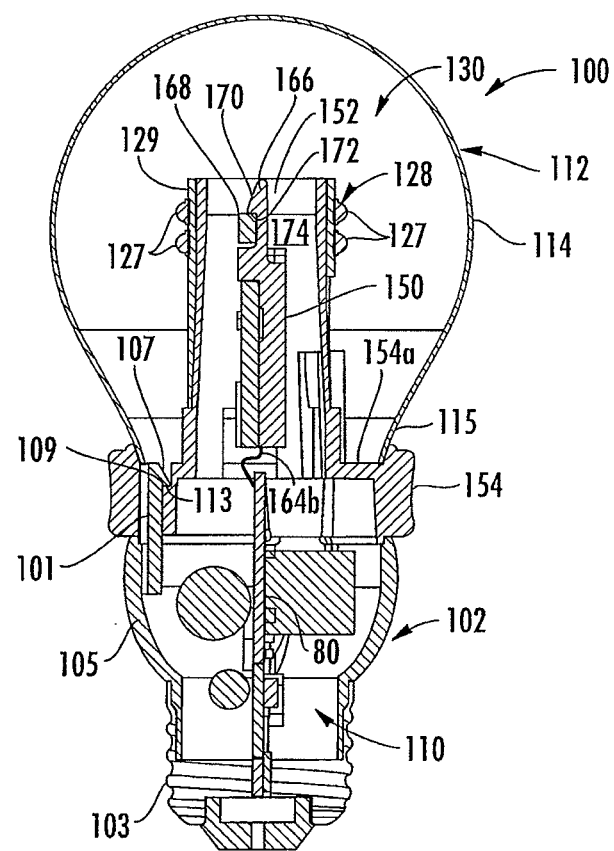
FIG. 11 is a section view similar to FIG. 4.

The snap-fit connection allows the base 102 to be fixed to the heat sink 149 in a simple insertion operation without the need for any additional connection mechanisms, tools or assembly steps. While one embodiment of the snap-fit connection is shown numerous changes may be made. For example, the deformable members such as fingers may be formed on the heat sink 149 and the fixed members such as apertures may be formed on the base 102. Moreover, both engagement members may be deformable. Further, rather than using a snap-fit connection, the electrical interconnect 150 may be fixed to the heat sink using other connection mechanisms such as a bayonet connection, screwthreads, friction fit or the like. The fixed members 113 may be recessed below the upper surface of the heat dissipation portion 154 such that when the lock members 109 are engaged with the fixed members 113 the fingers 101 do not extend above the plane of the upper surface 154a of the heat dissipating portion 154 as best shown in FIG. 11.

As the base 102 is brought into engagement with the heat sink 149, electronic-side contacts 162b, 164b are inserted into the base 102. The lamp electronics 110 are provided with contact pads 96, 98 that are arranged such that when the base 102 is assembled to the heat sink 149, the electronic-side contacts 162b, 164b are in electrical contact with the pads 96, 98 to complete the electrical path between the base 102 and the LED assembly 130. The pads 96, 98 are disposed such that the electronic-side contacts 162b, 164b are deformed slightly such that the resiliency of the contacts exerts a biasing force that presses the contacts into engagement with the pads to ensure a good electrical connection. The electronic-side contacts 162b, 164b may be formed with angled distal ends 191 that act as camming surfaces to deform the contacts during assembly of the base to the heat sink. The camming surfaces may be arranged to contact a surface in the base, such as the PCB board 80, to deform the contacts upon insertion. The engagement between the electronics-side contacts of the electrical interconnect 150 and the pads on the lamp electronics is referred to herein as a contact coupling where the electrical coupling is created by the contact under pressure between the contacts and the pads as distinguished from a soldered coupling The enclosure 112 may be attached to the heat sink 149. In one embodiment, the LED assembly 130 and the heat conducting portion 152 are inserted into the enclosure 112 through the neck 115. The neck 115 and heat sink dissipation portion 154 are dimensioned and configured such that the rim of the enclosure 112 sits on the upper surface 154a of the heat dissipation portion 154 with the heat dissipation portion 154 disposed at least partially outside of the enclosure 112, between the enclosure 112 and the base 102. To secure these components together a bead of adhesive may be applied to the upper surface 154a of the heat dissipation portion 154. The rim of the enclosure 112 may be brought into contact with the bead of adhesive to secure the enclosure 112 to the heat sink 149 and complete the lamp assembly. In addition to securing the enclosure 112 to the heat sink 149 the adhesive is deposited over the snap-fit connection formed by fingers 101 and apertures 111. The adhesive flows into the snap fit connection to permanently secure the heat sink to the base.

Figure 17:
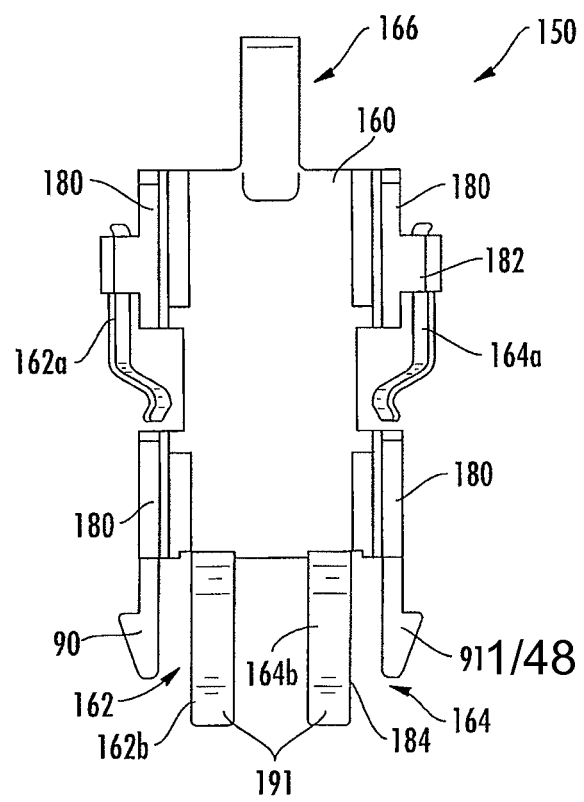
FIG. 17 is a plan view showing another embodiment of the electrical interconnect.

In the illustrated embodiment, the electrical interconnect 150 is used to secure the electrical conductors 162, 164 in the heat sink 149 and to make the electrical connection between the LED assembly 130 and the conductors to thereby complete the electrical path between the LED assembly 130 and the lamp electronics 110. In other embodiments, the electrical interconnect 150 may also be used to effectuate the mechanical connection between the heat sink 149 and the base 102. For example, as shown in FIG. 17, engagement members 90, 91 may extend from the bottom of the body 160 of the electrical interconnect 150 toward the base 102. The engagement members 90, 91 may take the form of the resilient fingers as previously described. Mating engagement members on the base 102, such as receptacles having a fixed member formed on housing 105 (not shown), may be engaged by the engagement members 90, 91 to provide a snap-fit connection between the base 102 and the heat sink/LED assembly subcomponent. In such an arrangement the electrical interconnect 150 functions to complete the electrical path between the LED assembly 130 and the base 102 and to provide the mechanical connection between the base 102 and the heat sink/LED assembly subcomponent.

Figure 18:
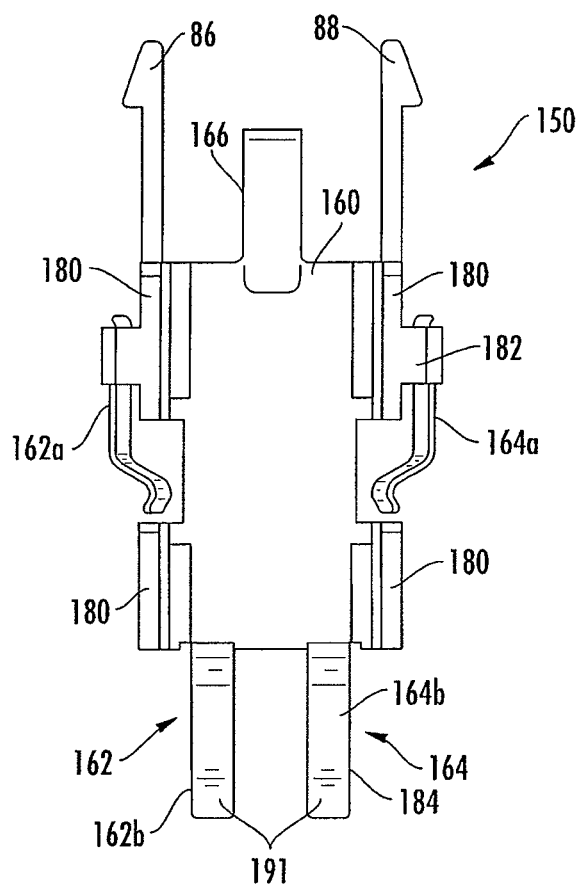
FIG. 18 is a plan view showing still another embodiment of the electrical interconnect.

In other embodiments, the electrical interconnect 150 may also be used to effectuate the mechanical connection between the LED assembly 130 and the heat sink 149. For example, as shown in FIG. 18, the electrical interconnect 150 may be provided with secondary engagement members 86, 88 that engage mating engagement members on the LED assembly 130. The secondary engagement members 86, 88 may take the form of the resilient fingers as previously described. The secondary engagement members 86, 88 may engage the submount 129 directly such as by engaging the top edge of the submount. Alternatively, the LED assembly 130 may be provided with mating engagement members. For example, fixed members having engagement surfaces may be molded or otherwise formed on the submount 129 such as during the molding of the supports as previously described. In such an embodiment the electrical interconnect 150 functions to form the mechanical connection between the LED assembly 130 and the heat sink 149.

It is to be understood that the electrical interconnect 150 may be used to provide one or all of the functions described herein. Moreover, the electrical interconnect 150 may be used to provide various combinations of the functions described herein.

In some embodiments the form factor of the lamp is configured to fit within the existing standard for a lamp such as the A19 ANSI standard. Moreover, in some embodiments the size, shape and form of the LED lamp may be similar to the size, shape and form of traditional incandescent bulbs. Users have become accustomed to incandescent bulbs having particular shapes and sizes such that lamps that do not conform to traditional forms may not be as commercially acceptable. The LED lamp of the invention is designed to provide desired performance characteristics while having the size, shape and form of a traditional incandescent bulb.

In the lamp of the invention, the LEDs 127 are arranged at or near the optical center of the enclosure 112 in order to efficiently transmit the lumen output of the LED assembly through the enclosure 112. The most efficient transmission of light through a transparent or semitransparent surface is when the light incident to the surface is normal to the surface. For example, if the enclosure is a perfect sphere, an omnidirectional light source located at the center of the sphere provides the most efficient transmission of light through the enclosure because the light is normal to the surface of the enclosure at all points on the sphere's surface. In the lamp of the invention the LEDs 127 are arranged at or near the optical center of the enclosure 112 to maximize the amount of light that is normal to the surface of enclosure 112. While all of the light emitted from LEDs 127 is not normal to the enclosure 112, with the LED assembly positioned at or near the optical center of the enclosure more of the light is normal to the enclosure than in solid state lamps where the light source is located near the base of the enclosure or is otherwise located such that a large portion of the light is incident on the enclosure at other than right angles. By facing the LEDs 127 outwardly, the LEDs emit light in a generally hemispherical pattern that maximizes the amount of light that is normal to the enclosure 112. Thus, the arrangement of the outwardly facing LEDs at or near the optical center of the enclosure, as shown in the figures, provides efficient transmission of the light through the enclosure 112 to increase the overall efficiency of the lamp.

A second mechanism used in the lamp of the invention to increase the overall efficiency of the lamp is the use of a boost converter topology power supply to minimize losses and maximize conversion efficiency. Examples of boost topologies are described in U.S. patent application Ser. No. 13/462,388, entitled "Driver Circuits for Dimmable Solid State Lighting Apparatus", filed on May 2, 2012 which is incorporated by reference herein in its entirety; and U.S. patent application Ser. No. 13/662,618, entitled "Driving Circuits for Solid-State Lighting Apparatus with High Voltage LED Components and Related Methods", filed on Oct. 29, 2012 which is incorporated by reference herein in its entirety. With boost technology there is a relatively small power loss when converting from AC to DC. For example, boost technology may be approximately 92% efficient while other power converting technology, such as Bud technology, may be approximately 85% efficient. Using a less efficient conversion technology decreases the efficiency of the system such that significant losses occur in the form of heat. The increase in heat must be dissipated from the lamp because heat adversely affects the performance characteristics of the LEDs. The increase in efficiency using boost technology maximizes power to the LEDs while minimizing heat generated as loss. As a result, use of boost topology, or other highly efficient topology, provides an increase in the overall efficiency of the lamp and a decrease in the heat generated by the power supply.

In one embodiment of the invention as shown and described herein, 20 LEDs are provided where each LED comprises four LED chips. Each chip may be a 3 volt LED chip such that each LED is a 12 volt part. Using 20 LEDs provides an LED assembly of approximately 240 volts. Such an arrangement provides a lamp having an output comparable to a 60 Watt incandescent bulb. The use of 20 LEDs each comprising 4 LED chips provides a LED light source having a relatively large epitaxial (EPI) or light producing area where each LED may be operated at relatively low current. In one embodiment described herein each LED chip may comprise a DA600 chip sold by CREE Inc., where each chip is a square 600 micron chip having an EPI area of approximately 0.36 mm$^2$ such that each LED having 4 LED chips has approximately 1.44 mm$^2$ of EPI area. A system such as described herein with 20 LEDs has approximately 28.8 mm$^2$ of EPI area.

Generally speaking, in a typical LED the greater the operating current of the LEDs the higher the lumen output of the LED. As a result, in a typical LED lamp the LEDs are operated in the area of about 350 mA/(mm$^2$ of EPI area) in order to maximize the lumen output per square mm of EPI area. While operating the LEDs at high current increases the lumen output it also decreases the efficiency (lumens per watt) of the LEDs such that significant losses occur in the form of heat. For example, the efficiency of one typical LED is greatest in the 60-90 mA/(mm$^2$ of EPI area) and gradually decreases as the mA/(mm$^2$ of EPI area) increases. The increase in heat due to the lowering of efficiency must then be dissipated from the lamp because heat adversely affects the performance characteristics of the LEDs. The present invention uses the generally inverse relationship between efficiency and lumen output to provide lumen output at a desired level in a more efficient (i.e. less heat loss per lumen) lamp. While the relationship between efficiency and lumen output is described as generally inverse it is noted that efficiency also decreases at low current per unit area of EPI such that decreasing current below the high efficiency range provides an LED that is both less efficient and produces fewer lumens per unit area of EPI. Thus, it is desired to operate the LEDs in the area of greatest efficiency while providing a desired lumen output using a relatively large EPI area. The large EPI area may be provided using a plurality of LEDs that together provide the desired large EPI area.

Using a large EPI area LED assembly operating at a relatively low current decreases the lumen output per unit of EPI area but increases the efficiency of the LEDs such that less heat is generated per lumen output. The lower lumen output per unit of EPI area is offset by using a larger EPI area such that the lumen output of the lamp is increased per unit of heat generated by the system. In one embodiment, an LED assembly having approximately 28.8 mm$^2$ of EPI area is used where the LEDs are operated at approximately 107 mA/(mm$^2$ of EPI area) to provide the equivalent lumens as a 60 Watt incandescent light bulb. To provide the equivalent lumens as a 60 Watt incandescent light bulb an LED assembly having an EPI area of between 15 and 40 mm$^2$ may be used where the LEDs are operated in the range of 200 and 75 mA/(mm$^2$ of EPI area). The larger the EPI area the smaller the operating current such that an LED assembly having 40 mm$^2$ of EPI area is operated at 75 mA/(mm$^2$ of EPI area) and a LED assembly having 15 mm$^2$ of EPI area is operated at 200 mA/(mm$^2$ of EPI area). Other operating parameters for an LED assembly for a 60 watt equivalent lamp are 10 mm$^2$ of EPI area operated at 300 mA/(mm$^2$ of EPI area) and a LED assembly having 20 mm$^2$ of EPI area operated at 150 mA/(mm$^2$ of EPI area). For lamps having lumen output equivalent to other than a 60 watt bulb, such as a 40 watt bulb or a 100 watt bulb these values may be scaled accordingly. While the scaling is not strictly linear the scaling up or down in equivalent wattage is approximately linear. The term large EPI area as used herein means a light producing area of sufficient size to produce the desired lumen output when the LEDs are operated at a current at or near the highest efficiency area on the amperage to lumen per Watt curve for the LED. The desired lumen output can be achieved by increasing and/or decreasing current to the LEDs while simultaneously decreasing and/or increasing the EPI area. The relationship between these variables depends on the amount of heat that may be adequately dissipated from the lamp using a relatively small heat sink and the amount of EPI area (e.g. the number of LEDs) that may be supported in the lamp. The size of the heat sink is selected such that the heat sink does not affect the outward design of the lamp such that the lamp has the same general size, shape and appearance as a traditional incandescent bulb. The size of the EPI area and the mA per unit of EPI area may then be selected to generate heat that is less than the amount of heat that can be adequately dissipated by the heat sink.

As a result, the lamp of the invention generates the desired lumen output while generating significantly less heat than in existing lamps by using the LEDs located at the optical center of the enclosure, boost conversion technology and efficient EPI area to mA/(mm$^2$ of EPI area) as described above. Because of the efficiencies engineered into the lamp, the heat generated by the system is lower compared to existing LED lamps of similar lumen output such that a relatively small heat sink may be used. Because the heat sink may be made smaller than in known LED lamps the form factor of the lamp may follow the form factor of traditional incandescent bulbs. In one embodiment, the lamp 100 is configured to be a replacement for an ANSI standard A19 bulb such that the dimensions of the lamp 100 fall within the ANSI standards for an A19 bulb. The dimensions may be different for other ANSI standards including, but not limited to, A21 and A23 standards. In some embodiments, the LED lamp 100 may be equivalent to standard watt incandescent light bulbs such as, but not limited to, 40 Watt or 60 Watt bulbs. The use of a smaller heat sink allows greater freedom in the design of the physical shape, size and configuration of the lamp such that the lamp may be configured to have a variety of shapes and sizes. Referring to FIG. 1 for example, the heat sink intrudes to a minimal degree on the external form of the lamp such that the lamp may be designed and configured to closely match the size and shape of a standard incandescent bulb such as an A19 bulb. Moreover, because a relatively small heat sink may be used it may be possible to provide sufficient heat dissipation using a thermally conductive base 102 without the intervening heat sink structure 154. In some embodiments of an equivalent 60 watt and 75 watt lamp (total bulb power between 9 and 11 watts), a heat sink having an exposed surface area in the range of range of approximately 20-40 square centimeters is sufficient and may be considered small. In one embodiment for a 60 watt lamp the heat sink may have an exposed surface area of about 30 square centimeters. For 100 W applications (or 75 W applications where higher optical losses are incurred such as in directional lamps with a total bulb power greater than 11 watts but less than 17 watts) the exposed surface area of the heat sink is in the range of range of approximately 40-80 square centimeters. In one embodiment for a 100 watt lamp the heat sink may have an exposed surface area of about 60 square centimeters.

LEDs are thermally responsive light producers where, as the LED gets hotter, the lumens produced by the LED decreases. Because the lamp of the invention uses a relatively large EPI area to more efficiently generate large lumen outputs, the size of the heat sink may be reduced such that the loss of lumen output due to the heating of the LEDs may be designed into the system. In such an arrangement, the LEDs are not cooled to the extent required in existing devices and the heat sink may be correspondingly reduced in size. For example, in one of the most efficient types of commercially available lamps, a troffer lamp, the large heat sink allows the LEDs to operate at about a 4% loss of lumens due to heat. In a typical bulb configuration the loss of lumens due to heat is engineered to be as small as possible and may be on the order of less than 10%. In order to provide such a low "roll off" or loss of lumens due to heat build-up the typical LED lamp requires a relatively large heat sink structure. The lamp of the invention is designed such that the roll off or loss of lumens due to heat build-up may be between approximately 15% and 20%. Such a loss would normally be considered excessive; however, because of the use of a large EPI area and the other efficiencies built into the system as discussed above, the LED lamp of the invention can afford a larger lumen roll off at the LEDs and still provide a lamp that provides the desired lumen output at the system level. In the system of the invention the LEDs are operated at a junction temperature (the temperature at the junction between the LED chip and the package) of between approximately 110° and 120°. Because the LEDs are allowed to operate at a relatively high junction temperature the heat sink may be made smaller and less intrusive when compared to existing LED lamps. As explained above, the ability to use a smaller heat sink structure allows the heat sink to be a smaller and less obtrusive component of the overall lamp allowing the lamp to be configured to be of similar size and shape to a standard incandescent bulb as shown in the figures.

FIGS. 21-26 show an embodiment of a lamp that uses the LED assembly 130, heat sink with the tower arrangement 149, and electrical interconnect 150 as previously described in a BR and PAR type lamp. The previous embodiments of a lamp refer more specifically to an omnidirectional lamp such as an A19 replacement bulb. In the BR or PAR lamp shown in FIG. 21 the light is emitted in a directional pattern rather than in an omnidirectional pattern. Standard BR type bulbs are reflector bulbs that reflect light in a directional pattern; however, the beam angle is not tightly controlled and may be up to about 90-100 degrees or other fairly wide angles. The bulb shown in FIGS. 21-26 may be used as a solid state replacement for such BR, PAR or reflector type bulbs or other similar bulbs.

The lamp comprises a base 102, heat sink 149, LED assembly 130 and electrical interconnect 150 as previously described. As previously explained, the LED assembly 130 generates an omnidirectional light pattern. To create a directional light pattern, a primary reflector 300 is provided that reflects light generated by the LED assembly 130 generally in a direction along the axis of the lamp. Because the lamp is intended to be used as a replacement for a BR type lamp the reflector 300 may reflect the light in a generally wide beam angle and may have a beam angle of up to approximately 90-100 degrees. As a result, the reflector 300 may comprise a variety of shapes and sizes provided that light reflecting off of the reflector 300 is reflected generally along the axis of the lamp. The reflector 300 may, for example, be conical, parabolic, hemispherical, faceted or the like. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it. The reflector 300 may be made of a specular material. The specular reflectors may be injection molded plastic or die cast metal (aluminum, zinc, magnesium) with a specular coating. Such coatings could be applied via vacuum metallization or sputtering, and could be aluminum or silver. The specular material could also be a formed film, such as 3M's Vikuiti ESR (Enhanced Specular Reflector) film. It could also be formed aluminum, or a flower petal arrangement in aluminum using Alanod® Miro® or Miro® Silver sheet.

The reflector 300 is mounted in the lamp such that it surrounds the LED assembly 130 and reflects some of the light generated by the LED assembly. In some embodiments, the reflector 300 reflects at least 20% of the light generated by the LED assembly. In other embodiments, the reflector 300 reflects about at least 40% of the light generated by the LED assembly 130 and in other embodiments, the reflector 300 may reflect about at least 60% of the light generated by the LED assembly 130. Because the reflector 300 may be at least 95% reflective, the more light that hits the reflector 300 the more efficient the lamp. This is in contrast to the reflective aluminum coating typically found on a standard BR lamp enclosure that is approximately 80% reflective.

The reflector 300 may be mounted on the heat sink 149 or LED assembly 130 using a variety of connection mechanisms. In one embodiment, the reflector 300 is mounted on the heat conducting portion or tower 152 of the heat sink 149. As shown, the reflector 300 is formed as a slip collar with a flare 300a at the end such that when the LED assembly 130 is inserted, the light directed primarily toward the base encounters the reflector 300 and is reflected out the exit surface 308. The LED assembly 130 is mounted as previously described to trap the reflector 300 between the heat sink 149 and the LED assembly 130. The reflector may also be mounted on the dissipating portion 153 of the heat sink. The reflector 300 may also be mounted to the heat sink 149 or LED assembly 130 using separate fasteners, adhesive, friction fit, mechanical engagement such as a snap-fit connection, welding or the like.

In one embodiment, the reflector 300 is made in two portions 350 and 352 that together surround the heat conducting portion or tower 152 and connect to one another using snap fit connectors 354 to clamp the heat sink therebetween as shown in FIGS. 76-84. In the illustrated embodiment the two portions are identical such that a single component may be used although the two portions may be different. The snap fit connectors 354 may comprise a deformable tang 356 on one reflector portion that is received in a mating receptacle 358 on the other reflector portion where each reflector portion comprises one tang and one receptacle. However, two tangs may be formed on one portion and two receptacles may be formed on the other portion. The tangs 356 may be inserted into the receptacles 358 such that locking surfaces 360 on the tangs 356 are disposed behind the receptacles 358. The tangs and/or receptacles may be made of resilient material to allow these components to deflect as the tangs 356 are inserted into the receptacles 358. The two portions 350 and 353 may be brought into engagement with one another with the heat sink 152 trapped between the portions. The reflector 300 may comprise legs 366 that are supported on protrusions 368 formed on the heat sink 152 to properly vertically position the reflector 300 on the heat sink 152 and to maintain the reflector in the proper orientation relative to the LEDs. The reflector 300 may also include protrusions 370 that extend toward the interior of the reflector and that engage the lateral sides of the protrusions 368 or other heat sink structure to fix the angular relationship between the reflector and heat sink such that the reflector is prevented from rotating relative to the heat sink. The structure of the reflector described above may be used with any of the embodiments of the reflector and in any of the lamps described herein.

The reflector 300 is dimensioned such that the LED assembly 130, heat sink 149 and reflector 300 may be inserted through the opening 304 in the neck of a BR type enclosure 302. The LED assembly 130, heat sink 149 and reflector 300 are inserted into the BR enclosure 302. The BR enclosure 302 may be secured to the heat sink 149 as previously described using adhesive or other connection mechanism. The enclosure 302 comprises a body 306 that is typically coated on an interior surface with a highly reflective material such as aluminum to create a reflective surface 310 and an exit surface 308 through which the light exits the lamp. The exit surface 308 may be frosted or otherwise treated with a light diffuser material. Moreover, the reflector 300 may be mounted to the enclosure 302 rather than to the LED assembly and/or heat sink.

As previously explained, the reflector 300 may be positioned such that it reflects some of the light generated by the LED assembly 130. However, at least a portion of the light generated by the LED assembly 130 may not be reflected by the reflector 300. At least some of this light may be reflected by the reflective surface 310 of the enclosure 302. Some of the light generated by the LED assembly 130 may also be projected directly out of the exit surface 308 without being reflected by the primary reflector 300 or the reflective surface 310.

FIGS. 27-37 show an embodiment of a PAR type lamp that uses the LED assembly 130, heat sink with the tower arrangement 149 and electrical interconnect 150 as previously described. In a PAR type lamp the light is emitted in a directional pattern. Standard PAR bulbs are reflector bulbs that reflect light in a direction where the beam angle is tightly controlled using a parabolic reflector. PAR lamps may direct the light in a pattern having a tightly controlled beam angle such as, but not limited to, 10°, 25° and 40°. The bulb shown in FIG. 22 may be used as a solid state replacement for such a reflector type PAR bulb.

The lamp comprises a base 102, heat sink 149, electrical interconnect 150 and LED assembly 130 as previously described. As previously explained, the LED assembly 130 generates an omnidirectional light pattern. To create a directional light pattern, a primary reflector 400 is provided that reflects light generated by the LED assembly 130 generally in a direction along the axis of the lamp. Because the lamp is intended to be used as a replacement for a PAR type lamp, the reflector 400 may reflect the light in a tightly controlled beam angle. The reflector 400 may comprise a parabolic surface 400a such that light reflecting off of the reflector 400 is reflected generally along the axis of the lamp to create a beam with a controlled beam angle.

The reflector 300 is preferably made of a specular material. The specular reflectors may be injection molded plastic or die cast metal (aluminum, zinc, magnesium) with a specular coating. The specular material could also be a formed film, such as 3M's Vikuiti ESR (Enhanced Specular Reflector) film. It could also be formed aluminum, or a flower petal arrangement in aluminum using Alanod's Miro or Miro Silver sheet. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it.

The reflector 400 is mounted in the lamp such that it surrounds the LED assembly 130 and reflects some of the light generated by the LED assembly. In some embodiments, the reflector 400 reflects over 20% of the light generated by the LED assembly 130. In other embodiments, the reflector 400 reflects about at least 40% of the light generated by the LED assembly 130 and in other embodiments, the reflector 400 may reflect about at least 60% of the light generated by the LED assembly 130. Because the reflector 400 may be at least 90% reflective the more light that hits the reflector 400 the more efficient the lamp. This is in contrast to the reflective aluminum coating typically found on a standard PAR lamp enclosure that is approximately 80% reflective. Because the lamp is used as a PAR replacement, the beam angle is tightly controlled where the light that is reflected from the reflector 400 is emitted from the lamp at a tightly controlled the beam angle.

The reflector 400 is mounted such that the light emitted from the LED assembly 130 is emitted at or near the focus of the parabolic reflector 400. In some embodiments, the two tiered arrangement of LEDs, as described for example with respect to FIGS. 1-5, may be disposed such that the light is emitted at or near enough to the focus of the reflector 400 that the beam angle of the light that is emitted from the lamp is at the desired beam angle. In some embodiments, one tier of LEDs may be disposed on the focus of the reflector and the other tier of LEDs may be positioned slightly off of the focus of the parabolic reflector. In some embodiments, a single tier of LEDs may be used that are disposed on the focus of the reflector. Further, the two tiers of LEDs may be used where the vertical pairs of LEDs are disposed under a single lens such that light emitted from the pairs of LEDs originates at the focus of the reflector 400. Other arrangements of the LEDs may be made provided that the reflector reflects the light at the desired beam angle. While a one tier and a two tier LED assembly have been described, three or more tiers may be used in the LED assembly.

The reflector 400 may be mounted on the heat sink 149 or LED assembly 130 using a variety of connection mechanisms. In one embodiment, the reflector 400 comprises a sleeve that is mounted on the heat conducting portion or tower 152 of the heat sink 149 as previously described. The LED assembly 130 is mounted as previously described to trap the reflector 400 between the heat sink 149 and the LED assembly 130. The reflector 400 may also be mounted to the heat sink 149 or LED assembly 130 using separate fasteners, adhesive, friction fit, mechanical engagement such as a snap-fit connector, welding or the like. Moreover, the reflector 400 may be mounted to the enclosure 402 rather than to the LED assembly and/or heat sink.

The reflector 400 is dimensioned such that the LED assembly 130, heat sink 149 and reflector 400 may be inserted through the opening 404 in the neck of a PAR type enclosure 402. To assemble the lamp, the LED assembly 130, heat sink 149 and reflector 400 are inserted into the PAR enclosure 402. The enclosure 402 is secured to the heat sink 149 as previously described using adhesive or other connection mechanism. The enclosure 402 comprises a body 404 that comprises a parabolic reflective surface 406 that is typically coated with a highly reflective material such as aluminum and an exit surface 408 through which the light exits the lamp. The exit surface 408 may be frosted or otherwise treated with a light diffuser material.

As previously explained, the reflector 400 may be positioned such that it reflects some of the light generated by the LED assembly 130. However, at least a portion of the light generated by the LED assembly 130 may not be reflected by the reflector 400. At least some of this light may be reflected by the parabolic reflective surface 406 of the enclosure 402. Some of the light generated by the LED assembly 130 may be projected out of the exit surface 408 without being reflected by the reflector 400 or the reflective surface 406.

One potential issue with using a single, large parabolic reflector 400 that surrounds the entire LED assembly 130, as described above, is that some of the light may be reflected in a generally horizontal plane such that it circles the reflector 400 and reflects multiple times from the reflector 400 before being emitted from the lamp. Such a situation results in a loss of efficiency. To lower these losses, a parabolic reflector 500 may be provided for each LED 127 such that each LED 127 has associated with it a relatively small parabolic reflector 500 that reflects light from that LED as shown in FIGS. 38-49. In some embodiments, the reflector 500 and associated LED 127 may form a unit that is mounted on the LED assembly 130. In some embodiments, the two (or additional) tiered arrangement of LEDs may be used where the LEDs 127 and reflectors 500 are horizontally offset from one another such that the light emitted from each LED 127 is not blocked by the vertically adjacent LED and reflector. In some embodiments, a single tier of LEDs 127 and associated reflectors 500 may be used. In the illustrated embodiment a two tiered arrangement of LEDs is shown where each vertical pair of LEDs is associated with a single reflector. The reflectors 500 are formed as part of a unitary assembly or sleeve 501 such that all of the reflectors may be mounted on the LED assembly as a unit. Other arrangements of the LEDs 127 and reflectors 500 may be used provided that the reflectors may reflect the light at the desired beam angle. The reflectors 500 and LEDs 127 may be in a one-to-one relationship or a single reflector may be used with more than one LED, but with fewer than all of the LEDs of LED array 130. The reflectors 500 may be specular. Moreover, the LED assembly may be modified to allow the mounting of the reflectors with the associated LEDs. For example, the LEDs may need to be more widely spaced to accommodate the reflectors (compare FIG. 35 to FIG. 47) or the LED assembly may need to be made smaller.

FIGS. 50-64 shows an embodiment of a lamp that uses the base 102, LED assembly 130, heat sink with the tower 149, and electrical interconnect 150 as previously described in a PAR type lamp. The bulb shown in FIGS. 50-64 may be used as a solid state replacement for such reflector type bulbs. As previously explained, the LED assembly 130 generates an omnidirectional light pattern. To create a directional light pattern, a primary reflector 600 is provided that reflects light generated by the LED assembly 130 through a secondary focal point 601. The reflector 600 may comprise an elliptical specular reflecting surface 600a that reflects the light through the secondary focal point 601. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it. The reflector 600 may be a diffuse reflector; however, in some embodiments the reflector surface must be specular. The specular reflector may be injection molded plastic or die cast metal (aluminum, zinc, magnesium) with a specular coating. Such coatings could be applied via vacuum metallization or sputtering, and could be aluminum or silver. The specular material could also be a formed film, such as 3M's Vikuiti ESR (Enhanced Specular Reflector) film. It could also be formed aluminum, or a flower petal arrangement in aluminum using Alanod's Miro or Miro Silver sheet. The light reflected by an elliptical reflector 600 is reflected through the secondary focal point 601 and generally toward the exit surface of the lamp but is reflected at a widely divergent beam angle. The secondary focal point 601 of the reflected light is used as a virtual light source as will be described.

The reflector 600 is mounted in the lamp such that it surrounds the LED assembly 130 and reflects most of the light generated by the LED assembly. In some embodiments, the reflector 600 reflects about at least 20% of the light generated by the LED assembly 130. In other embodiments, the reflector 600 reflects about at least 40% of the light generated by the LED assembly 130 and in other embodiments, the reflector 600 may reflect about at least 60% of the light generated by the LED assembly 130. Because the reflector 600 may be at least 90% reflective the more light that hits the reflector the more efficient the lamp. This is in contrast to the reflective aluminum coating typically found on a standard PAR lamp enclosure that is approximately 80% reflective.

The reflector 600 may be mounted on the heat sink 149 or LED assembly 130 using a variety of connection mechanisms. In one embodiment, the reflector 600 is formed as a slip sleeve and is mounted on the heat conducting portion 152 of the heat sink 149 and the LED assembly 130 is mounted as previously described to trap the reflector 600 between the heat sink 149 and the LED assembly 130. The reflector 600 may also be mounted to the heat sink 149 or LED assembly 130 using separate fasteners, adhesive, friction fit, mechanical engagement such as a snap-fit, welding or the like. Moreover, the reflector 600 may be mounted to the enclosure 602 rather than to the LED assembly and/or heat sink.

The reflector 600 is dimensioned such that the LED assembly 130, heat sink 149 and reflector 600 may be inserted through the opening 604 in the neck of a PAR style enclosure 602. To assemble the lamp, the LED assembly, heat sink and reflector 600 are inserted into the PAR enclosure 602. The enclosure 602 is secured to the heat sink 149 as previously described using adhesive or other connection mechanism.

Referring to FIGS. 61-64, the enclosure 602 comprises a body 606 that is typically coated with a highly reflective material such as aluminum and an exit surface in the form of a lens 702 through which the light exits the lamp. The lens 702 focuses the light from the virtual source 601 (reflector focal point) to create a beam of light at the desired beam angle. The entry surface of lens 702 includes a plurality of substantially triangular concentric rings 704, each having non-vertical sides. By the term "non-vertical," what is meant is that neither side of the triangle formed by the cross-section of the concentric ring is parallel to the direction in which the light is emanated from virtual source 601.

Figure 61:
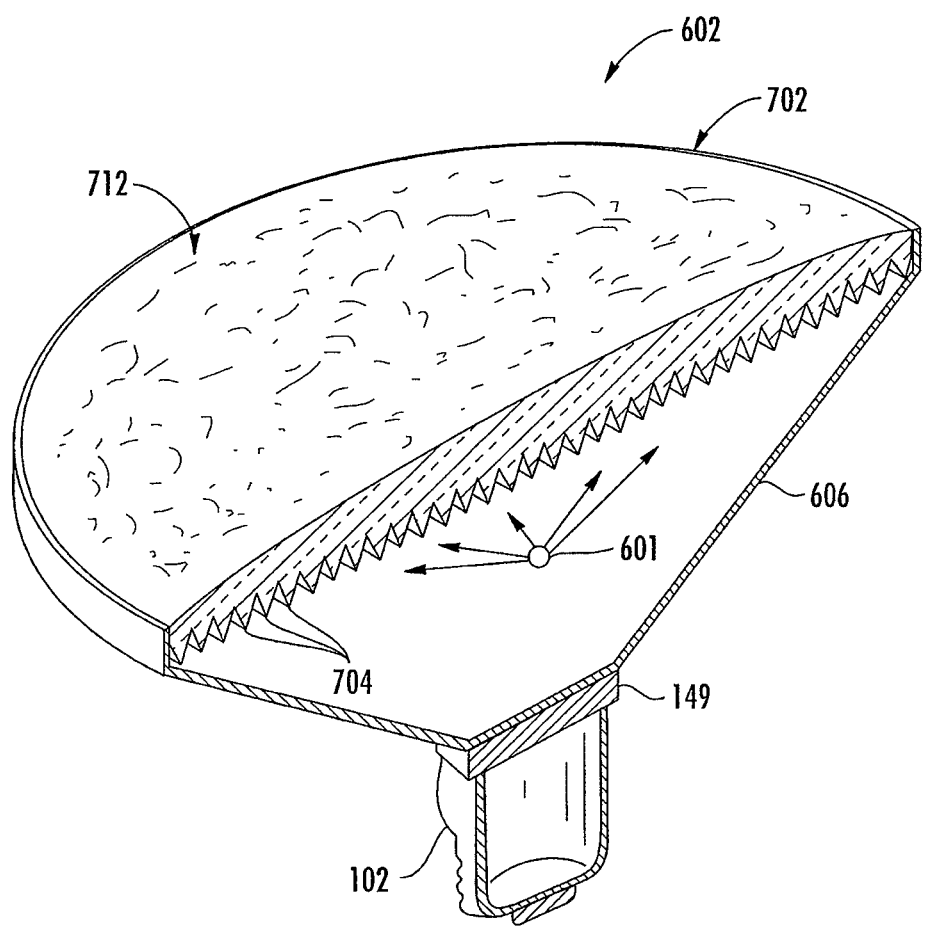
FIG. 61 is a cross-sectional view of a lens according to example embodiments of the present invention.

Exit surface 712 of lens 702 includes surface texturing. This surface texturing provides additional diffusion for light exiting the light engine. This surface texture is represented in FIG. 61 schematically; however, could consist of dimpling, frosting, or any other type of texture that can be applied to a lens for a lighting system. Finally, it should be observed that exit surface 712 is slightly curved. However, embodiments of the invention can include a flat exit surface, or a curved entry service. Both surfaces of the lens could be flat or curved. Several examples will be presented herein.

A lens 702 according to example embodiments can be made in various ways. The example of FIGS. 61-64 is a schematic illustration. The actual numbers of concentric rings, and the actual size and spacing of the rings, are not to scale. The cross-section of the concentric features in FIG. 61 is an equilateral triangle, but other triangular shapes can be used. Additionally, the vertex angle of the equilateral triangles in FIG. 1 is constant, as is the spacing of the concentric circular features. Varying these properties of the lens features can allow the formation of differing beam patterns. Either the vertex angle of the triangles or the spacing interval of the concentric features across the diameter of the lens can change or have a gradient applied. For example, in some embodiments, the substantially triangular concentric rings can be spaced at a fixed interval from about 0.1 mm to about 5 mm across the radius of the lens. In some embodiments, they can be spaced at a fixed interval from between about 0.2 mm to about 3 mm. In some embodiments they can be spaced a fixed interval from between about 0.3 mm to about 2 mm. In some embodiments they can be spaced at a fixed interval of about 0.5 mm. A gradient can also be applied to the spacing so that the interval varies. For example, the interval can be smaller near the center of the lens and progress to a larger interval closer to the edge of the lens, or vice versa. Multiple discrete intervals can also be used.

Figure 62:
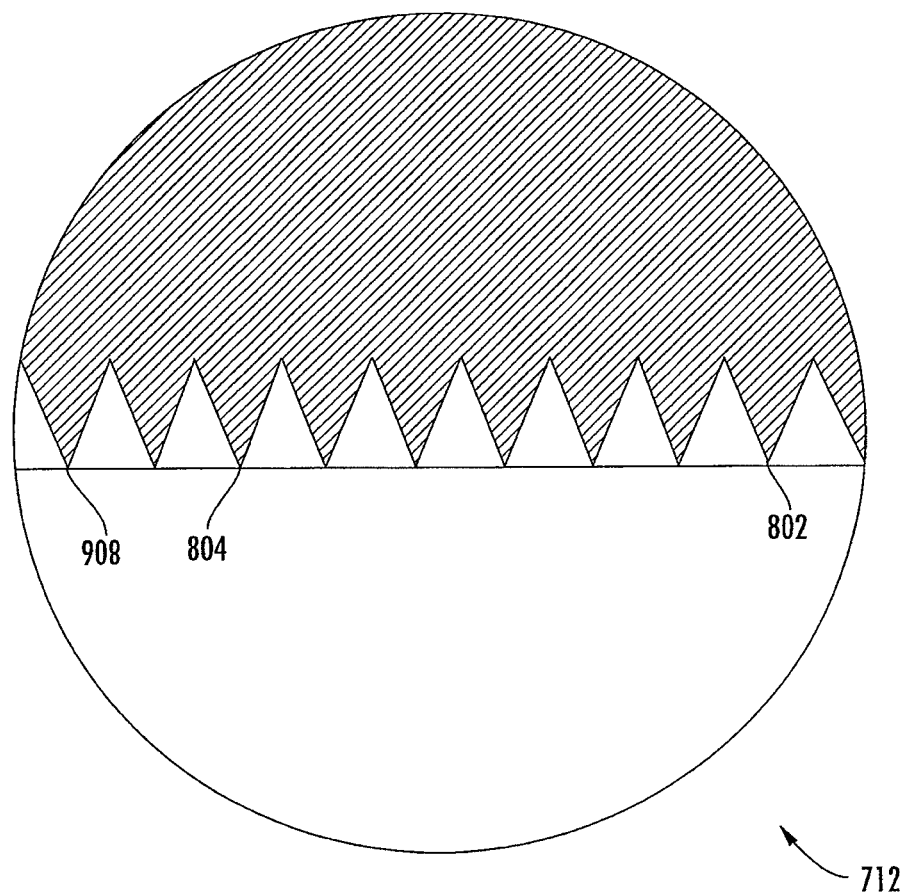
FIG. 62 is a magnified, cross-sectional view of the lens depicted in FIG. 61.

FIG. 62 shows a close-up, cross-sectional view of a portion of entry surface of lens 712. Substantially triangular concentric rings are visible, spaced at an interval of 0.500 mm. As can be observed in the figure, the height of the features is 0.635 mm. As can also be observed, a gradient is applied to the vertex angle of the features. Vertex 802 has an angle of 43.0°, and the angle decreases from left to right to vertex 804 with an angle of 40.0°. All the way to the right, vertex angle 806 increases again to an angle of 40.5°.

Figure 63:
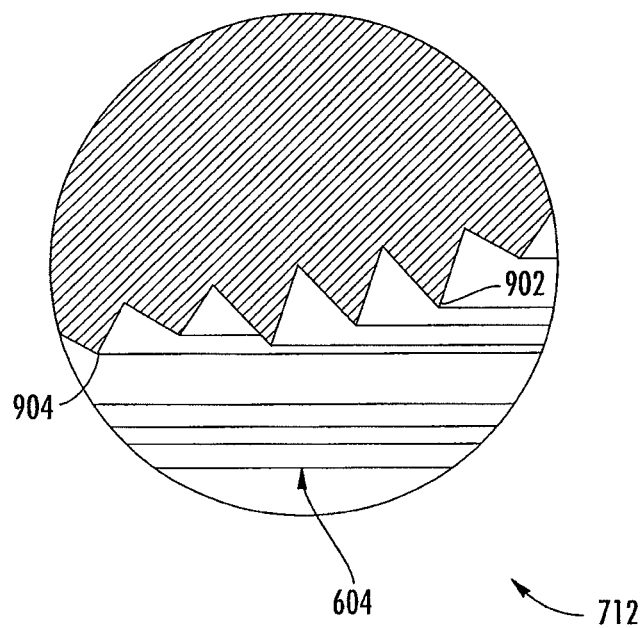
FIG. 63 is a magnified, cross-sectional view of the lens depicted in FIG. 61.

FIG. 63 shows a close-up, cross-sectional view of a portion of entry surface of lens 712. Substantially triangular concentric rings are visible, spaced and interval of 0.500 mm. These rings follow the curved contour of the entry or LED-facing surface of the lens. As can be observed in the figures, the vertex angle of the feature varies. Vertices 902 with a greater height have an angle of 60.0°, and vertices 904 have an angle of 90.0°.

Figure 64:
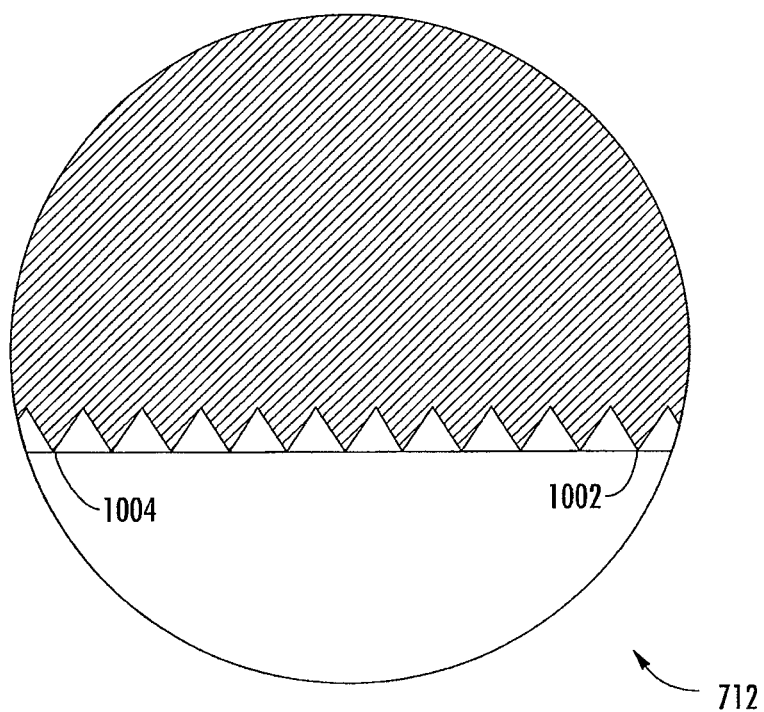
FIG. 64 is a magnified, cross-sectional view of the lens depicted in FIG. 61.
Figure 76:
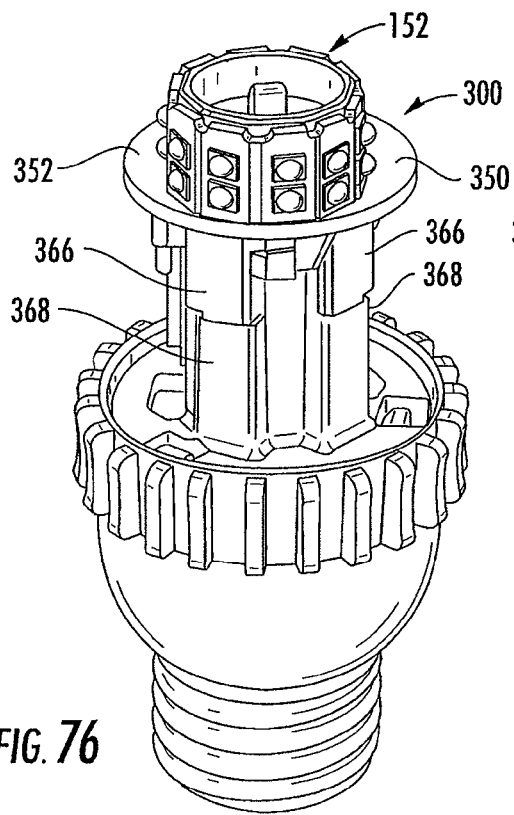
FIG. 76 is a perspective view of an embodiment of a reflector, heat sink and base.
Figure 77:
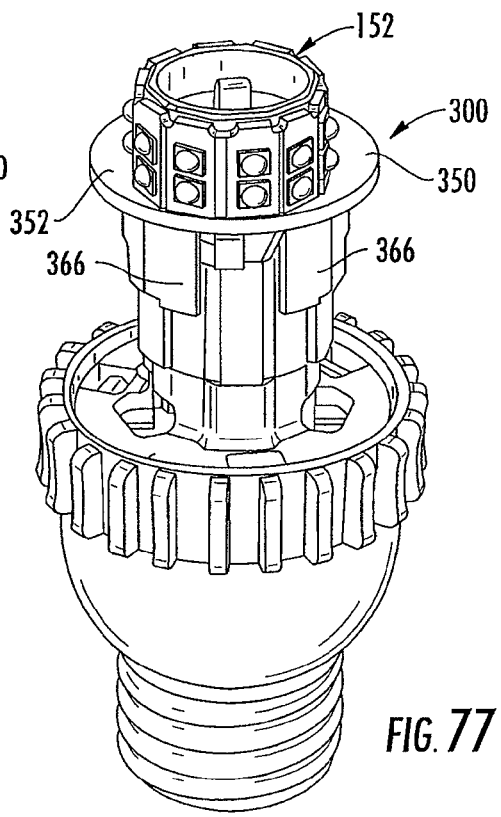
FIG. 77 is a perspective view of the embodiment of the reflector of FIG. 76, heat sink and base in a different orientation.
Figure 78:
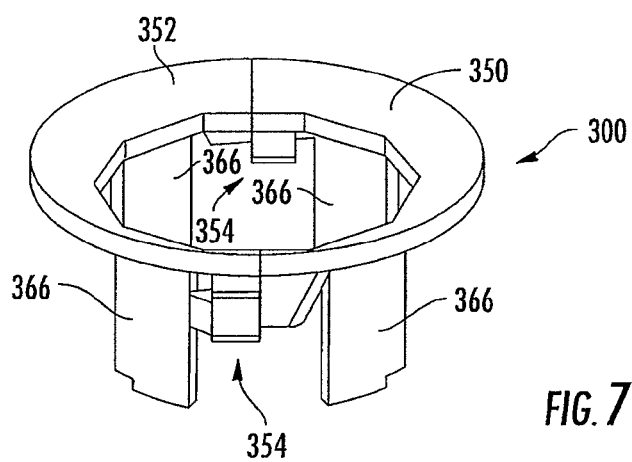
FIG. 78 is a perspective view of the reflector of FIG. 76.
Figure 83:
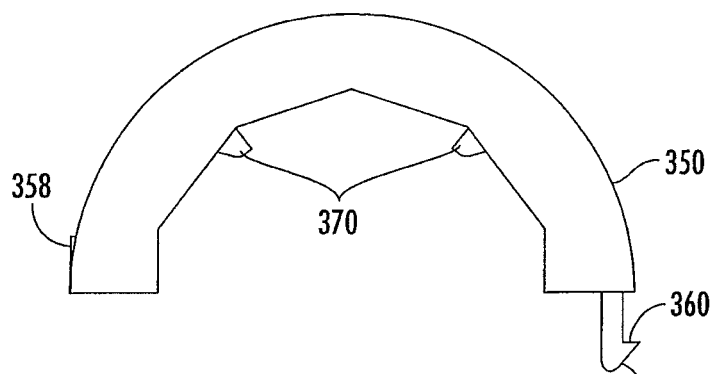
FIG. 83 is a top view of one portion of the reflector of FIG. 76.
Figure 84:
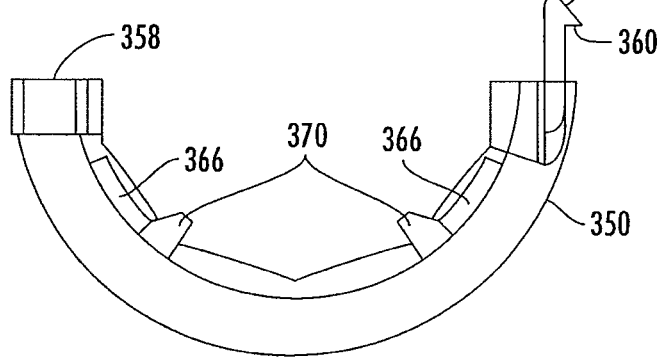
FIG. 84 is a bottom view of one portion of the reflector of FIG. 76.

FIG. 64 shows a close-up, cross-sectional view of a portion of entry surface of lens 712. Substantially triangular concentric rings are visible, again spaced at an interval of 0.500 mm. As can be observed in the figure, a gradient is applied to the vertex angle of the features. Vertex 1002 has an angle of 63.0°, and the angle decreases from left to right in the figure until vertex 1004 with an angle of 61.0°, in 0.40° increments.

A lens according to example embodiments of the invention can be made from various materials, including acrylic, polycarbonate, glass, polyarylate, and many other transparent materials. The textured exit surface of the lens can be created in many ways. For example, a smooth surface could be roughened. The surface could be molded with textured features. Such a surface may be, for example, prismatic in nature. A lens according to embodiments of the invention can also consist of multiple parts co-molded or co-extruded together. For example, the textured surface could be another material co-molded or co-extruded with the portion of the lens with the substantially triangular concentric rings.

The spacing, angles, and other features of the concentric rings can be varied either across lenses, or within the surface of a single lens in order to achieve various lighting effects. As examples, the vertex angle of the concentric rings can be varied. In some embodiments, the angle is from about 35° to about 90°. In some embodiments, the angle ranges from about 40° to about 65°. The angle can be constant across the radius of the lens, can have a gradient applied, or can vary in other ways, as with some of the examples presented herein. The spacing of the concentric features can similarly vary.

As further specific examples, lenses with the following specifications have been tested and shown to be effective for various beam shaping effects. These first examples all have a ring spacing across the radius of the lens of approximately 3 mm. A lens with vertex angles ranging from 70° to 86°, in one degree increments produces a wide beam. A lens with some vertex angles varying from 65° to 71°, and some angles fixed at 90° with the increment of the former being about 1° produces a flood pattern. A lens with some angles varying in 1° increments between 60° and 71°, some fixed at 71°, and others varying in 1° increments back from 71° to 68° produces a forward pattern. A set of fixed-angle features with a vertex angle of 40° produces a spot pattern with a beam angle of approximately 20°.

The following example embodiments that have been tested have a ring spacing across the radius of the lens of approximately 2 mm. A lens with rings having vertex angles varying from 60° to 84° in 1° increments produces a wide pattern. A lens with feature vertex angles varying from 60° to 70° in 1° increments, and additional rings having a fixed angle of approximately 90°, produces a flood pattern. A lens with some vertices varying from 60° to 69° in half-degree increments, four fixed rings with 69° vertices, and two additional rings with 68° and 69° vertices produces a forward pattern. A fixed vertex angle of 40° across the lens again produces a spot pattern with a beam angle of approximately 20°.

Example embodiments that have been tested with a ring spacing of 1 mm include a lens with a range of vertex angles varying from 70° to 82.25° in 0.25° increments, which produced a wide beam pattern. A lens with 50 rings, 25 with a fixed vertex angle of 90°, and 25 with a varying vertex angle from 60° to 72° in 0.25° increments produced a flood pattern. A lens with some rings varying in 0.50° increments from a vertex angle of 60° to a vertex angle of 73°, and some varying in 0.25° increments from an angle of 73° to angle of 68.25°, and three at a fixed vertex angle of 73°, produced a forward pattern. Finally, a lens with rings having a fixed vertex angle of 40° again produced a spot pattern with a beam angle of approximately 20°.

In addition to the detailed examples presented herein with a 0.5 mm spacing for the triangular concentric rings across the radius of the lens, the following examples were tested. These include rings with a range of vertex angles from 60° to 80° in 0.2° increments, which produced a wide beam pattern. A lens with 101 rings, 51 of which have vertex angles from 60° to 70° in 0.2° increments, and 50 of which have a fixed vertex angle of 90°, produced a flood pattern. A lens with 101 rings where 19 of them had a fixed vertex angle of 75°, and the remainder were split with vertex angles ranging from 60° to 75° in 0.25° increments and 75° to 70° in 0.25° increments produced a forward pattern. In addition to the above, it was found that maintaining a constant vertex angle across the radius of the lens but adjusting the angle from lens to lens produced a spot pattern which varied proportionately in angular size. For example, using features with a vertex angle of 35° produced a spot pattern with a beam angle of 32°. Using features with a vertex angle of 45° produced a spot pattern with a beam angle from 11° to 15° depending on the size of the LED source. A suitable lens for use in the lamp of the invention is disclosed in United States patent application entitled "Beam Shaping Lens and LED Lighting System Using Same", application Ser. No. 13/657,421, filed on Oct. 22, 2012, which is incorporated herein by reference in its entirety.

As is evident from the foregoing description, a lamp constructed using the primary reflector and the lens 702 may produce light with a beam angle that varies from a wide angle flood pattern to a tightly controlled spot pattern. As a result, the construction allows the lamp to replace either a wide angle lamp such as a BR lamp or a narrow beam angle lamp such as a PAR lamp.

As previously explained, the reflector 600 as described herein may be positioned such that the reflector 600 reflects a portion of the light generated by the LED assembly 130. However, at least a portion of the light generated by the LED assembly 130 may not be reflected by the reflector 600. At least some of this light may be reflected by the reflective surface of the enclosure. Some of the light generated by the LED assembly may be projected to the lens portion without being reflected by the reflector or the enclosure.

As was explained with respect to the previously described embodiments of a directional lamp, at least some of the light generated by the LED assembly 130 may be directed toward the exit surface of the lamp. An LED 127 positioned as described herein may have a beam angle of approximately 120° such that at least some of the light emitted from the LEDs 127 is directed directly out the exit surface. In order to capture this light and shape the beam, a reverse or downward facing reflector 1200 may be added as shown in FIGS. 65-75. The reverse reflector 1200 captures light that is projected toward the exit surface of the lamp and reflects that light from reflecting surface 1200a to the primary reflector such that the light may be projected in the desired beam angle by the primary reflector as described above. Any suitable reflector may be used as the reverse reflector to redirect the light toward the primary reflector.

Because the PAR and BR style lamps are intended to provide directional beams, asymmetrical LEDs may be advantageously used in various embodiments of the invention. Because the LED assembly 130 uses a plurality of LEDs 127 in the LED array 128, all of the LEDs 127 or selected ones of the LEDs may be asymmetrical LEDs. In some asymmetrical LEDs, the LED optic is shaped to produce the asymmetric beam. Embodiments could use an overmolded asymmetric optic (MDA style). The asymmetric beam may be arranged to directly exit the lamp from the exit surface without being reflected by any reflector surface. The asymmetric beam may also be arranged such that the beam is directed to a desired location on one of the reflectors described herein.

Depending on the embodiment, in the various embodiments described herein, the primary reflector may be configured to reflect light out towards the exit and/or at a secondary or outer reflector such that the reflector formed on the inner surface of the enclosure. Depending on the embodiment, the primary reflector can point upward, downward or be flat. The primary reflector may be positioned above, below or between LEDs on the LED assembly 130. Depending on the embodiment, the outer or secondary reflector, such as the reflector formed on the inner surface of the enclosure may be specular or diffuse.

The reflectors as described herein may also be used in an omnidirectional lamp such as the A19 style of lamp shown, for example, in FIG. 1. In an omnidirectional lamp the reflector may be used to provide a greater degree of up lighting, i.e. light toward the free end of the lamp opposite the Edison connector, if desired. In some embodiments, the reflector may have the same shape and size for a BR style lamp, a PAR style lamp and an omnidirectional lamp such as an A19 style lamp where the light is shaped using the material of the reflector. In an omnidirectional style lamp the reflector may be made of a semitransparent or translucent material such that some of the light is reflected but other light is allowed to pass through the reflector. Such an arrangement provides less directional reflection and a more omnidirectional pattern while still providing some light shaping. In a BR style light the reflector may be made of a white material that provides reflection of the light but in a somewhat diffused pattern. In a PAR style lamp the reflector may be made of or coated in a highly reflective material such as but not limited to aluminum or silver to provide specular reflection and a tightly shaped beam. The reflectors made with the various surfaces described herein may be of the same size and shape for the omnidirectional lamp and the directional lamps such that the same type of reflector may be used with the only change being the material in the different forms of the lamp.

Figure 85:
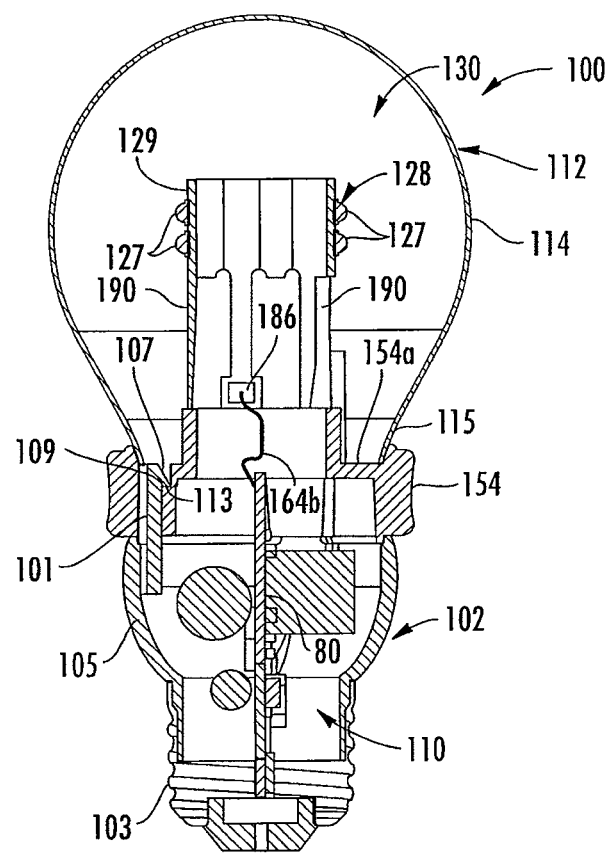
FIG. 85 is a section view of an alternate embodiment of the lamp of the invention.

In the various embodiments described herein, the LED assembly is in the form of an LED tower within the enclosure, the LEDs are mounted on the LED tower in a manner that mimics the appearance of a traditional incandescent bulb. As a result, the LEDs can be positioned on the LED tower in the same area that the glowing filament is visible in a traditional incandescent bulb. As a result, the lamps of the invention provide similar optical light patterns to a traditional incandescent bulb and provide a similar physical appearance during use. The mounting of the LED assembly on the tower, such that the LEDs are centered on the longitudinal axis of the lamp and are in a position that is centrally located in the enclosure, provides the look of a traditional incandescent bulb. Centrally located means that the LEDs are disposed on the tower in the free open space of the enclosure as distinguished from being mounted at or on the bottom of the enclosure or on the enclosure walls. In certain embodiments, the LEDs are positioned in a band about the tower such that the high intensity area of light produced from the LEDs appears as a glowing filament of light when in use. The band of LEDs could be produced by single or multiple rows or strings of LEDs that are closely packed together within the band or offset from each other within the band. Various configurations are possible where the LEDs are positioned in a band or concentrated in a particular region about the LED tower to produce a filament-type appearance when in use and when viewed from different directions. In some embodiments, the LEDs may be arranged on the tower such that they are in a relatively narrow band that is located near the optical center of the enclosure. In some embodiments, the LEDs may be arranged on the filament tower in a narrow band that extends around the periphery of the tower where the height of the band (in the dimension along the axis of the tower) is smaller than the diameter of the tower. As a result, the when the lamp is viewed from the side the LEDs create a bright light source that that extends across the lamp and appears as a relatively bright line inside of the enclosure. The band or concentrated region of LEDs can comprise less than 50%, less than 40% or even less than 30% of the exposed surface area of the tower. In some embodiments, the LED region is disposed toward one end of the array such that the region is offset from the center of the tower where the tower extends from the base to support the LED array at the desired location within the enclosure. The LEDs have been described as a band that extends around the periphery of the tower. In addition to extending around the periphery of the tower the LEDs also extend around or encircle the longitudinal axis of the lamp. In some embodiments, the tower is disposed along the longitudinal axis of the lamp such that the LEDs surround or extend around both the longitudinal axis of the lamp and the tower as shown in the Figures. In some embodiments the LEDs may be disposed such that the LEDs do not surround the tower but still surround the longitudinal axis of the lamp. Referring to FIG. 85, for example, the LED assembly 130 may be mounted directly to the heat dissipating portion 154 of the heat sink 149 using extensions 190 or similar structure where the tower 152 is eliminated. In such an arrangement the LEDs 127 surround the longitudinal axis of the lamp even though the LEDs do not surround the heat sink. Other arrangements are also possible where, for example, a tower 152 is provided but the LEDs are arranged beyond the end of the tower 152. In such an arrangement the LEDs 127 surround the longitudinal axis of the lamp even though the LEDs do not physically surround the heat sink.

Because, in some embodiments, the LEDs are closely packed or positioned in a more concentrated or more dense region of the tower, the tower is used as a heat sink that provides a thermal path from the LEDs to the base of the bulb. In some embodiments the base acts as part of the heat sink and may include fins or other surface area or mass increasing features. In some embodiments, the heat sink portion of the base includes an integral support or a portion of the tower over which the LED tower fits or to which the LED tower is connected such that a thermal path is from the LEDs through the filament tower to the support and/or to the base. In some embodiments, the base and support is an integral piece, and in other embodiments it is different pieces. In some embodiments, the support is part of the tower and/or thermal path, and in others it is not. In some embodiments, the support and/or base is not a major part of the thermal path in that the support and/or base is made of a poor thermal conductor, and the LED tower forms part of the thermal path to other portions of the bulb, such as the enclosure of the bulb, for example through thermally conductive gas or liquid within the enclosure. In some embodiments, the LED tower itself can provide sufficient thermal protection for the LEDs.

In some embodiments, depending on the LEDs used, the exit surfaces in these and other embodiments may be made of glass which has been doped with a rare earth compound, in this example, neodymium oxide. Such an optical element could also be made of a polymer, including an aromatic polymer such as an inherently UV stable polyester. The exit surface is transmissive of light. However, due to the neodymium oxide in the glass, light passing through the dome of the optical element is filtered so that the light exiting the dome exhibits a spectral notch. A spectral notch is a portion of the color spectrum where the light is attenuated, thus forming a "notch" when light intensity is plotted against wavelength. Depending on the type or composition of glass or other material used to form the optical element, the amount of neodymium compound present, and the amount and type of other trace substances in the optical element, the spectral notch can occur between the wavelengths of 520 nm and 605 nm. In some embodiments, the spectral notch can occur between the wavelengths of 565 nm and 600 nm. In other embodiments, the spectral notch can occur between the wavelengths of 570 nm and 595 nm. Such systems are disclosed in U.S. patent application Ser. No. 13/341,337, filed Dec. 30, 2011, titled "LED Lighting Using Spectral Notching" which is incorporated herein by reference in its entirety.

Although specific embodiments have been shown and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:
   an optically transmissive enclosure and a base defining a longitudinal axis of the lamp extending from the base to the free end of the enclosure;
   a heat sink comprising a tower that is at least partially located in the enclosure, the tower extending along the longitudinal axis and comprising an outer periphery and a first end that extends to a center of the enclosure;
   an LED assembly in the optically transmissive enclosure, the LED assembly comprising a lead frame circuit and a plurality of LEDs attached to the lead frame circuit at solder joints such that the solder joints mechanically hold the lead frame circuit together as well as provide the electrical connections to anode and cathode sides of the lead frame, the lead frame being thermally coupled to the tower and formed into a three-dimensional shape where the lead frame wraps around the outer periphery of the tower such that the plurality of LEDs are disposed between the base and the first end of the tower.

2. The lamp of claim 1 comprising a dielectric layer between the heat sink and the lead frame to electrically isolate the heat sink from the lead frame.

3. The lamp of claim 2 wherein the dielectric layer comprises at least one of paint, dip coat and film.

4. The lamp of claim 2 wherein the dielectric layer is thermally transmissive such that heat generated by the LED assembly is conducted to the heat sink.

5. The lamp of claim 1 wherein an exposed surface of the lead frame is coated in white.

6. The lamp of claim 1 wherein the lead frame is mounted directly to the tower.

7. The lamp of claim 1 wherein the lead frame is formed into a cylindrical shape where the interior circumference of the lead frame is slightly smaller than the exterior circumference of the tower such that the lead frame is slightly deformed and expanded when positioned on the tower.

8. The lamp of claim 1 wherein a mechanical retainer is formed on the lead frame that engages the tower.

9. The lamp of claim 1 wherein adhesive secures the lead frame to the tower.

10. A lamp comprising:
    an optically transmissive enclosure and a base defining a longitudinal axis of the lamp extending from the base to the free end of the enclosure;
    a heat sink comprising a tower that is at least partially located in the enclosure, the tower extending along the longitudinal axis and comprising an outer periphery and a first end that extends to a center of the enclosure;
    an LED assembly in the optically transmissive enclosure, the LED assembly comprising a flex circuit and a plurality of LEDs physically attached to the flex circuit, the flex circuit being thermally coupled to the tower and formed into a three-dimensional shape where the flex circuit wraps around the outer periphery of the tower such that the plurality of LEDs are disposed between the base and the first end of the tower.

11. The lamp of claim 10 wherein the flex circuit comprises a flexible conductive layer supported on a dielectric film.

12. The lamp of claim 11 wherein the plurality of LEDs are soldered to the conductive layer.

13. The lamp of claim 10 wherein a white cover layer covers an exposed surface of the flex circuit.

14. The lamp of claim 10 wherein the dielectric film has a thickness selected such that heat is transferred from the plurality of LEDs to the heat sink through the film.

15. The lamp of claim 10 wherein the flex circuit has a first free end and a second free end where the flex circuit is wrapped around the tower and the first free end is secured to the second free end.

16. The lamp of claim 10 wherein a mechanical connection secures the first free end and the second free end.

17. The lamp of claim 10 wherein the first free end and the second free end are heat staked to one another.

18. The lamp of claim 10 wherein the first free end supports a first LED and the second free end defines an aperture where the aperture receives the first LED.

* * * * *